US011049872B2

(12) United States Patent
Nojima et al.

(10) Patent No.: US 11,049,872 B2
(45) Date of Patent: Jun. 29, 2021

(54) SEMICONDUCTOR STORAGE DEVICE AND METHOD OF MANUFACTURING THE SAME

(71) Applicant: Toshiba Memory Corporation, Tokyo (JP)

(72) Inventors: Kazuhiro Nojima, Yokkaichi Mie (JP); Kojiro Shimizu, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/283,589

(22) Filed: Feb. 22, 2019

(65) Prior Publication Data

US 2020/0098782 A1 Mar. 26, 2020

(30) Foreign Application Priority Data

Sep. 20, 2018 (JP) ................................ 2018-175669

(51) Int. Cl.

| | |
|---|---|
| ***H01L 27/11582*** | (2017.01) |
| ***H01L 27/11531*** | (2017.01) |
| ***H01L 27/11573*** | (2017.01) |
| ***H01L 27/1157*** | (2017.01) |
| ***G11C 5/06*** | (2006.01) |

(52) U.S. Cl.

CPC ........ *H01L 27/11582* (2013.01); *G11C 5/063* (2013.01); *H01L 27/1157* (2013.01); *H01L 27/11573* (2013.01)

(58) Field of Classification Search

CPC ......... H01L 27/11582; H01L 27/11573; H01L 27/1157; H01L 23/5226; H01L 21/76879; H01L 21/76805; G11C 5/063

See application file for complete search history.

(56) References Cited

U.S. PATENT DOCUMENTS

| | | | |
|---|---|---|---|
| 9,190,499 B2 | 11/2015 | Hirai et al. | |
| 9,716,101 B2 | 7/2017 | Lu et al. | |
| 10,014,309 B2 | 7/2018 | Dorhout et al. | |
| 10,355,009 B1 * | 7/2019 | Kai ..................... | H01L 27/1157 |
| 10,504,918 B2 | 12/2019 | Shimojo et al. | |
| 2012/0182779 A1 * | 7/2012 | Fukuda .................. | G11C 5/063 365/63 |
| 2013/0308363 A1 * | 11/2013 | Scheuerlein ......... | G11C 13/003 365/63 |
| 2015/0001460 A1 * | 1/2015 | Kim ................. | H01L 27/11519 257/5 |

(Continued)

FOREIGN PATENT DOCUMENTS

| | | |
|---|---|---|
| TW | 201642445 A | 12/2016 |
| TW | 201806134 A | 2/2018 |

*Primary Examiner* — Earl N Taylor

(74) *Attorney, Agent, or Firm* — Foley & Lardner LLP

(57) ABSTRACT

A a semiconductor storage device includes a logic circuit formed on a substrate, a first area formed on the logic circuit and has a plurality of first insulating layers and a plurality of conductive layers alternatively stacked in a first direction, a plurality of memory pillars MP which extend in the first area in the first direction, a second area which is formed on the logic circuit and has the plurality of first insulating layers 33 and a plurality of second insulating layers alternately stacked in the first direction, and a contact ping CP1 which extends in the second area in the first direction and is connected to the logic circuit.

10 Claims, 45 Drawing Sheets

(56) References Cited

U.S. PATENT DOCUMENTS

| | | | | |
|---|---|---|---|---|
| 2017/0236779 | A1* | 8/2017 | Komori | H01L 23/53266 257/326 |
| 2017/0263618 | A1* | 9/2017 | Shimojo | H01L 27/11519 |
| 2018/0083021 | A1 | 3/2018 | Sakamoto | |
| 2018/0269222 | A1* | 9/2018 | Huang | H01L 21/76816 |
| 2018/0269225 | A1* | 9/2018 | Huang | H01L 27/11582 |
| 2018/0337140 | A1* | 11/2018 | Luoh | H01L 23/562 |
| 2019/0081052 | A1* | 3/2019 | Lee | H01L 27/11556 |
| 2019/0229125 | A1* | 7/2019 | Zhou | H01L 27/11556 |
| 2019/0280000 | A1* | 9/2019 | Nakamura | H01L 29/7883 |
| 2019/0287985 | A1 | 9/2019 | Shimojo et al. | |
| 2019/0287990 | A1 | 9/2019 | Sugisaki | |
| 2019/0371807 | A1* | 12/2019 | Nishikawa | H01L 27/11529 |
| 2019/0378857 | A1* | 12/2019 | Lee | H01L 27/11521 |
| 2020/0006270 | A1* | 1/2020 | Lee | H01L 27/11556 |
| 2020/0027893 | A1* | 1/2020 | Yang | H01L 21/76831 |
| 2020/0043942 | A1* | 2/2020 | Shimojo | H01L 27/11582 |
| 2020/0083246 | A1* | 3/2020 | Inatsuka | H01L 29/0847 |
| 2020/0098782 | A1* | 3/2020 | Nojima | H01L 27/11582 |
| 2020/0127006 | A1* | 4/2020 | Otsu | H01L 23/5226 |

* cited by examiner

SEMICONDUCTOR STORAGE DEVICE AND METHOD OF MANUFACTURING THE SAME

CROSS-REFERENCE TO RELATED APPLICATION

This application is based upon and claims the benefit of priority from Japanese Patent Application No. 2018-175669, filed Sep. 20, 2018, the entire contents of which are incorporated herein by reference.

FIELD

Embodiments described herein relate generally to a semiconductor storage device and a method of manufacturing the same.

BACKGROUND

A semiconductor storage device in which memory cells are three-dimensionally arranged is known.

Examples of related art include JP-A-2014-187324.

DETAILED DESCRIPTION

Figure 1:
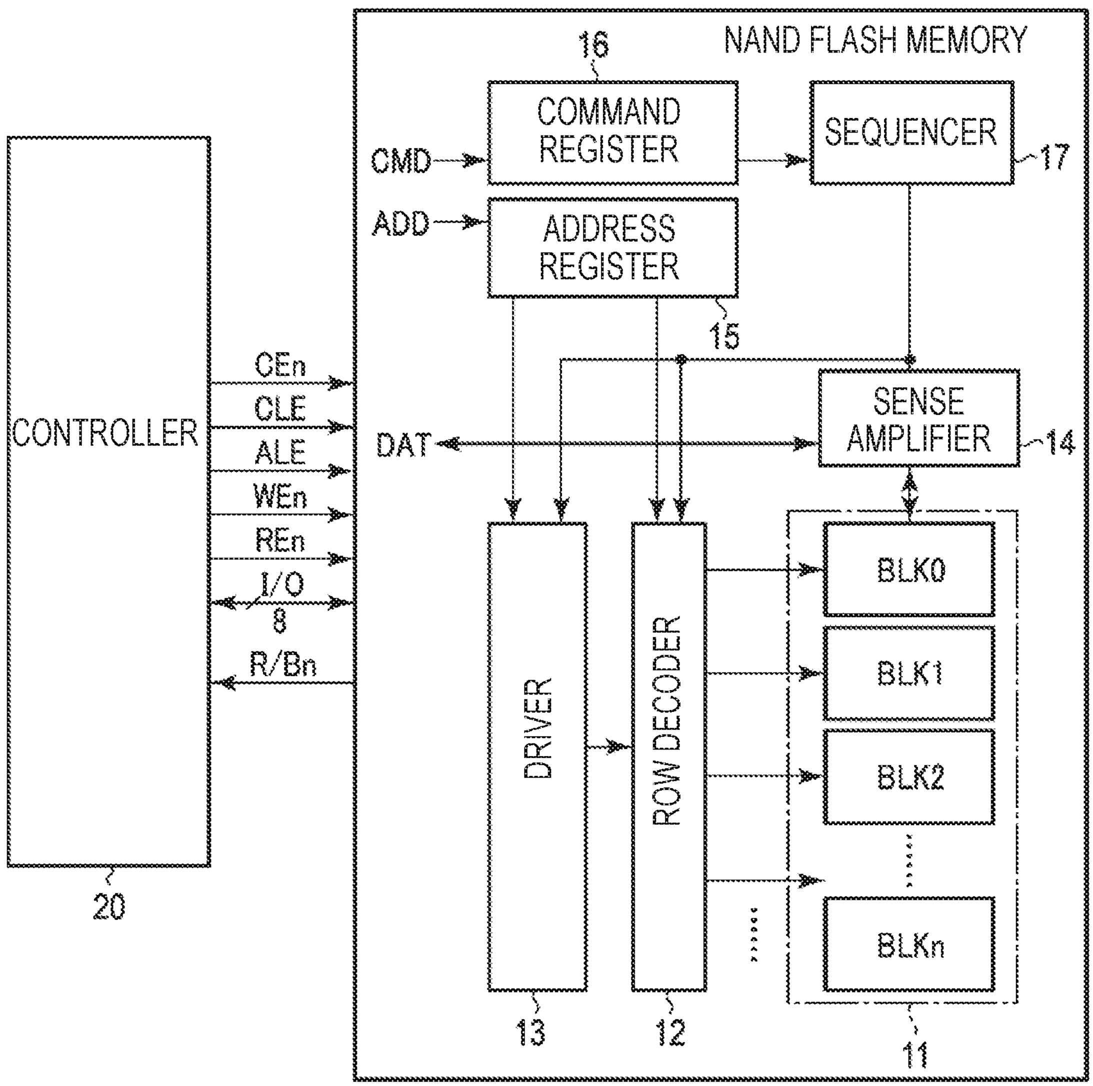
FIG. 1 is a block diagram illustrating a circuit configuration of a semiconductor storage device according to a first embodiment.

Embodiments provide a semiconductor storage device capable of improving operation reliability, and a method of manufacturing the same.

In general, according to at least one embodiment, a semiconductor storage device includes a logic circuit which is formed on a substrate, a first area which is formed on the logic circuit and has plural first insulating layers and plural conductive layers alternately stacked in a first direction, plural memory pillars which extend the first area in the first direction, a second area which is formed on the logic circuit and has the plural first insulating layers and plural second insulating layers alternately stacked in the first direction, and a contact plug which extends the second area in the first direction and is connected to the logic circuit.

Hereinafter, embodiments will be described with reference to the drawings. In the following description, constituent elements having, the same function and configuration are denoted by the same reference numerals. In addition, each of the following embodiments exemplifies an apparatus and method for embodying the technical idea of the present embodiment, in which the material, shape, structure, arrangement, etc. of components are not specific to those described in the following embodiments.

Each functional block may be implemented by hardware, computer software, or a combination thereof. It is not indispensable that functional blocks are distinguished from each other as in the following examples. For example, some of the functions may be executed by another functional block which is separate from an exemplified functional block. Furthermore, the exemplified functional block may be divided into finer functional sub-blocks. Here, a nonvolatile semiconductor storage device will be described with an example of a three-dimensional stacked NAND type flash memory in which memory cell transistors are stacked on the upper side of a semiconductor substrate.

1. First Embodiment

Hereinafter, a semiconductor storage device according to a first embodiment will be described.

1.1. Circuit Block Configuration of Semiconductor Storage Device

First, a circuit block configuration of the semiconductor storage device according to the first embodiment will be described. FIG. 1 is a block diagram illustrating the circuit configuration of the semiconductor storage device according to the first embodiment. A NAND type flash memory 10 as a semiconductor storage device includes a memory cell array 11, a row decoder 12, a driver 13, a sense amplifier 14, an address register 15, a command register 16 and a sequencer 17. Further, for example, a controller 20 is externally connected to the NAND type flash memory 10 via a NAND bus. The controller 20 accesses the NAND type flash memory 10 and controls the NAND type flash memory 10.

1.1.1. Configuration of Each Block

The memory cell array 11 includes plural blocks BLK0, BLK1, BLK2, . . . , BLKn (n is an integer of 0 or more) each including plural nonvolatile memory cells associated with rows and columns. Hereinafter, a block BLK indicates each of the blocks BLK0 to BLKn. The memory cell array 11 stores data supplied from the controller 20. Details of the memory cell array 11 and the block BLK will be described later.

The row decoder 12 selects one of the blocks BLK and further selects a word line in the selected block BLK. Details of the row decoder 12 will be described later.

The driver 13 supplies a voltage to the selected block BLK via the row decoder 12.

At the time of data read, the sense amplifier 14 senses data DAT read from the memory cell array 11 and performs a necessary calculation. Then, the sense amplifier outputs the read data DAT to the controller 20. At the time of data write, the sense amplifier 14 transfers write data DAT received from the controller 20 to the memory cell array 11.

The address, register 15 holds an address ADD received from the controller 20. The address ADD includes a block address that designates a block BLK to be operated and a page address that designates a word line to be operated in the designated block. The command register 16 holds a command CMD received from the controller 20. The command CMD includes, for example, a write command that instructs the sequencer 17 to perform a write operation and a read command that instructs the sequencer 17 to perform a read operation.

The sequencer 17 controls the operation of the NAND type flash memory 10 based on the command CMD held in the command register 16. Specifically, based on the write command held in the command register 16, the sequencer 17 controls the row decoder 12, the driver 13 and the sense amplifier 14 to write data in plural memory cell transistors designated by the address ADD. In addition, based on the read command held in the command register 16, the sequencer 17 controls the row decoder 12, the driver 13 and the sense amplifier 14 to read data from plural memory cell transistors designated by the address ADD.

As described above, the controller 20 is connected to the NAND type flash memory 10 via the NAND bus. The NAND bus transmits and receives signals according to a NAND interface. Specifically, the NAND bus includes a bus that communicates, for example, a chip enable signal CEn, a command latch enable signal CLE, an address latch enable signal ALE, a write enable signal WEn, a read enable signal REn, an input/output signal I/O and a ready/busy signal R/Bn. The input/output signal I/O is transmitted with an 8-bit bus width. The input/output signal I/O communicates the command CMD, the address ADD, the data DAT and the like.

1.1.2. Circuit Configuration of Memory Cell Array 11

As described above, the memory cell array 11 includes the blocks BLK 0 to BLKn. The blocks BLK 0 to BLKn have the same configuration. The circuit configuration of one block BLK will be described below.

Figure 2:
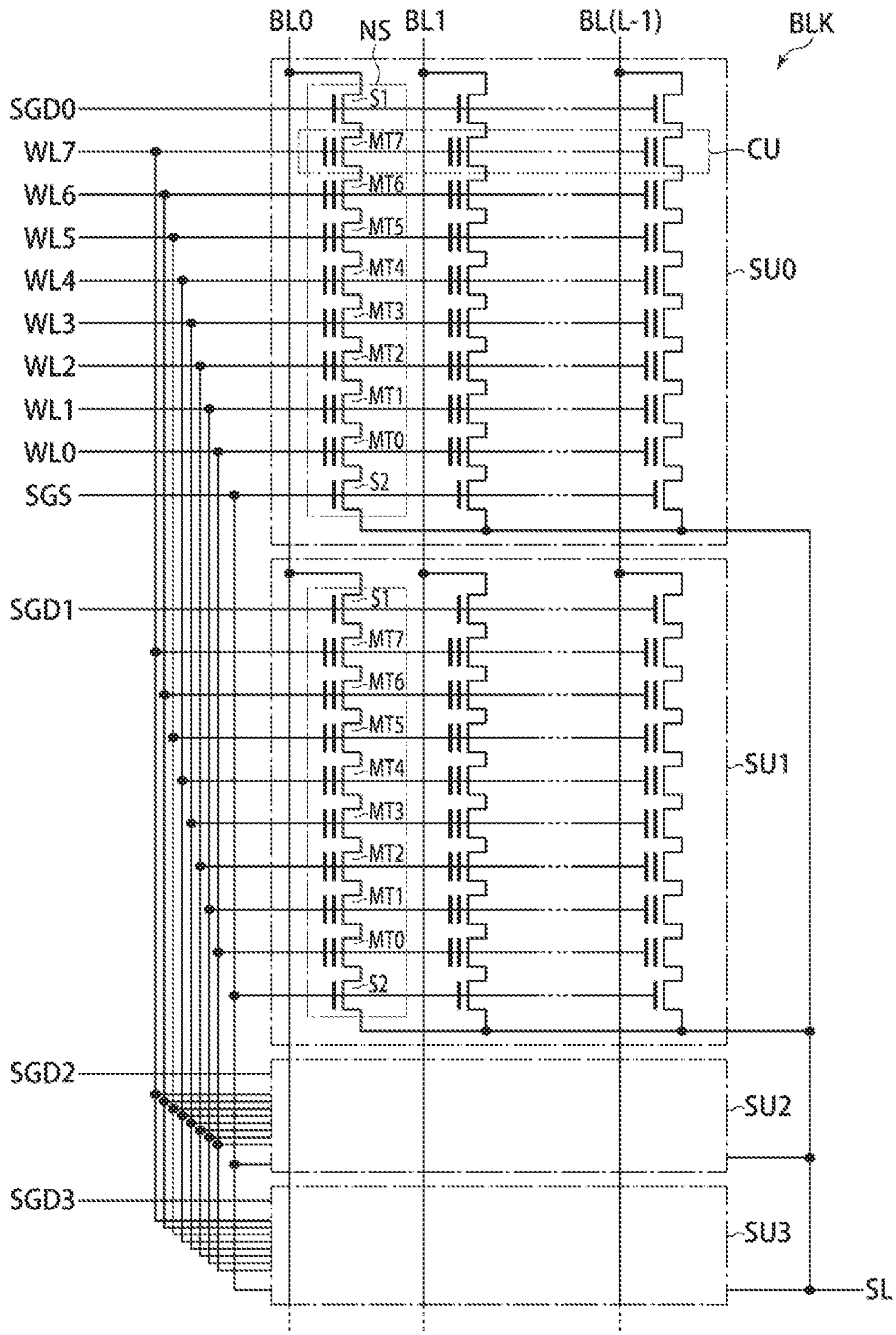
FIG. 2 is a circuit diagram of a block in a memory-cell array according to the first embodiment.

FIG. 2 is a circuit diagram of a block BLK in the memory cell array 11. As illustrated in the figure, the block BLK includes, for example, four stringy units SU0 to SU3. Hereinafter, a "string unit SU" indicates each of the string units SU0 to SU3. The string unit SU includes plural NAND strings NS.

Each of the NAND strings NS includes, for example, eight memory cell transistors MT0 to MT7 and select transistors S1 and S2. Hereinafter, a "memory cell transistor MT" indicates each of the memory cell transistors MT0 to MT7. The memory cell transistor (hereinafter, also referred to as a memory cell) MT includes a control gate and a charge storage layer and holds data in a nonvolatile manner. The memory cell transistor MT is connected in series between the source of the select transistor S1 and the drain of the select transistor S2.

The gates of the select transistors S1 in the string units SU0 to SU3 are connected to select gate lines SGD0 to SGD3, respectively. In the meantime, the gates of the select transistors S2 in the string units SU0 to SU3 are connected to, for example, one select gate line SGS. The gates of the select transistors S2 may be connected to different select gate lines SGS0 to SGS3 for each string unit. The control gates of the memory cell transistors MT0 to MT7 in the string units SU0 to SU3 in the block BLK are connected to word lines WL0 to WL7, respectively.

Further, the memory cell array 11 shares bit lines PL0 to BL(L−1) between the plural blocks BLK0 to BLKn. Here, L is a natural number of 2 or more. In the plural string units SU0 to SU3 in the block BLK, each bit line BL is commonly connected to the drains of the select transistors S1 of the NAND string NS in the same column. That is, each bit line BL connect the NAND strings NS in common between the ultra string units SU0 to SU3 in the same column. Further, the sources of the plural select transistors 52 are commonly connected to a source line SL. That is, each string unit SU includes plural NAND strings NS connected to different bit lines BL and connected to the same select gate line SGD.

In addition, the block BLK includes plural string units SU that share the word line WL.

The plural memory cell transistors MT connected to the common word line WL in the string unit SU are referred to as a cell unit CU. The storage capacity of the cell unit CU is varied depending on the number of bits of data stored in the memory cell transistor MT. For example, the cell unit CU stores 1-page data when each memory cell transistor MT stores 1-bit data, 2-page data when each memory cell transistor MT stores 2-bit data, and 3-page data when each memory cell transistor MT stores 3-bit data.

The configuration of the memory cell array 11 is not limited to the above configuration. For example, the number of string units SU in each block BLK may be set to any number. The number of memory cell transistors MT and select gate transistors S1 and S2 in each NAND string NS may also be set to any number.

The configuration of the memory cell array 11 is described in, for example, U.S. patent application Ser. No. 12/407,403 filed on Mar. 19, 2009, entitled as "THREE DIMENSIONAL STACKED NONVOLATILE SEMICONDUCTOR MEMORY", U.S. patent application Ser. No. 12/406,524 filed on Mar. 18, 2009, entitled as "THREE DIMENSIONAL STACKED NONVOLATILE SEMICONDUCTOR MEMORY", U.S. patent application Ser. No. 12/679,991 filed on Mar. 25, 2010, entitled as "NON-VOLATILE SEMICONDUCTOR STORAGE DEVICE AND METHOD OF MANUFACTURING THE SAME", and U.S. patent application Ser. No. 12/532,030 filed on Mar. 23, 2009, entitled as "SEMICONDUCTOR MEMORY AND METHOD FOR MANUFACTURING SAME". These patent applications are incorporated herein by reference in their entirety.

1.2. Overall Structure of Semiconductor Storage Device

Figure 3:
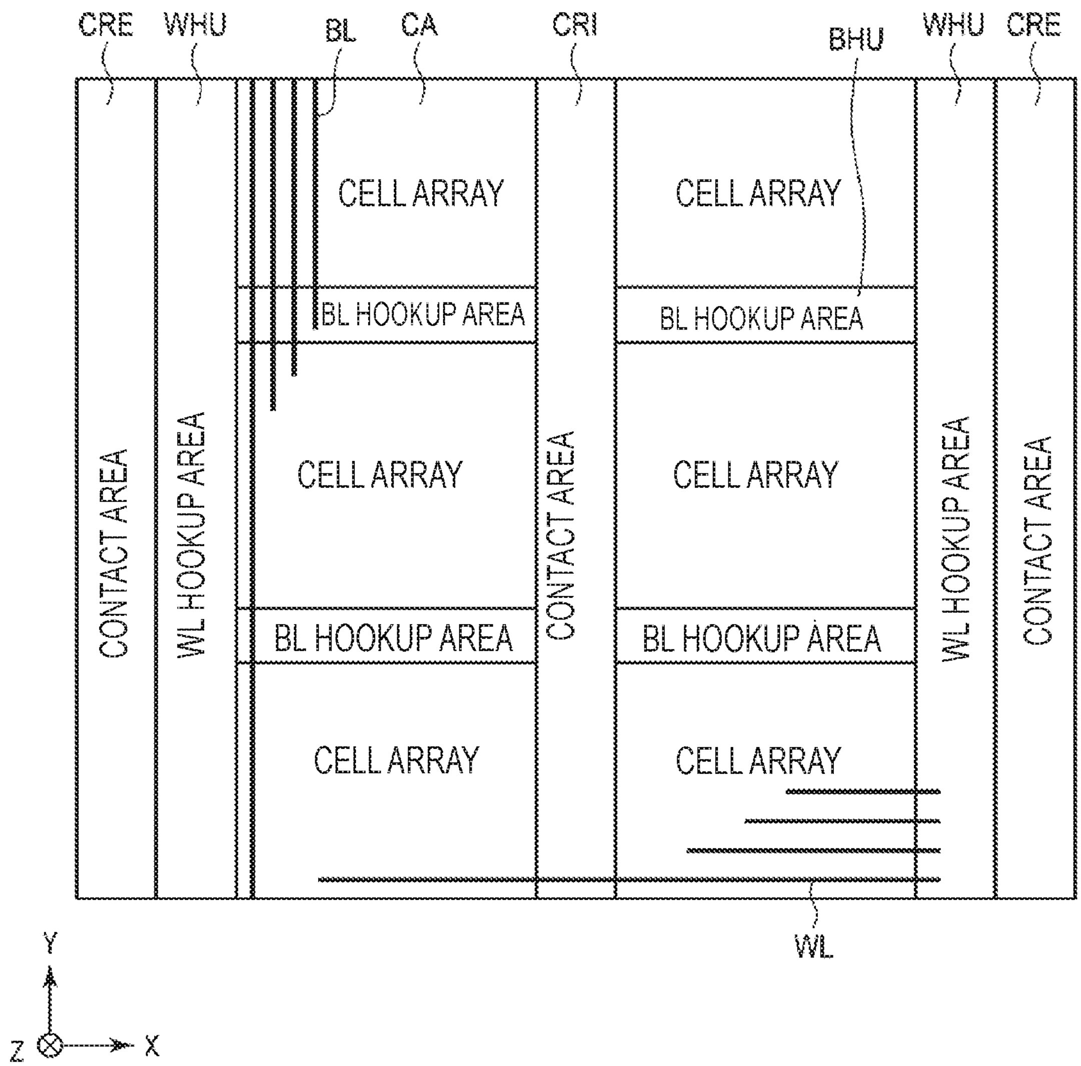
FIG. 3 is a layout diagram illustrating a structure block in the semiconductor storage device according to the first embodiment.

Next, the structure of the semiconductor storage device according to the first embodiment will be described with reference to FIG. 3. FIG. 3 is a layout diagram illustrating a structure block in the semiconductor storage device according to the first embodiment. In FIG. 3 and the subsequent figures, two directions which are orthogonal (or intersecting) with each other and parallel to a semiconductor substrate surface are taken as an X direction (A-A' line direction) and a Y direction (B-B' line direction), respectively, and a direction which is orthogonal (or intersecting) with the X direction and the Y direction (XY plane) is taken as a Z direction.

As illustrated in FIG. 3, the semiconductor storage device includes a cell array area CA, a bit line hookup area BHU, a word line hookup area WHU, a contact area CRI and a contact area CRE.

Plural cell array areas CA and plural bit line hookup areas BHU are arranged in a matrix in the X direction and the Y direction. The bit line hookup areas BHU are interposed between the cell array areas CA in the Y direction. The word line hookup areas WHU are disposed at the ends of the cell array areas CA in the X direction. The contact areas CRE are disposed on the opposite side of the word line hookup areas WHU in the X direction to the side where the cell array areas CA are disposed. Further, the contact areas CRI are interposed between the cell array areas CA and between the bit line hookup areas BHU in the X direction.

Plural bit lines BL extending in the Y direction are arranged in the X direction on the bit line hookup areas BHU and the cell array areas CA. Further, plural word lines WL which extend in the X direction are arranged in the Y direction on the word line hookup areas WHU.

1.2.1. Planar Structure of Semiconductor Storage Device

Figure 4:
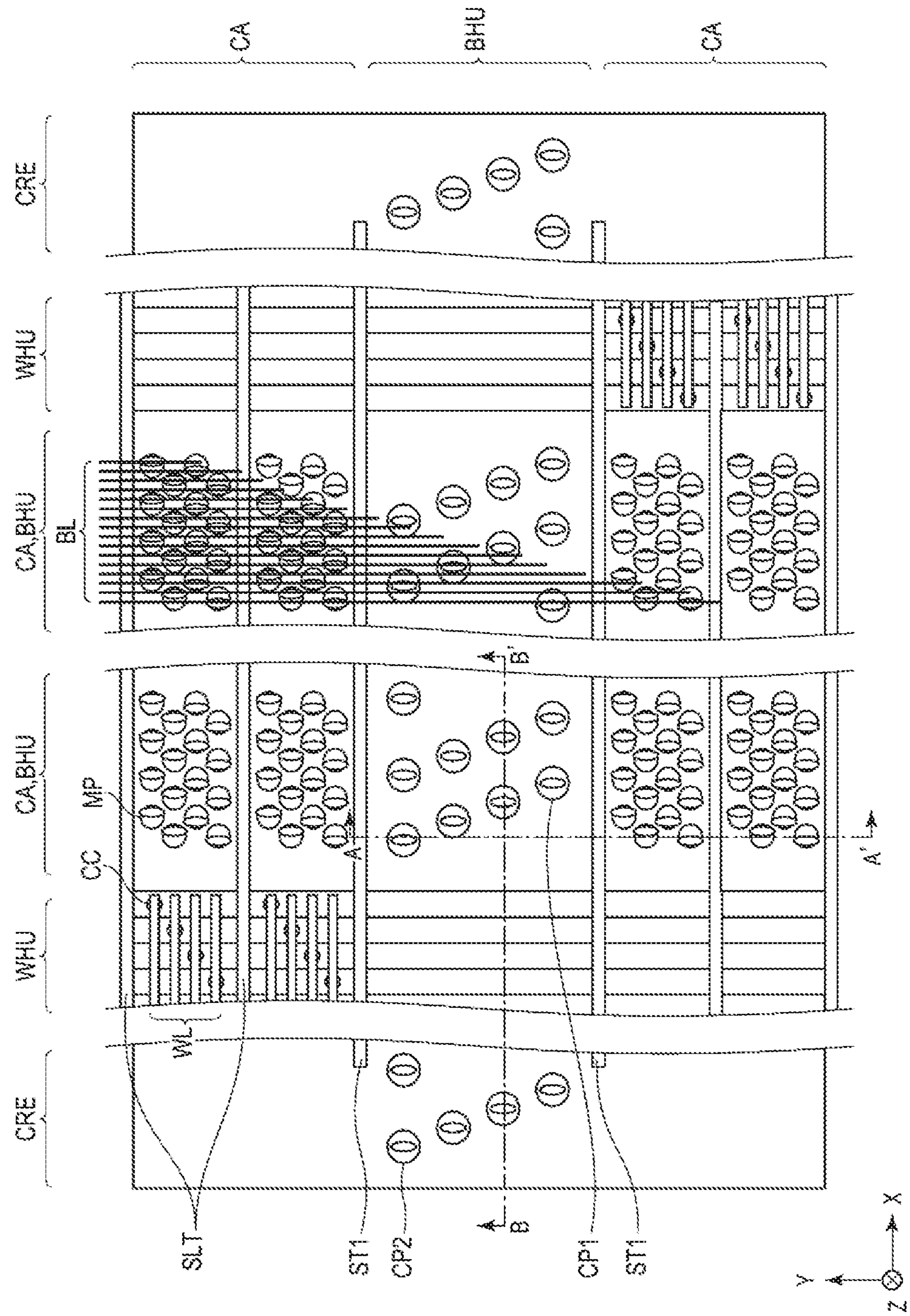
FIG. 4 is a view illustrating a planar structure of the semiconductor storage device according to the first embodiment.

Next, the planar structure of the semiconductor storage device of the first embodiment will be described with reference to FIG. 4. FIG. 4 is a plan view schematically illustrating the planar structure of the semiconductor storage device according to the first embodiment.

As illustrated in FIG. 4, a bit line hookup area BHU is formed in the Y direction between cell array areas CA. A slit (or isolation area) ST1 is formed between the cell array area CA and the bit line hookup area BHU. The slit ST1 has a plate shape extending in the X direction and the Z direction. The slit ST1 separates the cell array area CA and the bit line hookup area BHU.

Plural memory pillars MP and a slit SLT are formed in each cell array area CA. The plural memory pillars MP are arranged in a zigzag pattern. The slit SLT has a plate shape that extends in the X direction and the Z direction. The slit SLT demarcates the plural memory pillars MP in the cell array area CA in the X direction.

Plural contact plugs CC are formed in the word line hookup area WHU set at an end portion of the cell array area CA in the Y direction. Wiring layers electrically connected to the contact plugs CC are formed on the contact plugs CC. These wiring layers function as word lines WL.

Plural contact plugs CP1 are arranged in a zigzag pattern in the bit line hookup area BHU. The bit lines BL on the bit line hookup area BHU and the cell array area CA are electrically connected to the memory pillars MP and the contact plugs CP1, respectively.

Plural contact plugs CP2 are arranged in a zigzag pattern in the contact area CRE. The contact plugs CP2 are electrically connected to wiring layers formed thereon (not illustrated). Further, plural contact plugs (not illustrated) are arranged in a zigzag pattern in the contact area CRI.

1.2.2. Cross-Sectional Structure of Semiconductor Storage Device

Figure 5:
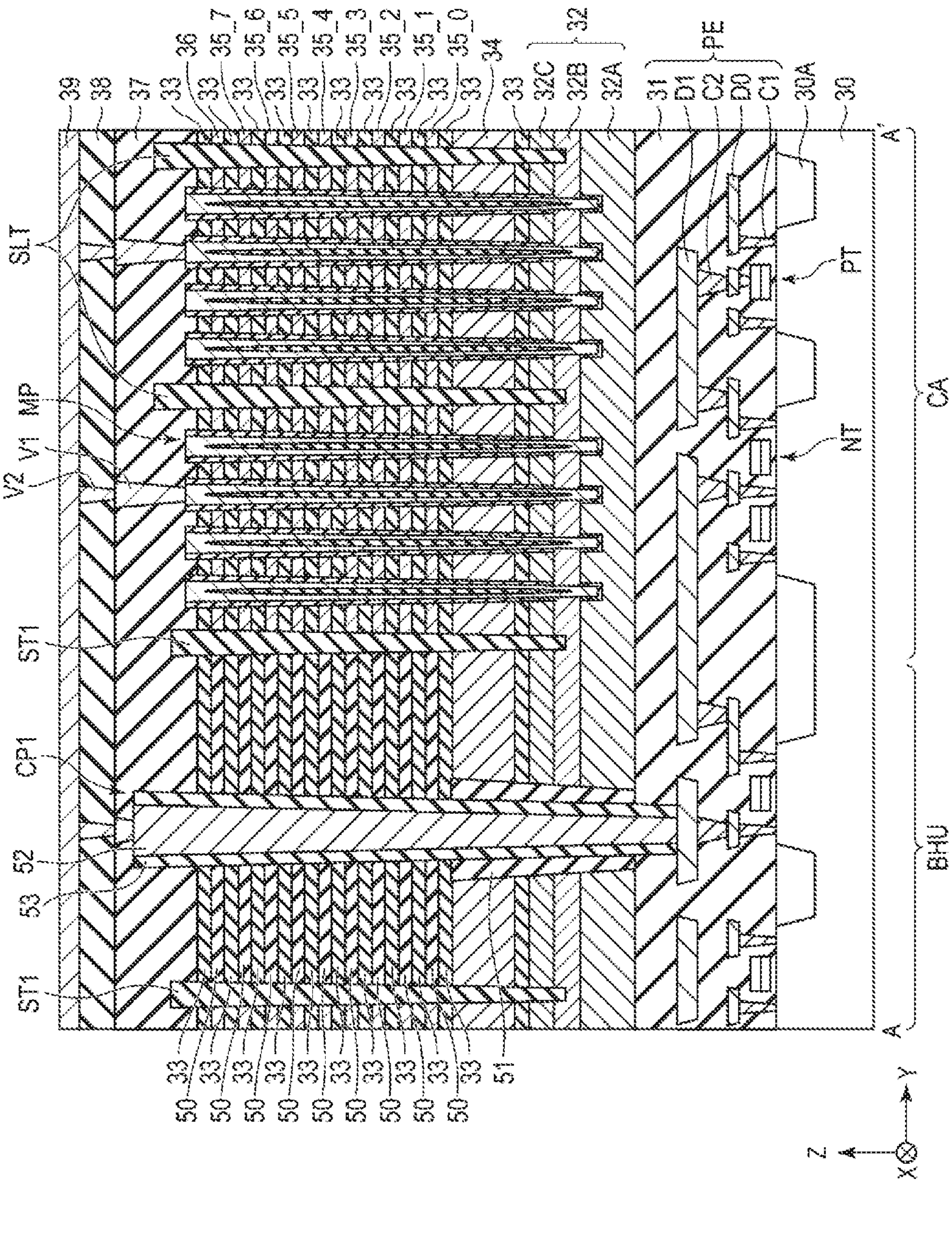
FIG. 5 is a cross-sectional view taken along line A-A' in FIG. 4.
Figure 6:
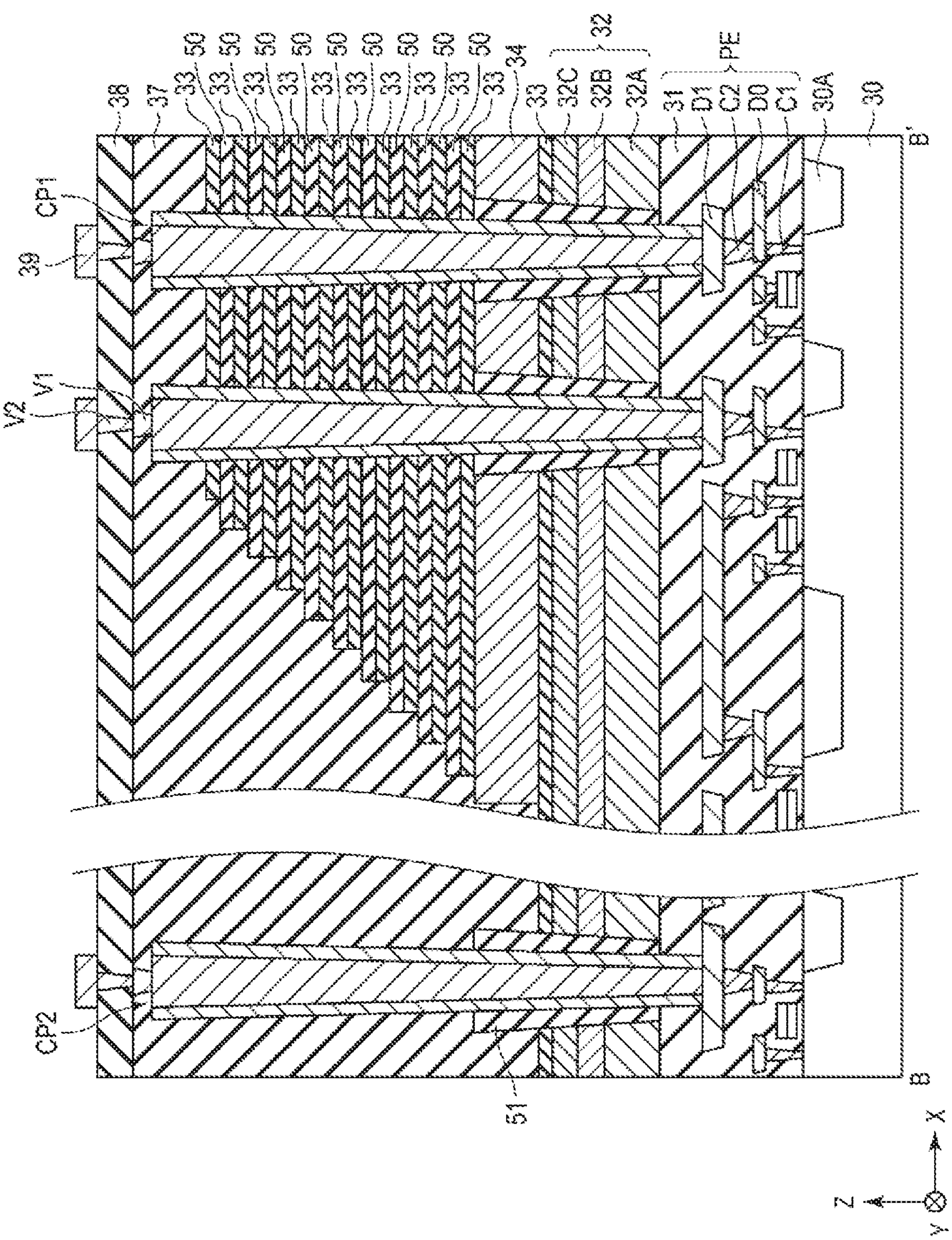
FIG. 6 is a cross-sectional view taken along line B-B' in FIG. 4.

Next, the cross-sectional structure of the semiconductor storage device according to the first embodiment will be described with reference to FIGS. 5 and 6. FIG. 5 is a cross-sectional view taken along line A-A' in FIG. 4. FIG. 6 is a cross-sectional view taken along line B-B' in FIG. 4. The number of memory pillars MP and contact plugs CP1 and CP 2 is any number, and the number of memory pillars MP and contact plugs CP1 and CP2 in FIG. 4 and the cross-sectional view thereof may not match. This also applies to the following embodiments.

First, the cross-sectional structure taken along line A-A' of the semiconductor storage device will be described.

As illustrated in FIG. 5, a peripheral circuit layer PE is formed on a semiconductor substrate (e.g., a silicon single crystal substrate) 30. The peripheral circuit layer PE is provided with peripheral circuits (or logic circuits), for example, the row decoder 12 the driver 13, the sense amplifier 14, the address register 15, the command register 16, the sequencer 17 and the like as described above. Specifically, element isolation areas 30A are formed on the semiconductor substrate 30, and a CMOS circuit including an n-channel MOS field effect transistor hereinafter, referred to as an nMOS transistor) NT and a p-channel MOS field effect transistor (hereinafter, referred to as a pMOS transistor) PT is formed between the element isolation areas 30A.

More specifically, a source area and a drain area (not rated) are formed between the element isolation areas 30A, and a gate electrode GE is formed on the semiconductor substrate 30 between the source area and the drain area via a gate insulating film. Vias C1 are formed on the source area and the drain area, respectively. A wiring layer D0 is formed on each via C1, and a wiring layer (or electrode pad) D1 is formed on the wiring layer D0 via a via C2. A contact plug CP1 to be described later is formed on the wiring layer D1. Furthermore, an insulating layer 31 is formed around the nMOS transistor NT, the pMOS transistor PT, the wiring layers D0 and D1 and the vias C1 and C2. The wiring layers D0 and D1 and the vias C1 and C2 contain, for example, tungsten (W). The insulating layer 31 includes, for example, a silicon oxide layer.

A conductive layer 32 is formed on the insulating layer 31. The conductive layer 32 includes conductive layers 32A, 32B and 32C arranged from the insulating layer 31 side. The conductive layer 32 functions as a source line SL. The conductive layers 32A, 32B and 32C contain, for example, polycrystalline silicon or tungsten (W).

A stacked body including plural insulating layers 33 and plural conductive layers 34, 35_0, 35_1, 35_2, 35__3, 35_4, 35_5, 35_6, 35_7 and 36 alternately stacked in the Z direction is formed on the conductive layer 32. The conductive layers 34, 35__0 to 35_7 and 36 have a plate shape parallel to the XY plane (or the semiconductor substrate 30 plane) and extend in the X direction. Each of the conductive layers 34, 35_0 to 35_7 and 36 extending in the X direction is electrically connected to a wiring layer (not illustrated) extending in the X direction via a contact plug in the word line hookup area WHU. The conductive layer 34 functions as a select gate line SGS. The conductive layers 35_0 to 35_7 function as word lines WL0 to WL7. The conductive layer 36 functions as a select gate line SGD. The insulating layer 33 includes, for example, a silicon oxide layer. The conductive layers 34, 35_0 to 35_7 and 36 contain, for example, tungsten (W) or polycrystalline silicon.

Plural columnar memory pillars MP are formed in the stacked body including the plural insulating layers 33 and the plural conductive layers 34, 35_0 to 35_7 and 36. Lace memory pillar are MP extends in the Z direction. Each memory pillar MP is disposed to penetrate the insulating layer 33 and the conductive layers 34, 35_0 to 35_7 and 36 in the stacking direction, and reaches the conductive layer 32 from the upper surface of the uppermost insulating layer 33. That is, the memory pillar MP passes through the select gate line SGD, the plural word lines WL0 to WL7, the select gate line SGS and the plural insulating layers 33 from the upper surface of the insulating layer 33 to be connected to the source line SL. Details of the memory pillar MP will be described later.

Furthermore, plural slits SLT are formed in the stacked body including the plural insulating layers 33 and the plural conductive layers 34, 35_0 to 35_7 and 36. The slits SIT separate the stacked body including the plural insulating layers 33 and the plural conductive layers 34, 35_0 to 35_7 and 36. The slits SLT has a plate shape extending in the X direction and the Z direction. The slits SLT include an insulating material, for example, an insulating layer in which silicon oxide layer is buried.

An insulating layer 37 is formed on the insulating layer 33. A via V1 extending in the Z direction is formed in the insulating layer 37 on the memory pillar MP. An insulating layer 38 is formed on the via V1 and the insulating layer 37. A via V2 extending in the Z direction is formed in the insulating layer 38 on the via V1. Furthermore, a conductive layer (or a wiring, an upper layer wiring) 39 is formed on the via V2 and the insulating layer 38. The conductive layer 39 is electrically connected to the memory pillar MP via the vias V2 and V1 and is further electrically connected to the contact plug CP1 via the vias V2 and V1 in the bit line hookup area BHU. The conductive layer 39 functions as a bit line BL. The insulating layer 37 includes, for example, a silicon oxide layer. The conductive layer 39 and the vias V1 and V2 contain, for example, tungsten (W).

In addition, as illustrated in FIG. 5, the bit line hookup area BHU is sandwiched between the slits ST1. Each slit ST1 has a plate shape extending in the X direction and the Z direction. The slit ST1 separates the stacked body on the conductive layer 32 in the cell array area CA and the stacked body on the conductive layer 32 in the bit line hookup area BHU. The upper surface of the slit ST1 is lower than the upper surface of the slit SLT. That is, the height of the slit ST1 from the semiconductor substrate surface is lower than the height of the slit SLT from the semiconductor substrate surface. The slit ST1 includes an insulating material, for example, an insulating layer in which at least one of a silicon oxide layer and an aluminum oxide layer is buried.

In the bit line hookup area BHU, the insulating layer 33 is formed on the conductive layer 32 and the conductive layer 34 is formed on the insulating layer 33. A stacked body including plural insulating layers 33 and plural insulating layers 50 alternately stacked in the Z direction is formed on the conductive layer 34. An insulating layer 37 is formed on the uppermost insulating layer 33.

Plural columnar contact plugs CP1 are formed in the insulating layer 37, the plural insulating layers 33, the plural insulating layers 50, the conductive layers 34 and 32 and the insulating layer 31. Each contact plug CP1 extends in the Z direction. Each contact plug CP1 is disposed to penetrate the plural insulating layers 33, the plural insulating layers 50, the conductive layers 34 and 32 and the insulating layer 31 in the stacking direction, and reaches the wiring layer D1 from the upper surface of the uppermost insulating layer 33. That is, the contact plug CP1 passes from the upper surface of the insulating layer 33 through the plural insulating layers 33, the plural insulating layers 50, the select gate line SGS, the source line SL and the insulating layer 31, and is connected to the wiring layer D1 of the peripheral circuit layer PE.

The contact plug CP1 has, for example, a conductive layer 52 formed therein and an insulating layer 53 formed on the outer peripheral surface of the conductive layer 52. An insulating layer 51 is formed between the insulating layer 53 of the contact plug CP1 and the conductive layers 32 and 34. The insulating layer 51 enhances the insulating property between the contact plug CP1 and the conductive layers 32 and 34. The conductive layer 52 contains, for example, tungsten. The insulating layers 51 and 53 include, for example, a silicon oxide layer.

Next, the cross-sectional structure taken along line B-B' of the semiconductor storage device will be described with reference to FIG. 6. FIG. 6 is a cross-sectional view of the contact area CRE, the word line hookup area WHU and the bit line hookup area BHU. In the bit line hookup area BHU, as described above, each contact plug CP1 is formed so as to extend the plural insulating layers 33, the plural insulating layers 50, the conductive layers 34 and 32 and the insulating layer 31 in the stacking direction, and reaches the wiring layer D1 from the upper surface of the uppermost insulating layer 33.

In the word line hookup area WHU, the plural insulating layers 33 and the plural insulating layers 50 are sequentially formed stepwise in the K direction. In the contact area CRE, each contact plug CP2 is formed so as to extend the insulating layer 37, the insulating layer 33, the conductive layer 32 and the insulating layer 31 in the stacking direction, and reaches the wiring layer D1 from the upper surface of the uppermost insulating layer 33. An insulating layer 51 is formed between the insulating layer 53 of the contact plug CP2 and the conductive layer 32. The insulating layer 51 enhances the insulating property between the contact plug CP2 and the conductive layer 32.

1.2.3. Structure of Memory Pillar MP (Memory Cell Transistor)

Figure 7:
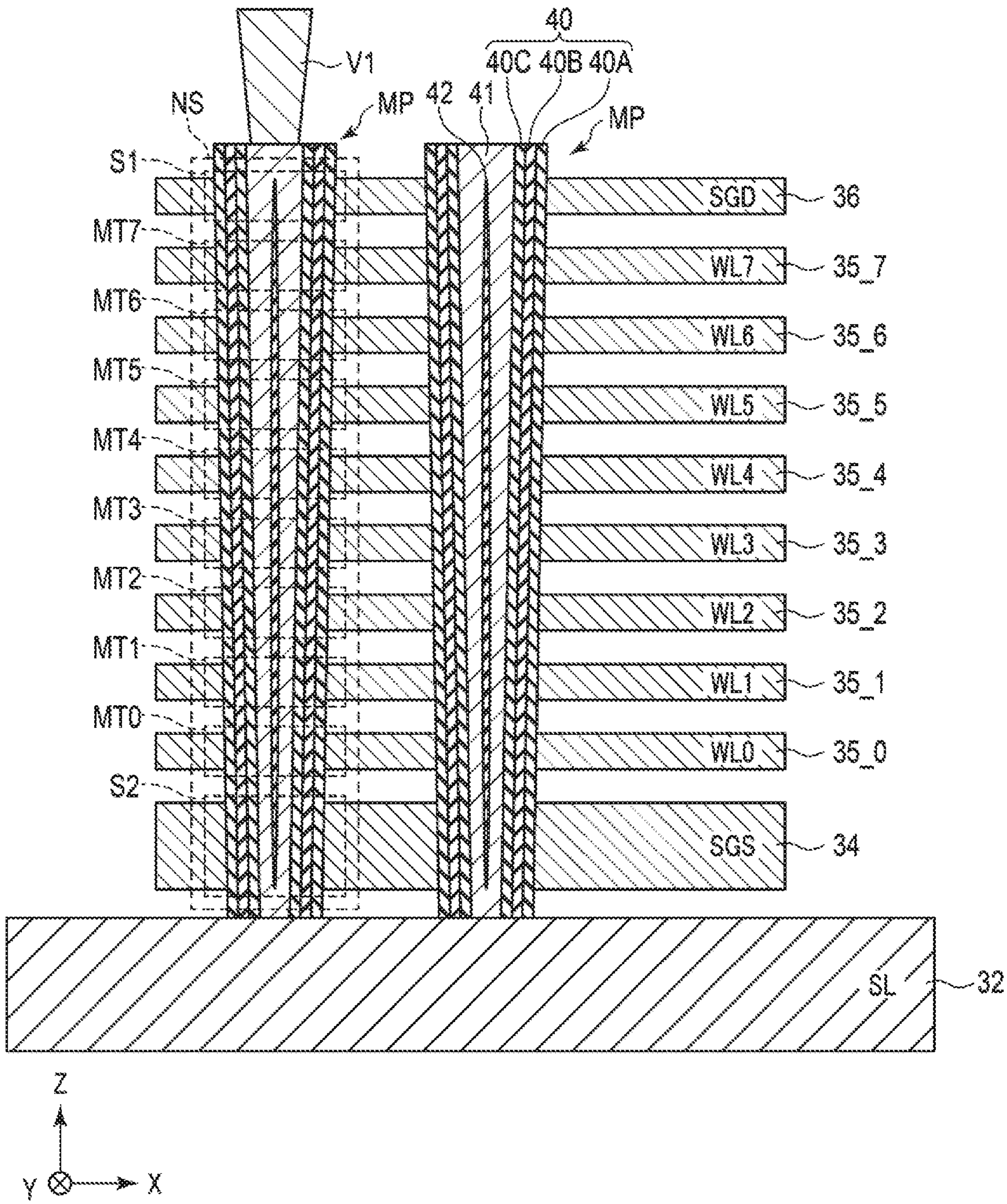
FIG. 7 is a cross-sectional view of a memory cell transistor in a cell array area according to the first embodiment.

Next, the cross-sectional structure of a memory cell transistor MT formed in the memory pillar MP in the cell array area CA will be described with reference to FIG. 7. FIG. 7 is a cross-sectional view of the memory cell transistor in the cell array area CA according to the first embodiment. An interlayer insulating film between conductive layers is not illustrated in FIG. 7.

As illustrated in FIG. 7, the cell array area CA includes conductive layers 32, 34, 35_0 to 35_1 and 36 and a memory pillar MP. The conductive layer 32 is formed in a plate shape along the XY plane and functions as a source line SL as described above.

The conductive layers 34, 35_0 to 35_7 and 36 are formed on the conductive layer 32 in order from the lower layer. Among these conductive layers, conductive layers adjacent in the Z direction are stacked via an interlayer insulating film. The conductive layers 34, 35_0 to 35_7 and 36 are each formed in a plate shape along the XY plane. As described above, the conductive layer 34 functions as a select gate line SGS. The conductive layers 35_0 to 35_7 function as word lines WL0 to WL 7 in order from the lower layer, respectively. The conductive layer 36 functions as a select gate line SGD.

The plural memory pillars MP are arranged in, for example, a zigzag manner in the XY direction. Each memory pillar MP functions as one NAND string NS. Each memory pillar MP is formed so as to pass through the conductive layers 34, 35_0 to 35_7 and 36 and reach the upper surface of the conductive layer 32 from the upper surface of the conductive layer 36.

The memory pillar MP includes, for example, a cell insulating film 40, a semiconductor layer 41 and a core insulating film 42 formed in order from the conductive layer side. The cell insulating film 40 includes a block insulating film 40A, a charge storage film (also referred to as a charge storage layer) 40B and a tunnel insulating film 40C. Specifically, the block insulating film 40A is formed on the inner wall of a memory hole that forms the memory pillar MP. The charge storage film 40B is formed on the inner wall of the block insulating film 40A. The tunnel insulating film 40C is formed on the inner wall of the charge storage film 40B. The semiconductor layer 41 is formed on the inner wall of the tunnel insulating film 40C. Further, the core insulating layer (e.g., a silicon oxide layer) 42 is formed in the semiconductor layer 41.

In the configuration of the memory pillar MP described above, a portion where the memory pillar MP and the conductive layer 34 intersect with each other functions as the select gate transistor S2. Portions where the memory pillar MP and the conductive layers 35_0 to 35_7 intersect with each other function as the memory cell transistors MT0 to MT7, respectively. Each of the memory cell transistors MT0 to MT7 is a memory cell in which data may be stored. Data is written in each memory cell transistor MT0 to MT7 by a write operation. Further, a portion where the memory pillar MP and the conductive layer 36 intersect with each other functions as the select gate transistor S1.

The semiconductor layer 41 functions as a channel layer of the memory cell transistor MT and the select gate transistors S1 and S2. A current path of the NAND string NS is formed in the semiconductor layer 41.

The charge storage film 40B has a function of accumulating charges injected from the semiconductor layer 41 in the memory cell transistor MT. The charge storage film 40B includes, for example, a silicon nitride film.

The tunnel insulating film 40C functions as a potential barrier when charges are injected from the semiconductor layer 41 into the charge storage film 40B or when charges accumulated in the charge storage film 40B diffuse into the semiconductor layer 41. The tunnel insulating film 40C includes, for example, a silicon oxide film.

The block insulating film 40A prevents the charges accumulated in the charge storage film 40B from diffusing into the conductive layers (word lines WL) 35_0 to 35_7. The block insulating film 40A includes, for example, a silicon oxide film and a silicon nitride film.

A via V1 is formed on the memory pillar MP, and a wiring layer (not illustrated) as a bitline BL is formed on the memory pillar MP.

The configuration of the memory cell array 11 including the cell array area CA is not limited to the above configuration. The number of word lines WL and select gate lines SGD and SGS is changed according to the number of memory cell transistors MT and select gate transistors S1 and S2, respectively. The select gate line SGS may be composed of plural conductive layers and the select gate line SGD may be composed of plural conductive layers.

1.3. Semiconductor Storage Device Manufacturing Method

Next, a method of manufacturing the semiconductor storage device according to the first embodiment will be described with reference to FIGS. 8 to 13. FIGS. 8 to 13 are cross-sectional views of the structure of each manufacturing process of the semiconductor storage device according to the first embodiment, which are taken along line A-A' (Y direction) in FIG. 4.

Figure 8:
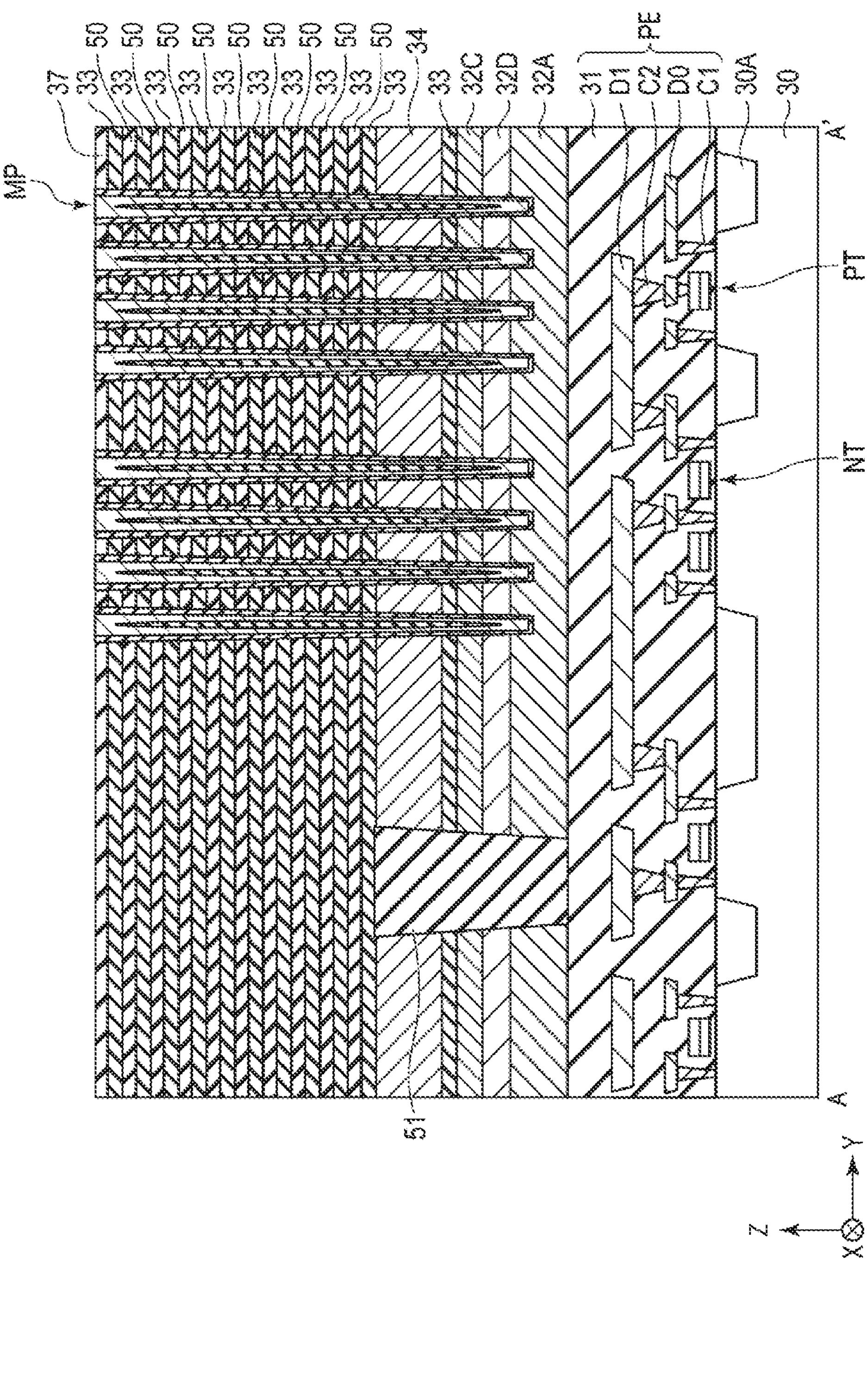
FIG. 8 is a cross-sectional view of a structure in the manufacturing process of the semiconductor storage device according to the first embodiment.

First, as illustrated in FIG. 8, the peripheral circuit layer PE, the conductive layers 32A, 32D, 32C and 34 are formed on the semiconductor substrate 30 and the plural insulating layers 33 and the plural insulating layers 50 are stacked to form the memory pillar MP. Specifically, a CMOS circuit including, for example, an nMOS transistor and a pMOS transistor, is formed on the semiconductor substrate 30, and the via C1, the wiring layer D0, the via C2, the wiring layer D1 and the like connected to the CMOS circuit are formed. Further, the insulating layer 31 is formed on the wiring layer D1. As a result, the peripheral circuit layer PE including the row decoder 12, the driver 13, the sense amplifier 14, the address register 15, the command register 16, the sequencer 17 and the like is formed on the semiconductor substrate 30.

Subsequently, the conductive layer 32A, a sacrificial layer (not illustrated), the conductive layer 32D, a sacrificial layer (not illustrated) and the conductive layer 32C are formed in order on the insulating layer 31 by, for example, a CVD (Chemical Vapor Deposition) method (or an ALD (Atomic Layer Deposition) method). Further, the insulating layer 33 and the insulating layer 34 are formed in order on the conductive layer 32C by, for example, a CVD (or ALD) method. The conductive layer 32D includes, for example, a polycrystalline Silicon layer. The sacrificial layer includes, for example, a silicon oxide layer. Further in the bit line hookup area BHU, the insulating layer 51 extending through the conductive layers 32A, 32D, 32C and 34 in the Z direction is formed in an area where the contact plug CP1 is to be formed.

Subsequently, the plural insulating layers 33 and the plural insulating layers 50 are alternately stacked on the conductive layer 34 by, for example, a CVD (or ALD) method. As a result, the stacked body including the insulating layer 33, the conductive layer 34, the plural insulating layers 33 and the plural insulating layers 50 alternately stacked is formed. Subsequently, the memory pillar MP extending in the Z direction is formed in the stacked body and the conductive layers 32A, 32D and 32C.

Figure 9:
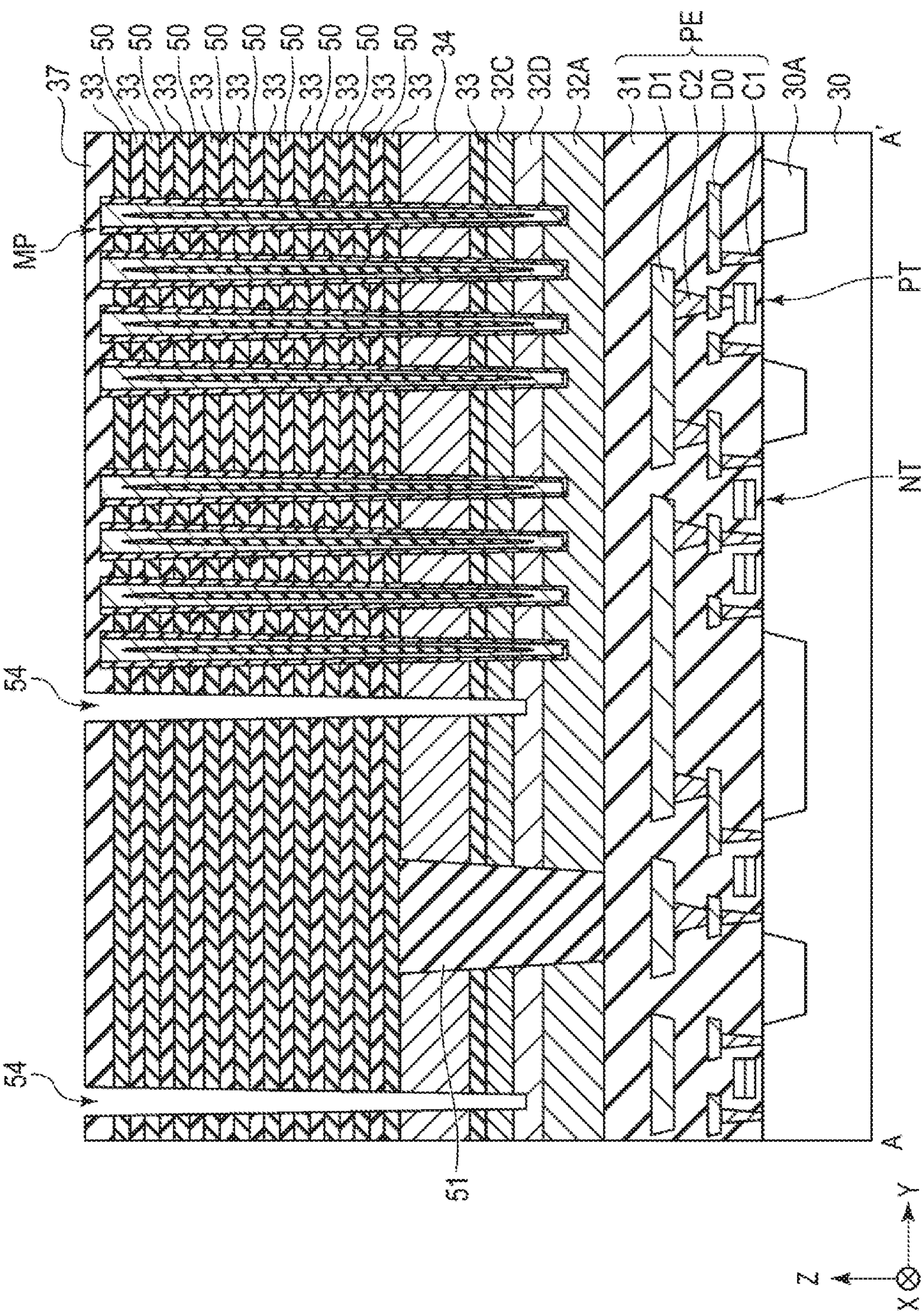
FIG. 9 is a cross-sectional view of a structure in the manufacturing process of the semiconductor storage device according to the first embodiment.
Figure 10:
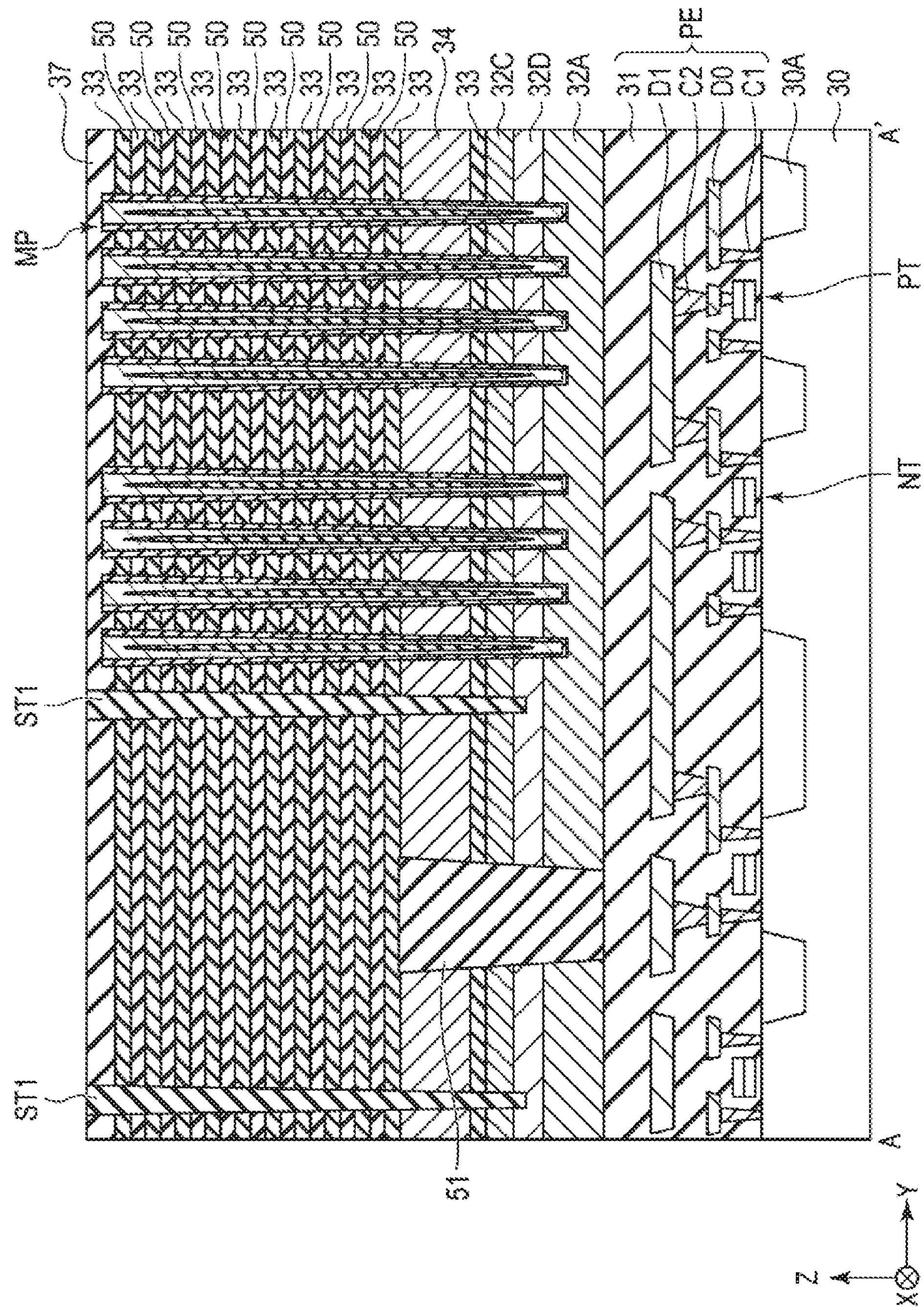
FIG. 10 is a cross-sectional view of a structure in the manufacturing process of the semiconductor storage device according to the first embodiment.

Next, as illustrated FIGS. 9 and 10, the slit ST1 is formed between the cell array area CA and the bit line hookup area BHU. Specifically, the insulating layer 37 is formed on the memory pillar MP and the insulating layer 33 by, for example, a CVD (or ALD) method. Further, as illustrated in FIG. 9, a groove 54 for the slit ST1 extending in the X direction and the Z direction formed in the insulating layer 37, the plural insulating layers 33 and the plural insulating layers 50 between the cell array area CA and the bit line hookup area BHU is formed by, for example, a RIE (Reactive Ion Etching) method. Subsequently, an insulating material, for example, at least one of a silicon oxide layer or an aluminum oxide layer, is buried in the groove 54 by, for example, a CVD (or ALD) method. As a result, the slit ST1 is formed between the cell array area CA and the bit line hookup area BHU.

Figure 11:
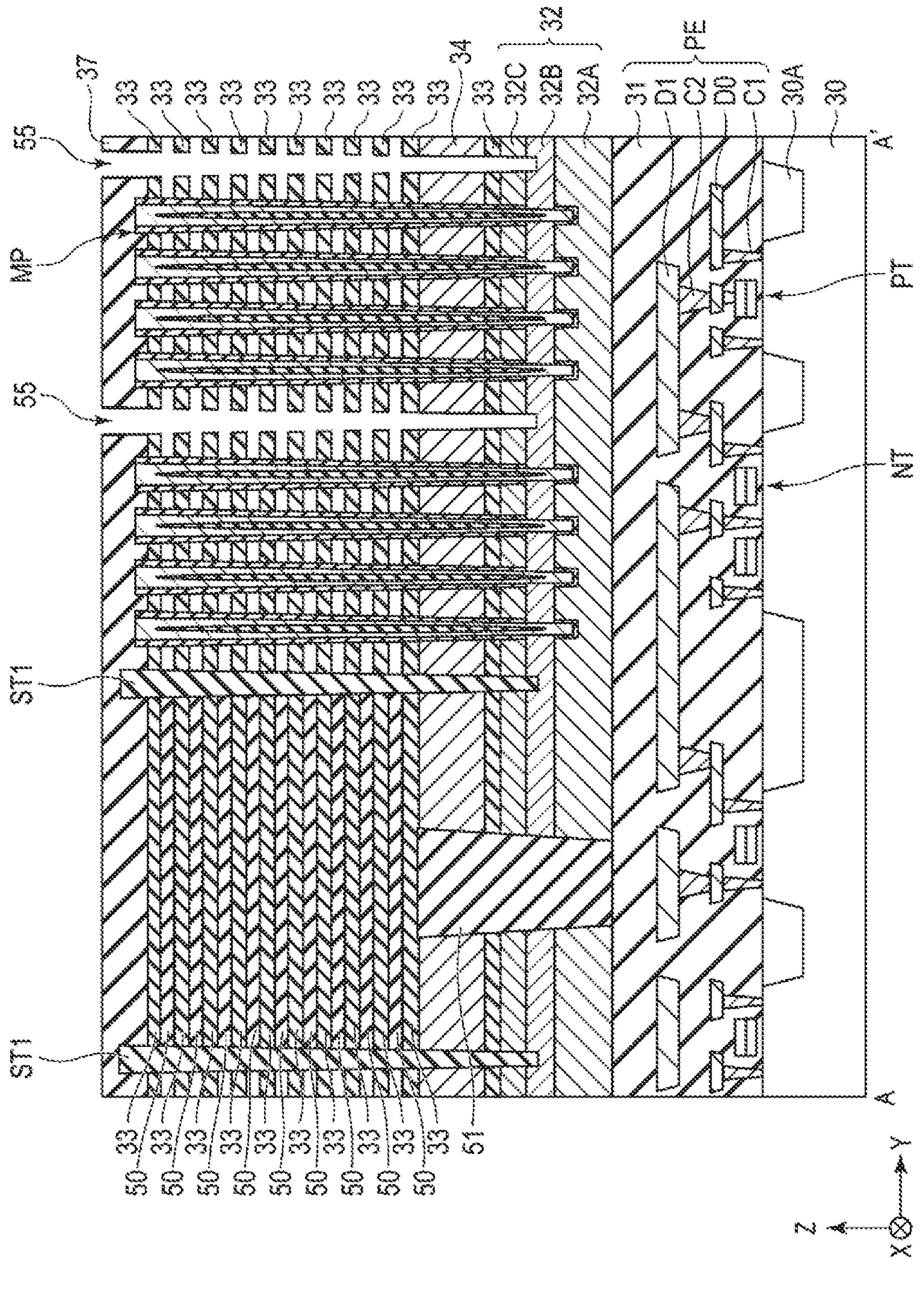
FIG. 11 is a cross-sectional view of a structure in the manufacturing process of the semiconductor storage device according to the first embodiment.
Figure 12:
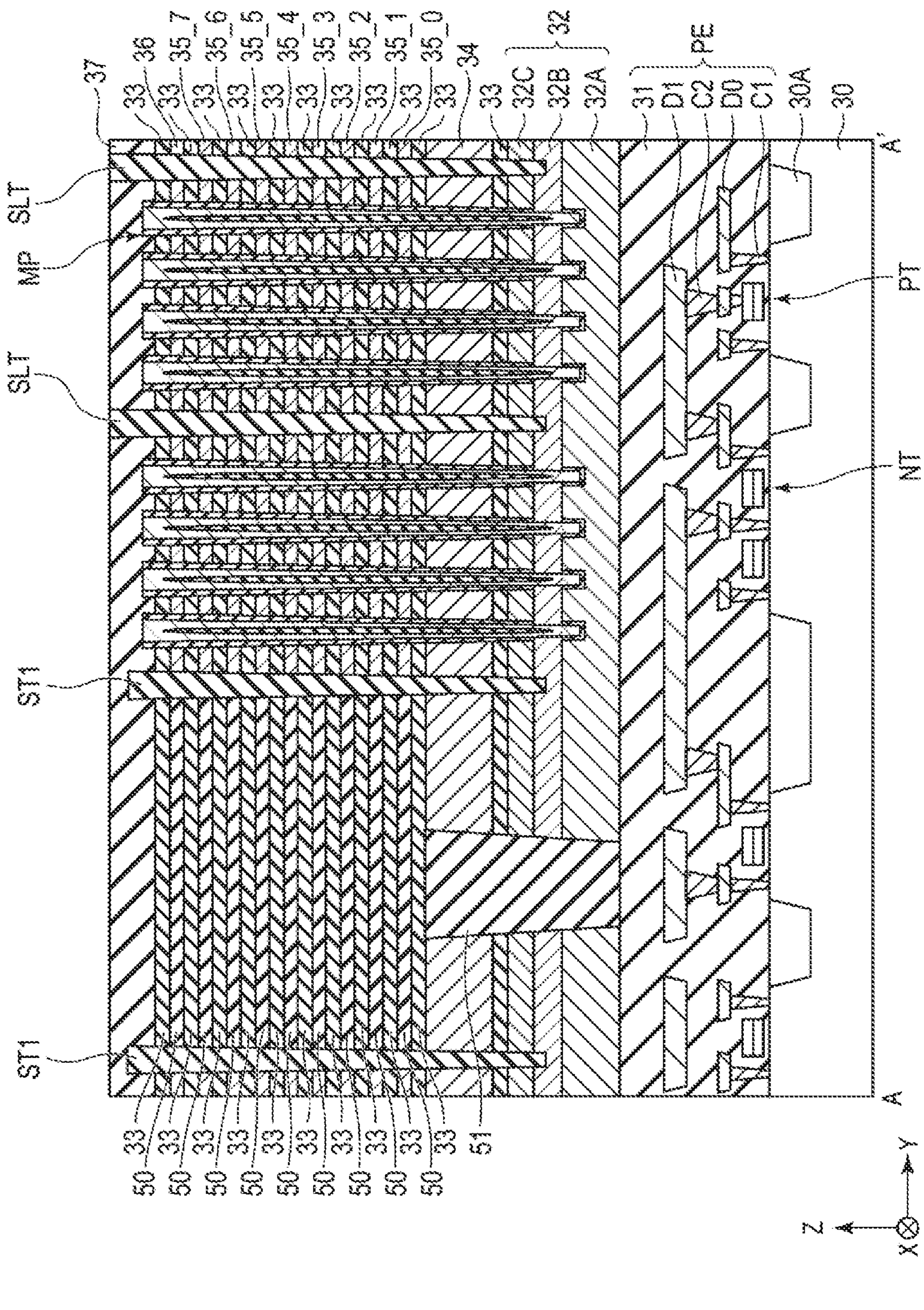
FIG. 12 is a cross-sectional view of a structure in the manufacturing process of the semiconductor storage device according to the first embodiment.

Next, as illustrated in FIGS. 11 and 12, the insulating layers (e.g., silicon nitride layers) 50 are replaced with the conductive layers (e.g. tungsten layers) 35_0 to 35_7 and 36, and the slit SLT that separates the conductive layers 35_0 to 35_7 and 36 is formed. Further, the conductive layer (source line SL) 32 is connected to the memory pillar MP. Specifically, a groove 55 for the slit SLT is formed in the stacked body including the insulating layer 37, the plural insulating layers 33, the plural insulating layers 50, the conductive layer 34, the insulating layer 33 and the conductive layer 32 by, for example, a RIE method. The groove 55 reaches the conductive layer 32 from the surface of the insulating layer 37. Subsequently, the conductive layer (polycrystalline silicon layer) 32D (see FIG. 10) and the sacrificial layers disposed above and below the conductive layer 32D are removed through the groove 55 by wet etching. As a result, a gap is formed between the conductive layer 32A and the conductive layer 32C. Further, a conductive layer 323 is formed by a CVD (or ALD) method so as to fill the gap between the conductive layer 32A and the conductive layer 32C. As a result, the conductive layer 32B is connected to the memory pillar MP.

Subsequently, in the cell array area CA, the insulating layer (silicon nitride layer) 50 is removed through the groove 55 by, for example, wet etching using a phosphoric acid solution. By this wet etching, the insulating layer (silicon oxide layer) 33 is not removed but remains. As a result, a gap is formed between the insulating layers 33. Further, the gap between the insulating layers 33 is filled with a conductive material such as tungsten by, for example, a CVD (or ALD) method to form the conductive layers 35_0 to 35_7 and 36. Subsequently, an insulating material, for example, a silicon oxide layer, is buried in the groove 55 by, for example, a CVD (or ALD) method. As a result, the slit SLT is formed.

In the meantime, in the bit line hookup area BHU, in wet etching using a phosphoric acid solution, the phosphoric acid solution is blocked by the slit ST1 and does not reach the insulating layers 50 in the bit line hookup area BHU. Therefore, the insulating layers 50 in the bit line hookup area BHU are not removed but remain intact. That is, in the process of replacing the insulating layers with the conductive layers 35_0 to 35_7 and 36, the insulating layers 50 in the bit line hookup area BHU are not replaced with the conductive layers, and the bit line hookup area BHU maintains the stacked body including the plural insulating layers 33 and the plural insulating layers 50 as they are.

Figure 13:
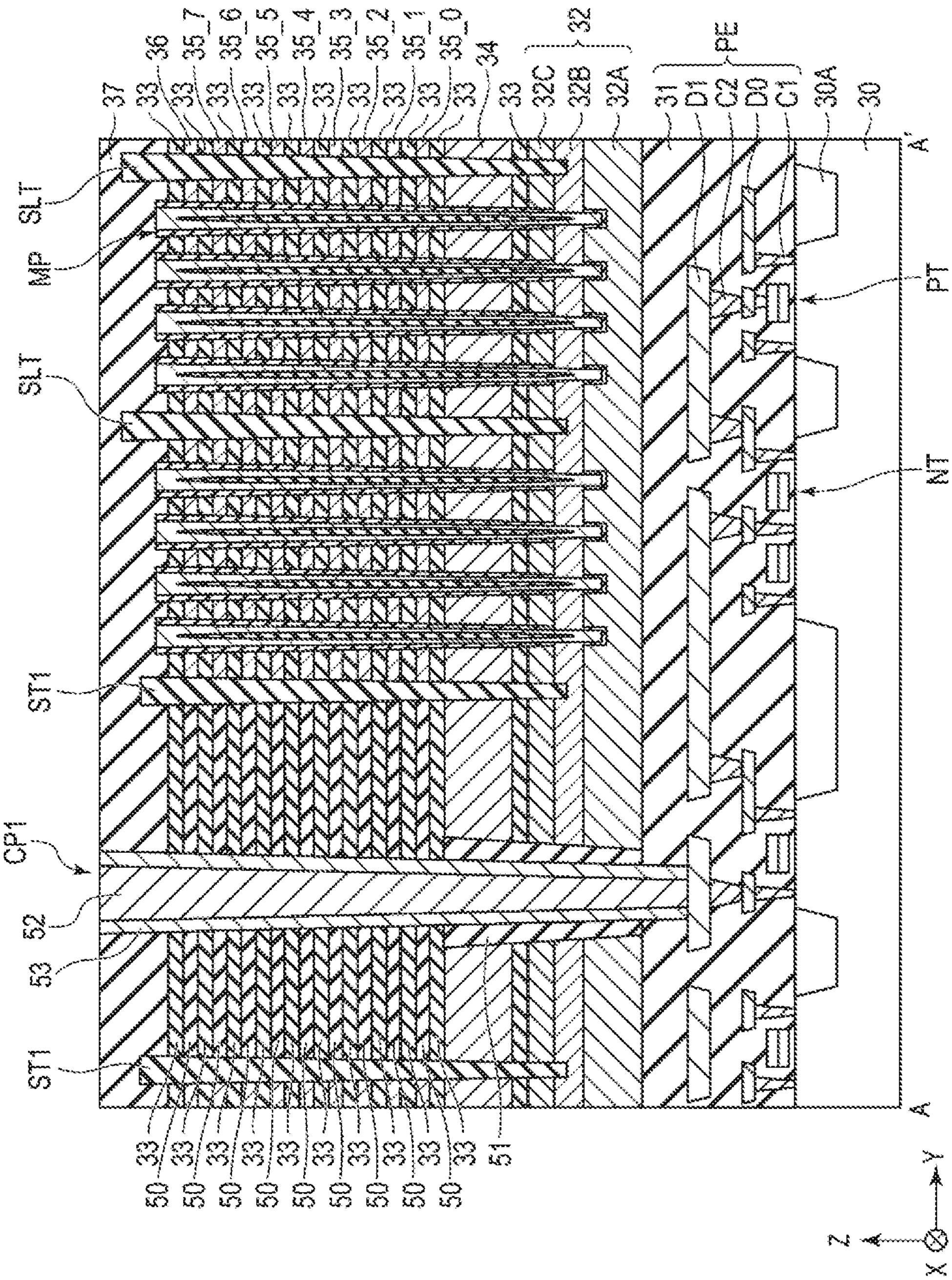
FIG. 13 is a cross-sectional view of a structure in according to the first embodiment.

Next as illustrated FIG. 13, the contact plug CP1 is formed in the bit line hookup area BHU. Specifically, an insulating layer 37 is further formed on the slit SLT and the insulating layer 37 by, for example, the CVD (or ALD) method. Subsequently, a hole for the contact plug CP1 is formed in the stacked body including the insulating layer 37 of the bit line hookup area BHU, the plural insulating layers 33, the plural insulating layers 50 and the insulating layer 51 by, for example, a RIE method. Subsequently, the insulating layer 53 is formed on the inner wall of the hole for the contact plug CP1 by, for example, a CVD (or ALD) method, and the conductive layer 52 is buried in the insulating layer 53. As a result, the contact plug CP1 is formed in the bit line hookup area BHU.

Next, as illustrated in FIG. 5, the vias V1 and V2 and the conductive layer 39 connected to the memory pillar MP and the contact plug CP 1 are formed. Specifically, an insulating layer 37 is formed on the contact plug CP1 and the insulating layer 37 by, for example, a CVD (or ALD) method. Subsequently, the via V1 is formed in the insulating layer 37 on the memory pillar MP and the contact plug CP1. Further, the insulating layer 38 is formed on the via V1 and the insulating layer 37. Subsequently, the via V2 is formed in the insulating layer 38 on the via V1. Further, the conductive layer 39 is formed on the via V2 and the insulating layer 38. Thus, the manufacture of the semiconductor storage device according to the first embodiment is completed.

1.4. First Modification

Figure 14:
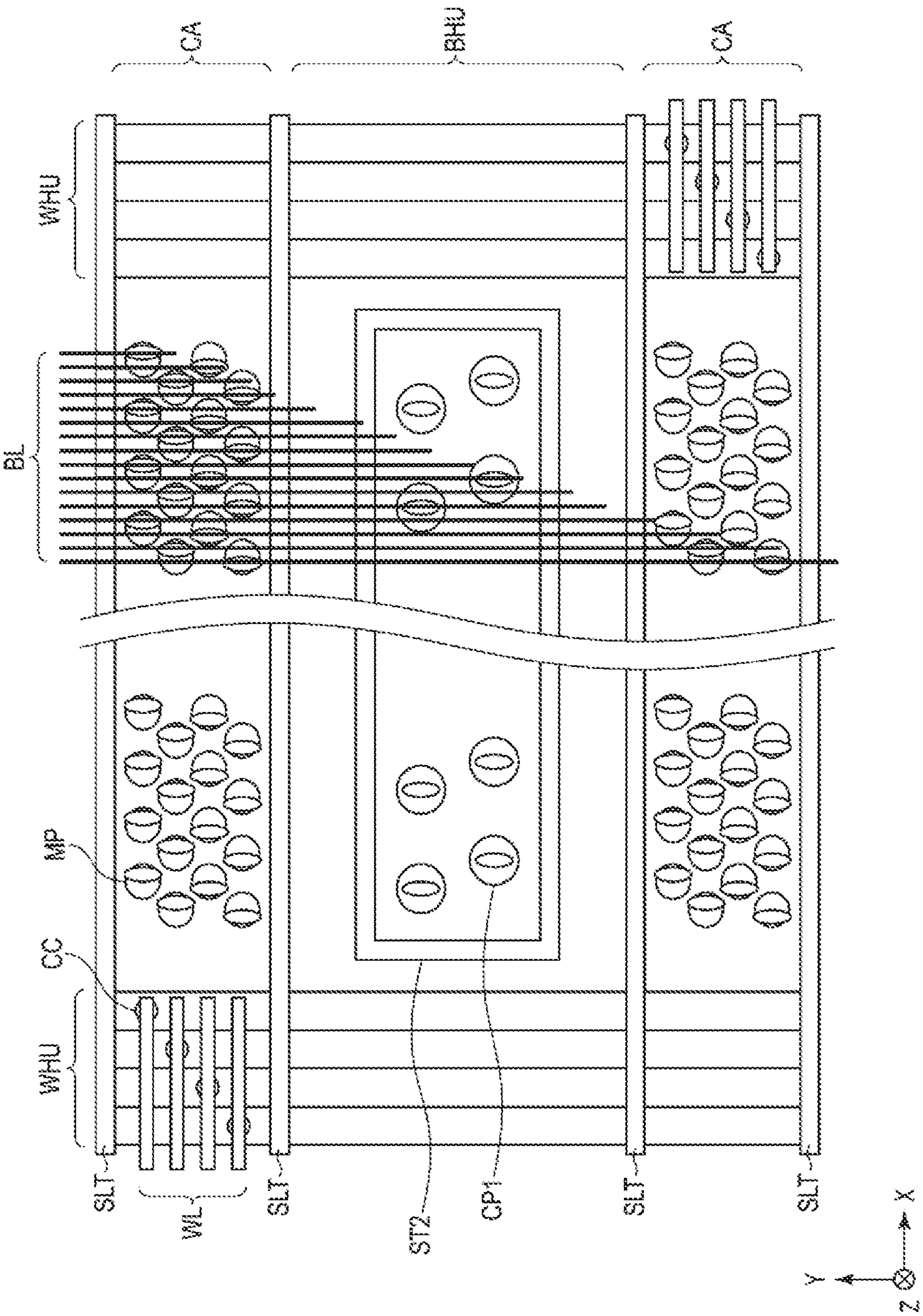
FIG. 14 is a view illustrating a planar structure according to a first modification of the first embodiment.

Next, a first modification of the first embodiment will be described with reference to FIG. 14. The first modification will be mainly described with differences from the first embodiment. This also applies to the subsequent modifications. FIG. 14 illustrates a planar structure of a semiconductor storage device according to the first modification of the first embodiment, and represents, cell array areas CA, word line hookup areas WHU and a bit line hookup area BHU.

The bit line hookup area BHU is interposed between the cell array areas CA in the Y direction. Plural contact plugs CP1 and a slit (or isolation area) ST2 are formed in the bit line hookup area BHU. The slit ST2 is disposed around the plural contact plugs CP1 so as to surround the plural contact plugs CP1. The slit ST2 includes an insulating material, for example, an insulating layer in which at least one of a silicon oxide layer or an aluminum oxide layer is buried.

A stacked body including plural insulating layers 33 and plural conductive layers 34, 35_0 to 35_7 and 36 is disposed outside the slit ST2. A stacked body including plural insulating layers 33 and plural insulating layers 50 is disposed inside the slit ST2. That is, an area surrounded by the slit ST2 has the stacked body including the plural insulating layers 33 and the plural insulating layers 50. The slit ST2 extends in the Z direction and separates the stacked body outside the slit ST2 from the stacked body inside the slit ST2. The contact plug CP1 extends the plural insulating layers 33 and the plural insulating layers 50 in the Z direction and reaches the wiring layer D1 of the peripheral circuit layer PE.

That is, in the area surrounded by the slit ST2, the plural insulating layers 50 are not replaced by the conductive layers 35_0 to 35_7 and 36 as in the outside of the slit ST2, and the plural insulating layers 50 are arranged as they are. The contact plug CP1 is formed so as to penetrate the plural insulating layers 33 and the plural insulating layers 50, and one end of the contact plug CP1 is connected to the wiring layer D1 disposed between the semiconductor substrate 30 and the cell array area CA. Other structures are similar to those of the first embodiment described above.

1.5. Second Modification

Figure 15:
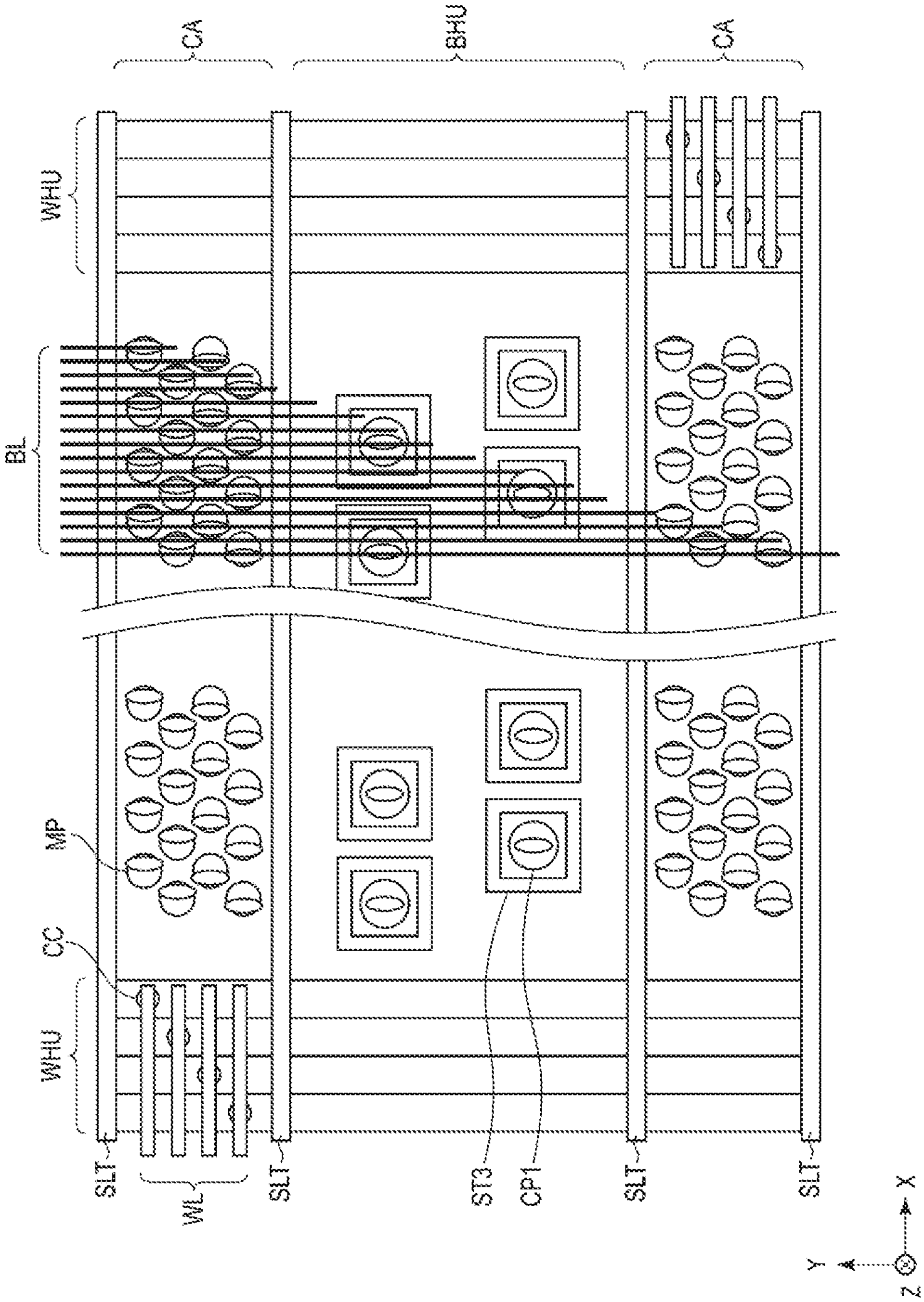
FIG. 15 is a view illustrating a planar structure according to a second modification of the first embodiment.

Next, a second modification of the first embodiment will be described with reference to FIG. 15. FIG. 15 illustrates a planar structure of a semiconductor storage device according to a second modification of the first embodiment, and represents cell array areas CA, word line hookup areas WHU and a bit line hookup area BHU.

Plural contact plugs CP1 and plural slits (or isolation areas) ST3 are formed in the bit line hookup area BHU. The slits ST3 are disposed around the respective contact plugs CP1 so as to surround the respective contact plugs CP1. The slits ST3 includes an insulating material, for example, an insulating layer in which at least one of a silicon oxide layer or an aluminum oxide layer is buried.

A stacked body including plural insulating layers 33 and plural conductive layers 34, 35_0 to 35_7 and 36 is disposed outside the slits ST3. A stacked body including plural insulating layers 33 and plural insulating layers 50 is disposed inside the slits ST3. That is, an area surrounded by the slits ST3 has the stacked body including the plural insulating layers 33 and the plural insulating layers 50. The slits ST3 extend in the Z direction and separate the stacked body outside the slits ST3 from the stacked body inside the slits ST3. The contact plugs CP1 extend the plural insulating layers 33 and the plural insulating layers 50 in the Z direction and reach the wiring layer D1 of the peripheral circuit layer PE.

That is, in the area surrounded by the slits ST3, the plural insulating layers 50 are not replaced by the conductive layers 35_0 to 35_7 and 36 as in the outside of the slits ST3, and the plural insulating layers 50 are arranged as they are. The contact plugs CP1 are formed so as to penetrate the plural insulating layers 33 and the plural insulating layers 50, and one end of each contact plug CP1 is connected to the wiring layer D1 interposed between the semiconductor substrate 30 and the cell array areas CA. Other structures are similar to those of the first embodiment described above.

1.4. Effects of First Embodiment

According to the first embodiment, it is possible to provide a semiconductor storage device capable of improving the reliability of operations such as write, read and erase.

Hereinafter, the effects of the first embodiment will be described in detail. For example, three-dimensional stacked type nonvolatile semiconductor storage device includes a stacked body including an insulating layer (e.g., a silicon oxide layer) and a conductive layer (e.g., a metal layer) serving as a word line, and a contact plug that penetrates the stacked body. The contact plug connects an upper layer wiring disposed above the stacked body and a lower layer wiring disposed under the stacked body or a wiring layer of a peripheral circuit formed under the stacked body. In such a structure, the withstand voltage may be deteriorated between the contact plug that penetrates the stacked body and the conductive layer.

Therefore, in the first embodiment, the stacked body in the area where the contact plug CP1 is formed has a stacked structure of the insulating layer (e.g., a silicon oxide layer) 33 and the insulating layer (e.g., a silicon nitride layer) 50. Thereby, the insulating layer 50 is interposed between the contact plug CP1 and the conductive layers 35_0 to 35_7 and 36. As a result, it is possible to improve the withstand voltage between the contact plug CP1 that penetrates the stacked body and the conductive layers 35_0 to 35_7 and 36.

Further, for example, in the process of manufacturing a three-dimensional stacked type nonvolatile semiconductor storage device, a hole is formed in a stacking direction for a stacked body including a silicon oxide layer and a silicon nitride layer, and a memory functional film is formed in the hole. Thereafter, plural grooves are formed, the silicon nitride layer is removed from the grooves, and a metal material is buried in a gap between the silicon oxide layers to form a word line WL. In such a manufacturing process, since the distance from the grooves is larger in the area where the contact plug penetrating the stacked body is formed than in the memory cell array area, defective removal of the silicon nitride layer, defective burial of the metal material, etc. may occur and a problem such as destruction of the silicon oxide layer may be caused by heat generated during the subsequent processes.

Therefore, in the first embodiment, in a process prior to the process of removing the insulating layer (e.g., a silicon nitride layer) 50 and burying the metal material in the gap between the insulating layers (e.g., silicon oxide layers) 33, the slits ST1 or ST2 and ST3 different from the slit SLT separating the conductor layers 35_0 to 35_7 and 36 are formed in the cell array area CA. The slits ST1 or ST2 and ST3 are disposed to separate the stacked body in the area where the memory pillar MP is formed and the stacked body in the area where the contact plug CP1 is formed or to surround the area where the contact plug CP1 is formed.

Thus, in the step of removing the insulating layer 50, an etching liquid may be blocked by the slits ST1 or ST2 and ST3, thereby preventing the etching liquid from reaching the insulating insulating layer 50 in the area where the contact plug CP1 is formed. Therefore, the insulating layer 50 in the area where the contact plug is formed is not removed but remains intact. Thereby, the insulating layer 50 is interposed between the contact plug CP1 and the conductive layers 35_0 to 35_7 and 36. As a result, it is possible to improve the withstand voltage between the contact plug CP1 that penetrates the stacked body and the conductive layers 35_0 to 35_7 and 36.

As described above, according to the semiconductor storage device f the first embodiment, it is possible to improve the reliability of operations such as write, read and erase.

2. Second Embodiment

Next, a semiconductor storage device according to a second embodiment will be described. In the second embodiment, a member including the same film as the memory pillar MP or the same member as a support pillar which is disposed in the word line hookup area WHU and supports the word line WL is used to separate the cell array area CA and the bit line hook up area BHU from each other. The circuit block configuration of the second embodiment is the same as that of the first embodiment. In the second embodiment, points different from the first embodiment will mainly be described.

2.1. Structure of Semiconductor Storage Device

Next, the structure of the semiconductor storage device of the second embodiment will be described.

2.1.1. Planar Structure of Semiconductor Storage Device

Figure 16:
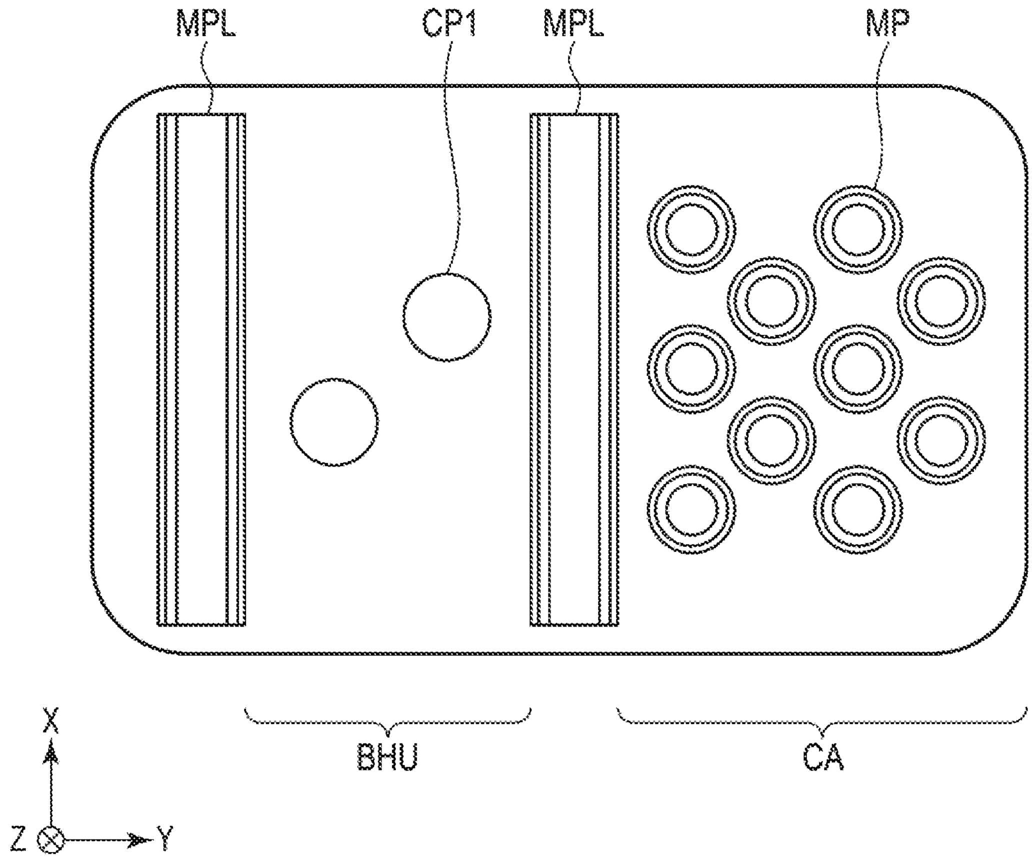
FIG. 16 is a view illustrating a planar structure of a semiconductor storage device according to a second embodiment.

Next, the planar structure of the semiconductor storage device according to the second embodiment will be described with reference to FIG. 16. FIG. 16 is a plan view of a cell array area CA and a bit line hookup area BHU in the semiconductor storage device according to the second embodiment.

As illustrated in FIG. 16, an isolation area MPL is formed between the cell array area CA and the bit line hookup area BHU. The isolation area MPL has a plate shape which extends in the X direction and the Z direction. The isolation area MPL isolates the cell array area CA and the bit line hookup area BHU from each other.

Memory pillars MP are arranged in a zigzag pattern in the cell array area CA. Plural contact plugs CP1 are arranged in the bit line hookup area BHU.

2.1.2. Cross-Sectional Structure of Semiconductor Storage Device

Figure 17:
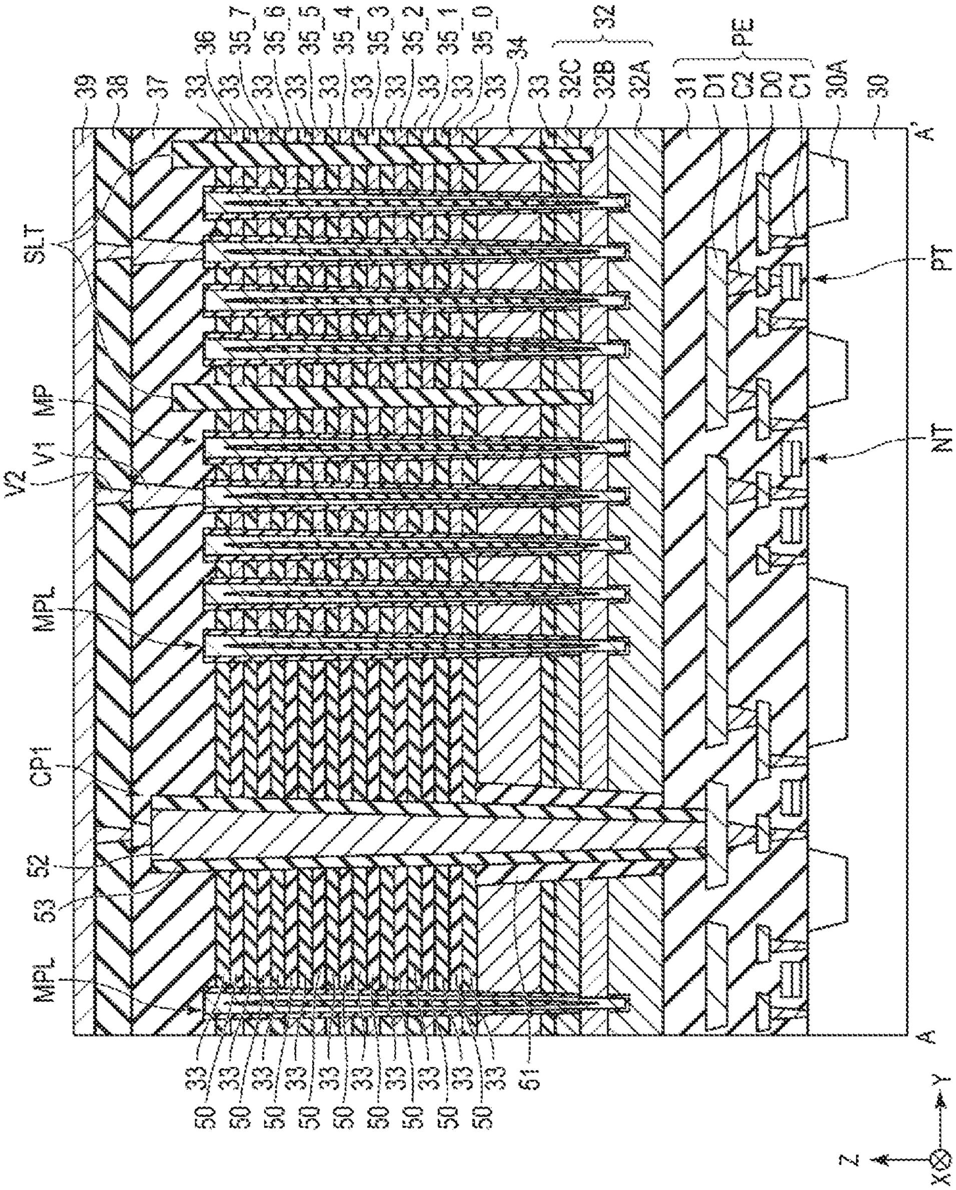
FIG. 17 is a cross-sectional view taken along line in the semiconductor storage device according to the second embodiment.

Next, the cross-sectional structure of the semiconductor storage device according to the second embodiment will be described with reference to FIG. 17. FIG. 17 is a cross-sectional view of the semiconductor storage device according to the second embodiment, and represents a section taken along a line corresponding to line A-A' in FIG. 4.

As illustrated in FIG. 17, the bit line hookup area BHU is sandwiched between isolation areas MPL. Each isolation area MPL has a plate shape which extends in the X direction and the Z direction. The isolation area MPL isolates a stacked body including plural insulating layers 33 and plural conductive layers 34, 35_0 to 35_7 and 36 in the cell array area CA, and a stacked body including plural insulating layers 33 and plural insulating layers 50 in the bit line hookup area BHU from each other. The height of the upper surface of the isolation area MPL is the same as the height of the upper surface of the memory pillars MP. That is, the height of the isolation area MPL from the semiconductor substrate surface is the same as the height of the memory pillars MP from the semiconductor substrate surface. The isolation area MPL is formed in the same process as the memory pillars MP and has a film of the same material.

In the bit line hookup area BHU, the insulating layer 33 is formed on a conductive layer 32, and the conductive layer 34 is formed on the insulating layer 33. A stacked body including the plural insulating layers 33 and the plural insulating layers 50 alternately stacked in the Z direction is formed on the conductive layer 34. An insulating layer 37 is formed on the uppermost insulating layer 33. Plural contact plugs CP1 are formed in the insulating layer 37, the plural insulating layers 33, the plural insulating layers 50, the conductive layers 34 and 32 and the insulating layer 31. Other structures are similar to those of the first embodiment described above.

2.2. Semiconductor Storage Device Manufacturing Method

Figure 18:
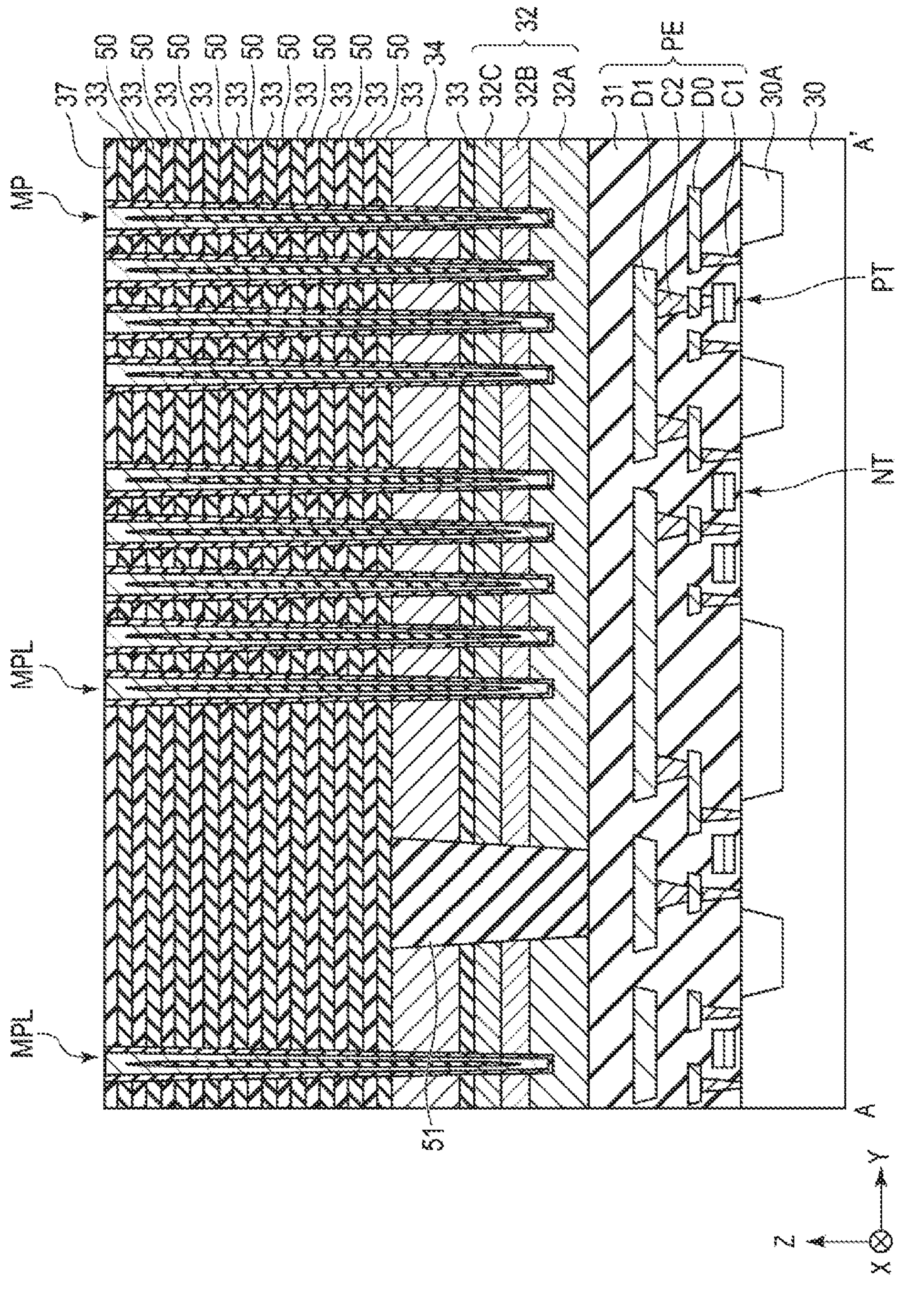
FIG. 18 is a cross-sectional view of a structure in the manufacturing process of the semiconductor storage device according to the second embodiment.
Figure 19:
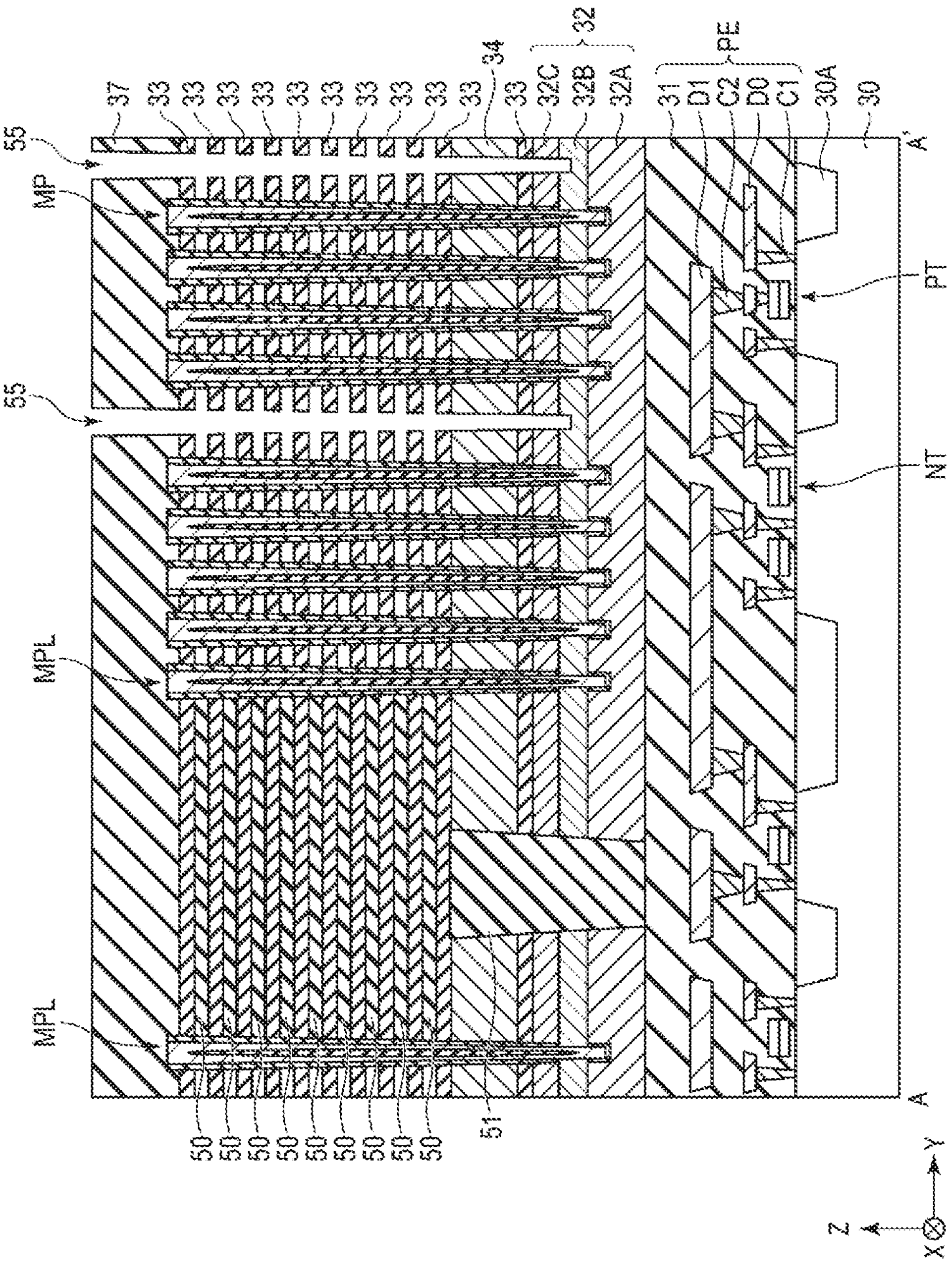
FIG. 19 is a cross-sectional view of a structure in the manufacturing process of the semiconductor storage device according to the second embodiment.

Next, a method of manufacturing the semiconductor storage device according to the second embodiment will be described. FIGS. 18 and 19 are cross-sectional views of a structure of each manufacturing process of the semiconductor storage device according to the second embodiment, which are taken along line A-A' (Y direction) in FIG. 4.

As illustrated in FIG. 18, together with formation of the memory pillars MP, the isolation area MPL is formed between the cell array area CA and the bit line hookup area BHU. Specifically, for example, a stacked body including the insulating layer 33, the conductive layer 34, the plural insulating layers 33 and the plural insulating layers 50 alternately stacked is formed on the conductive layer 32C by, for example, a CVP (or ALD) method. Subsequently, the memory pillars MP extending in the Z direction are formed in the stacked body and the conductive layers 32A, 32D and 32C, and the isolation area MPL extending in the Z direction is formed in the same manner. That is, the isolation area MPL is formed in the same process as the memory pillars MP. Therefore, the isolation area MPL has a film of the same material as the memory pillars MP.

Next, the insulating layer (e.g., a silicon nitride layer) 50 is replaced with the conductive layers (e.g., tungsten layers) 35_0 to 35_7 and 36, and a slit SLT that separates the conductive layers 35_0 to 35_7 and 36 is further formed. Further, the conductive layer (source line SL) 32 is connected to the memory pillars MP. Specifically, a groove 55 for the slit SLT is formed in the stacked body including the insulating layer 37, the plural insulating layers 33, the plural insulating layers 50, the conductive layer 34, the insulating layer 33 and the conductive layer 32 by, for example, a RIE method. Thereafter, as in the first embodiment, the conductive layer 32B is connected to the memory pillars MP. Further, in the cell array area CA, the insulating layer 50 is removed by wet etching using a phosphoric acid solution and is replaced with the conductive layers 35_0 to 35_7 and 36. Subsequently, an insulating material is buried in the groove 55 to form the slit SLT.

In the meantime, in the bit line hookup area BHU, in the process of removing the insulating layer (silicon nitride layer) 50 by wet etching using a phosphoric acid solution, the phosphoric acid solution is blocked by the isolation area MPL and does not reach the insulating layer 50 in the bit line hookup area BHU. Therefore, the insulating layer 50 in the bit line hookup area BHU is not removed but remains intact. That is the insulating layer 50 in the bit line hookup area BHU is not replaced with a conductive layer, and the bit line hookup area BHU maintains the stacked body including the plural insulating layers 33 and the plural insulating layers 50 as it is. The subsequent processes are the same as the manufacturing method of the first embodiment described above.

2.3. First Modification

Figure 20:
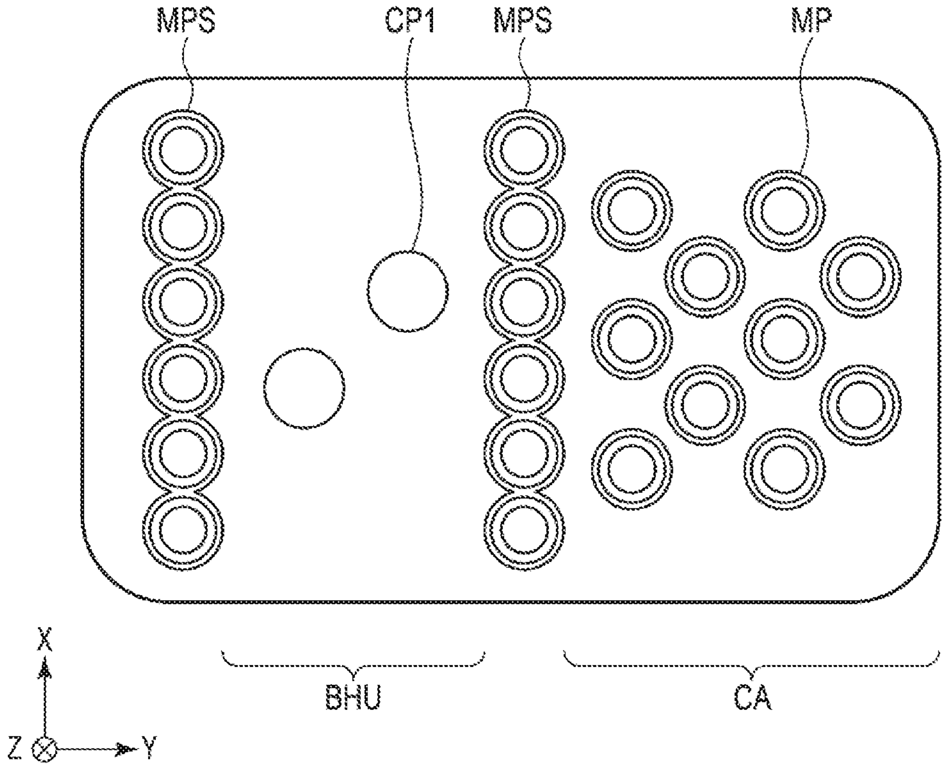
FIG. 20 is a view illustrating a planar structure according to a first modification of the second embodiment.

Next, a first modification of the second embodiment will be described with reference to FIG. 20. FIG. 20 is a plan view of a cell array area CA and a bit line hookup area BHU in a semiconductor storage device according to the first modification. In the first modification, points different from the second embodiment will mainly be described. This also applies to the subsequent modifications.

As illustrated in FIG. 20, an isolation area MPS is formed between the cell array area CA, and the bit line hookup area BHU. The isolation area MPS is composed of plural memory MP arranged continuously in the X direction. That is, the plural memory pillars MP extending in the Z direction are arrayed like beads in the X direction to form the isolation area MPS. The isolation area MPS is formed in the same process as the memory pillars MP and has a film of the same material.

The isolation area MPS isolates a stacked body including plural insulating layers 33 and plural conductive layers 34, 35_0 to 35_7 and 36 in the cell array area CA, and a stacked body including plural insulating layers 33 and plural insulating layers 50 in the bit line hookup area BHU from each other. The height of the upper surface of the isolation area MPS is the same as the height of the upper surface of the memory pillars MP arranged in the cell array area CA. That is, the height of the isolation area MPS from the semiconductor substrate surface is the same as the height of the memory pillars MP from the semiconductor substrate surface. Other structures are similar to those of the second embodiment described above.

2.4. Second Modification

Figure 21:
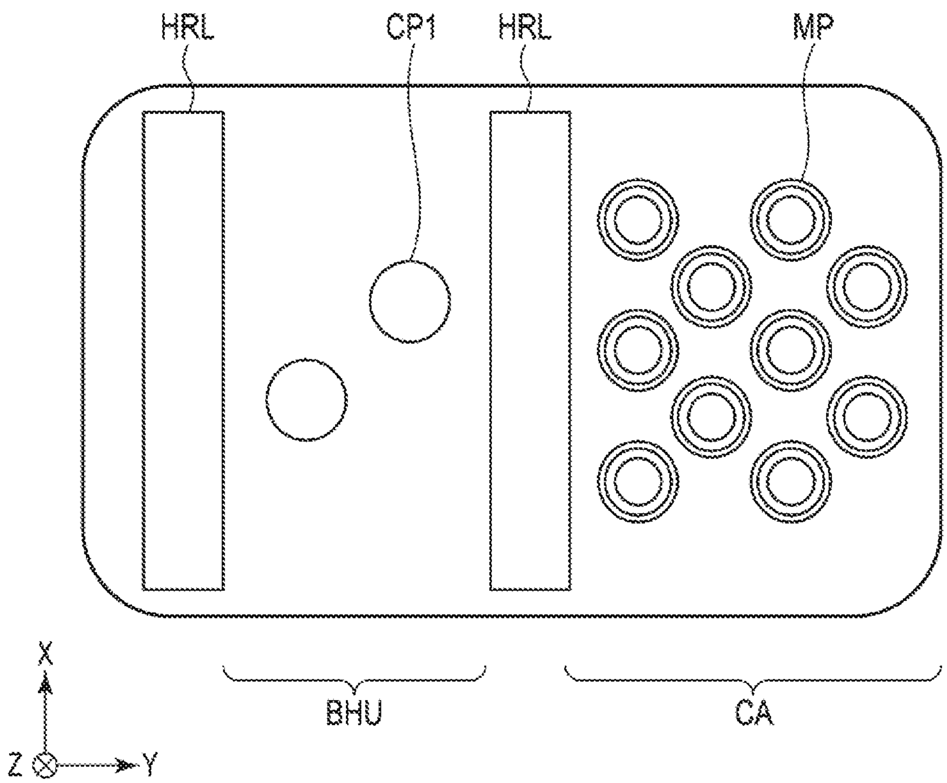
FIG. 21 is a view illustrating a planar structure according to a second modification of the second embodiment.

Next, a second modification of the second embodiment will be described with reference to FIG. 21. FIG. 21 is a plan view of a cell array area CA and a bit line hookup area BHU in a semiconductor storage device according to the second modification.

As illustrated in FIG. 21, an isolation area HRL is formed between the cell array area CA and the bit line hookup area BHU. The isolation area HRL has a plate shape extending in the X direction and the Z direction. The isolation area HRL is formed in the same process as a support pillar disposed in the word line hookup area WHU and has the same material layer. The support pillar is disposed in the word line hookup area WHU to prevent the stacked insulating layer 33 from collapsing. The isolation area HRL and the supporting pillar include, for example, a silicon oxide layer.

The isolation area HRL isolates a stacked body including plural insulating layers 33 and plural conductive layers 34, 35_0 to 35_7 and 36 in the cell array area CA, and a stacked body including plural insulating layers 33 and plural insulating layers 50 in the bit line hookup area BHU from each other. The height of the upper surface of the isolation area HRL is the same as the height of the upper surface of the support pillar disposed in the word line hookup area WHU. Other structures are similar to those of the second embodiment described above.

2.5. Third Modification

Figure 22:
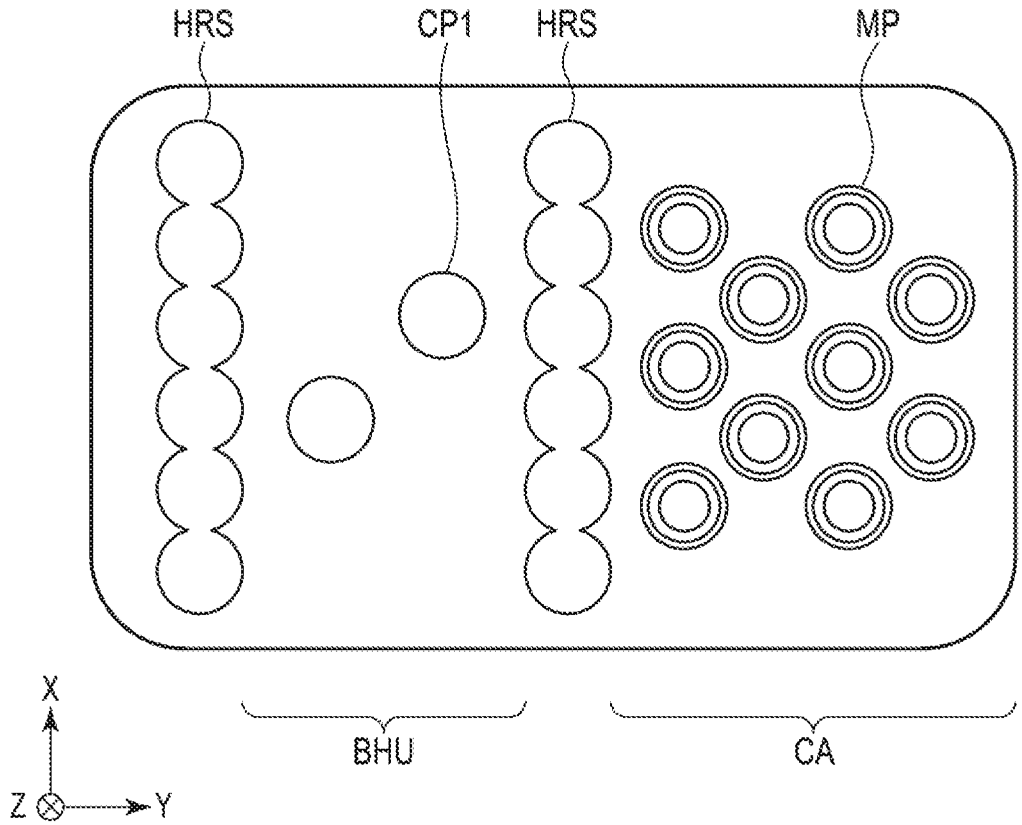
FIG. 22 is a view illustrating a planar structure according to a third modification of the second embodiment.

Next, a third modification of the second embodiment will be described with reference to FIG. 22. FIG. 22 is a plan view of a cell array area CA and a bit line hookup area BHU in a semiconductor storage device according to the third modification.

As illustrated in FIG. 22, an isolation area HRS is formed between the cell array area CA and the bit line hookup area BHU. The isolation area HRS is composed of plural pillar portions made of an insulating material (hereinafter, referred to as insulating pillars) continuously arranged in the X direction. That is, the plural insulating pillars extending in the Z direction are arrayed like beads in the X direction to form the isolation area HRS. The insulating pillars have a columnar shape extending in the Z direction. Similarly, the isolation area HRS is formed in the same process as a support pillar disposed in the word line hookup area WHU and has the same material layer. The isolation area HRS including the insulating pillars includes, for example, a silicon oxide layer.

The isolation area HRS isolates a stacked body including plural insulating, layers 33 and plural conductive layers 34, 35_0 to 35_7 and 36 in the cell array area CA, and a stacked body including plural insulating layers 33 and plural insulating layers 50 in the bit line hookup area BHU from each other. The height of the upper surface of the isolation area HRS is the same as the height of the upper surface of the support pillar disposed in the bit line hookup area BHU. Other structures are the same as those of the second embodiment and the third modification described above.

2.6. Effects of Second Embodiment

In the second embodiment, the isolation area MPL, MPS, HRL or HRS is formed between the stacked body of the cell array area an, where the memory pillar MP is formed and the stacked body of the bit line hookup area BHU where the contact plug CP1 is formed. As a result, the stacked body of the cell array area CA and the stacked body of the bit line hookup area BHU are isolated from each other.

In this way, by isolating the stacked body in the area where the memory pillar MP is formed and the stacked body in the area where the contact plug CP1 is formed from each other, the stacked body in the area of the contact plug CP1 may have a stacked structure of the insulating layer (e.g., a silicon oxide layer) 33 and the insulating layer (e.g., a silicon nitride layer) 50. Thereby, the insulating layer 50 is interposed between the contact plug CP1 and the conductive layers 35_0 to 35_7 and 36. As a result, it is possible to improve the withstand voltage between the contact plug CP1 penetrating the stacked body and the conductive layers 35_0 to 35_7 and 36. Moreover, it is possible to improve the reliability of operations such as write, read and erase in the semiconductor storage device.

Further, in the process of forming the memory pillar MP in the cell array area CA, the isolation area MPL or MPS is formed between the cell array area CA and the bit line hookup area BHU. Furthermore, in the process of forming the support pillar in the word line hookup area WHU, the isolation area HRL or HRS is formed between the cell array area CA and the bit line hookup area BHU. Therefore, there is no need to provide a new process of forming the isolation area MPL, MPS, HRL or HRS. Accordingly, in the second embodiment, it is possible to prevent an increase in manufacturing costs without adding a new process in order to manufacture a semiconductor storage device.

3. Third Embodiment

Next, a semiconductor storage device according to a third embodiment will be described. In the third embodiment, an insulating layer 50 is left in the vicinity of the contact plug CP1 in the process of removing the plural insulating layers 50 and replacing the insulating layers 50 with the conductive layers 35_0 to 35_7 and 36, thereby improving the withstand voltage between the contact plug and the conductive layer. The circuit block configuration of the third embodiment is the same as that of the first embodiment. In the third embodiment, points different from the first embodiment will mainly be described.

3.1. Structure of Semiconductor Storage Device

Hereinafter, the structure of the semiconductor storage device according to the third embodiment will be described.

3.1.1. Planar Structure of Semiconductor Storage Device

Figure 23:
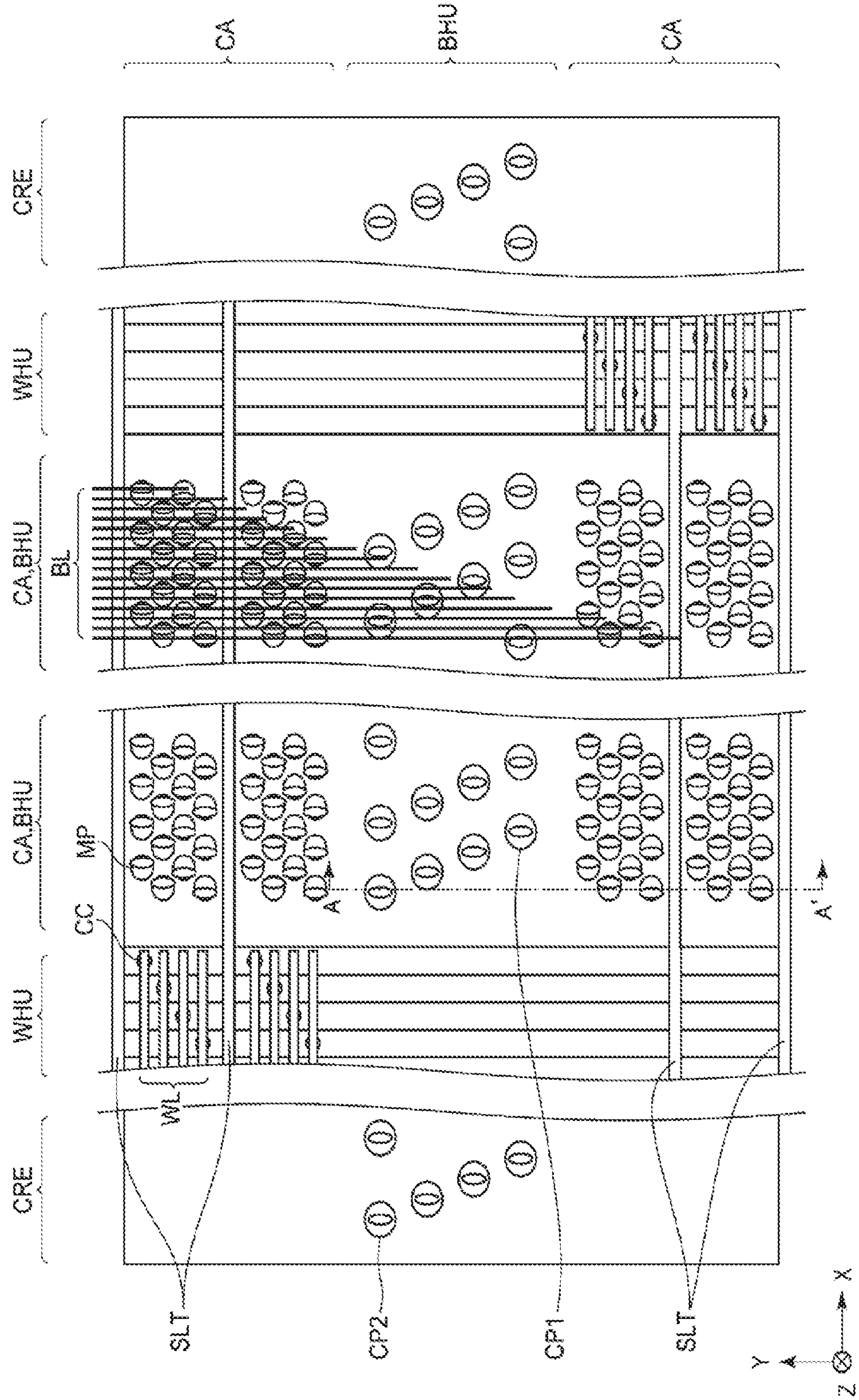
FIG. 23 is a view illustrating a planar structure of a semiconductor storage device accord a third embodiment.

Next, the planar structure of the semiconductor storage device according to the third embodiment will be described with reference to FIG. 23. FIG. 23 is a plan view schematically illustrating the planar structure of the semiconductor storage device according to the third embodiment. In the planar structure of the semiconductor storage device according to the third embodiment, a slit ST1 is not formed between the cell array area CA and the bit line hookup area BHU in the planar structure of the first embodiment illustrated in FIG. 4. Other structures are the same as the planar structure illustrated in FIG. 4.

3.1.2. Cross-Sectional Structure of Semiconductor Storage Device

Figure 24:
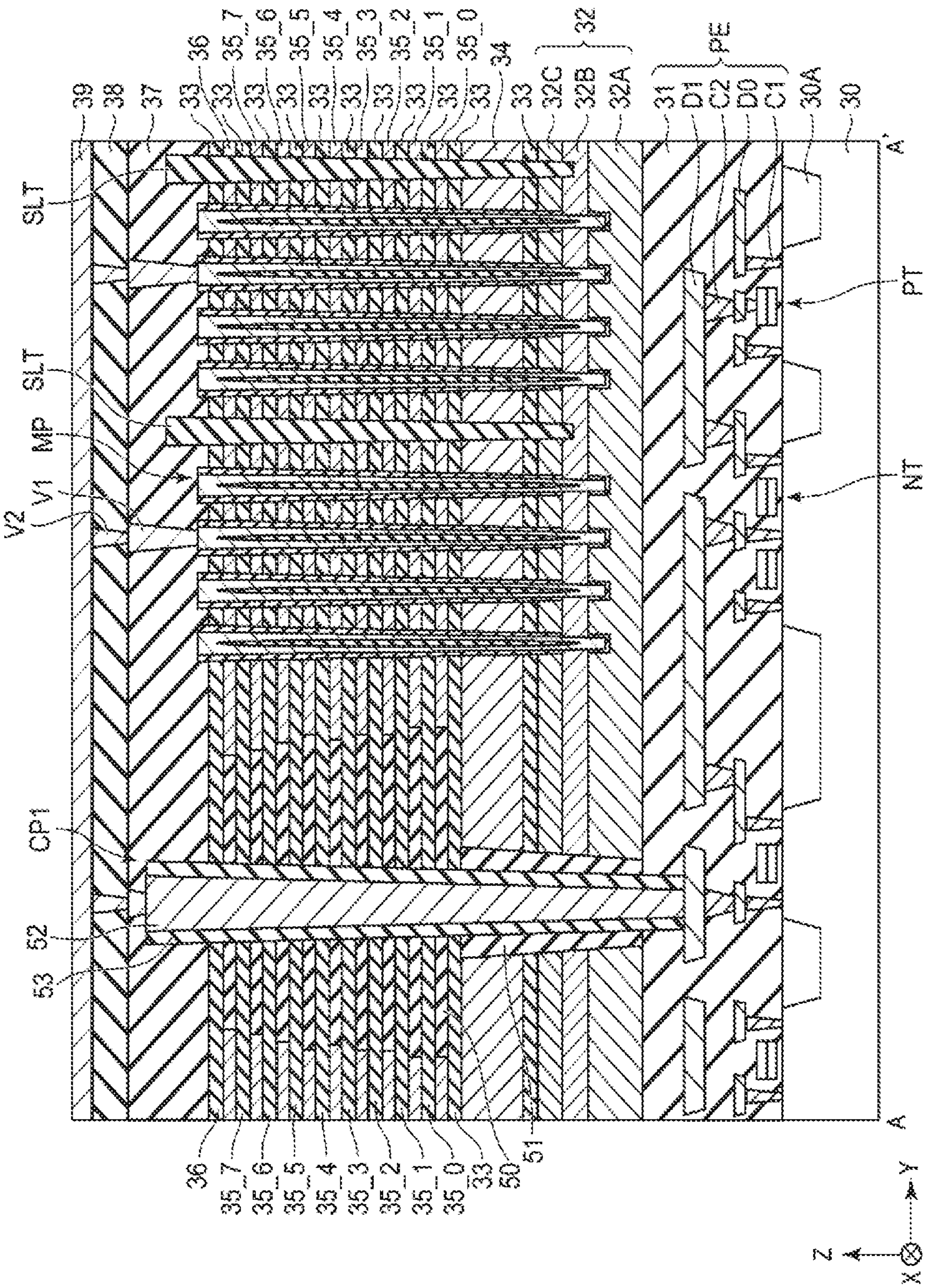
FIG. 24 a cross-sectional view taken along line A-A' in the semiconductor storage device according to the third embodiment.

Next, the cross-sectional structure of the semiconductor storage device according to the third embodiment will be described with reference to FIG. 24. FIG. 24 is a cross-sectional view taken along line A-A' in FIG. 23 in the semiconductor storage device according to the third embodiment.

In the cross-sectional structure of the semiconductor storage device according to the third embodiment, as illustrated in FIG. 24, a slit ST1 is not formed between the cell array area CA and the bit line hookup area BHU the cross-sectional structure of the first embodiment illustrated in FIG. 5.

Further, a conductive layer extending from the cell array area extends to the bit line hookup area BHU beyond a boundary between the cell array area CA and the bit line hookup area BHU. In other words, an insulating layer 50 is interposed between the contact plug CP1 and the conductive layers 35_0 to 35_7 and 36. The length of the insulating layer 50 in the Y direction is a length sufficient to improve the withstand voltage between the contact plug CP1 and the conductive layers 35_0 to 35_7 and 36. Other structures are the same as those of the first embodiment described above.

3.2. Semiconductor Storage Device Manufacturing Method

Figure 25:
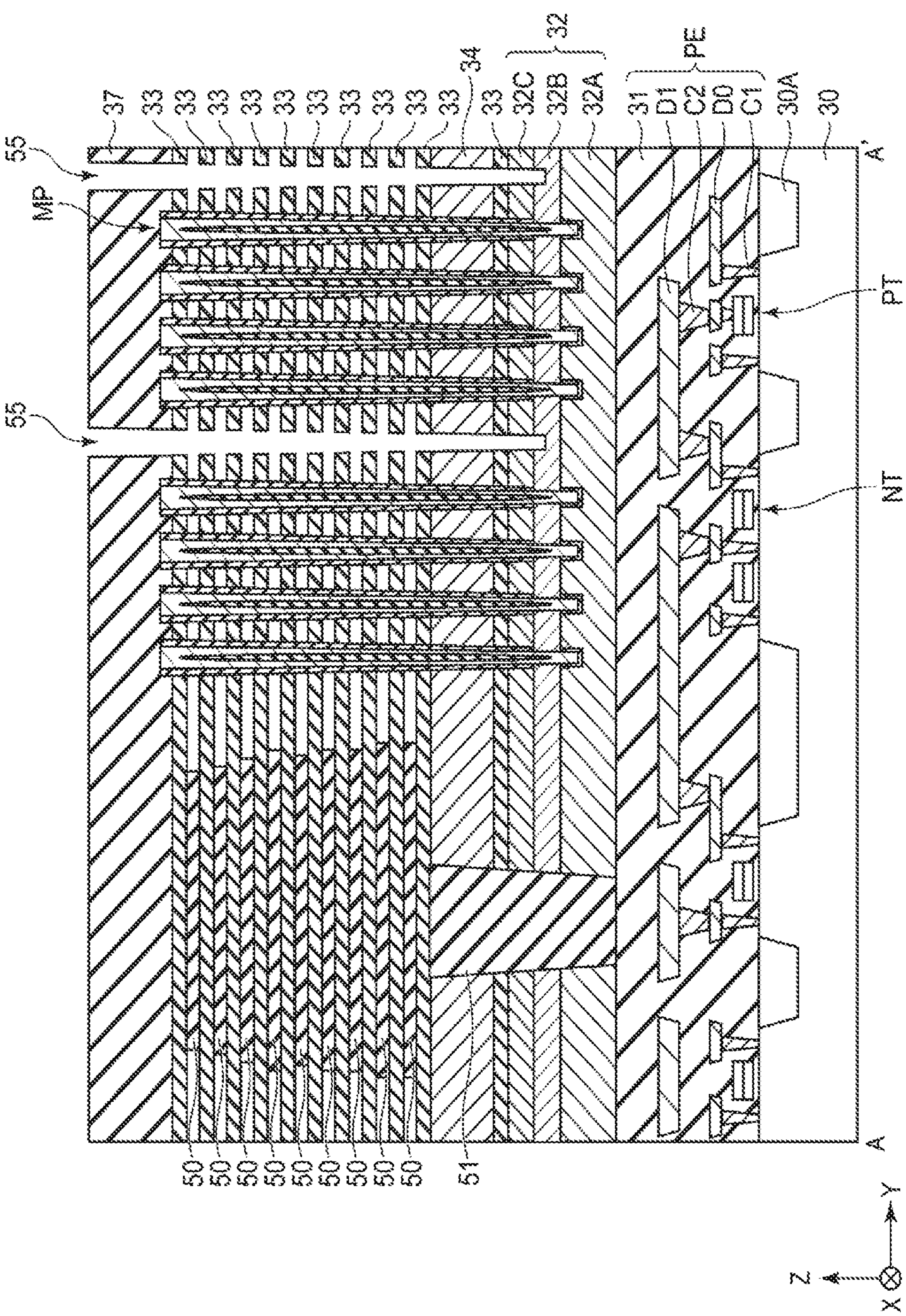
FIG. 25 is a cross-sectional view of a structure in a manufacturing process of semiconductor storage device according to the third embodiment.

Next, a method of manufacturing the semiconductor storage device according to the third embodiment will be described. FIG. 25 is a cross-sectional view of a structure in a manufacturing process of the semiconductor storage device according to the third embodiment, and represents a section taken along line. A-A' (Y direction) in FIG. 23.

After forming the memory pillars MP in the stacked body and the conductive layers 32A, 32D and 32C, the insulating layer (e.g., silicon nitride layer) 50 is replaced with the conductive layers (e.g., tungsten layers) 35_0 to 35_7 and 36. Specifically, as illustrated in FIG. 25, a groove 55 for the slit SLT is formed in a stacked body including the insulating layer 37, the plural insulating layers 33, the plural insulating layers 50, the conductive layer 34, the insulating layer 33 and the conductive layer 32 by, for example, a RIE method. Subsequently, as in the first embodiment, conductive layer 32B is connected to the memory pillars MP.

Thereafter, the insulating layers 50 are removed by wet etching using a phosphoric acid solution and are replaced with the conductive layers 35_0 to 55_7 and 36. In the process of removing the insulating layer 50, the length (or position) of the insulating layers 50 to be removed is controlled under wet etching conditions. Specifically, in the removing process of the insulating layer 50, the insulating layers 50 in the cell array area CA are removed, while leaving an insulating layer 50 within a predetermined distance from the contact plug CP1. The subsequent processes are the same as the manufacturing method of the first embodiment described above.

3.3. Effects of Third Embodiment

In the third embodiment, in the process of removing the plural insulating layers 50 and replacing them with the conductive layers 35_0 to 35_7 and 36, an insulating layer 50 around the contact plug CP1 is left without being removed and is not replaced with the conductive layers 35_0 to 35_7 and 36. Thus, the insulating layer 50 is interposed between the contact plug CP1 and the conductive layers 35_0 to 35_7 and 36. As a result, it is possible to improve the withstand voltage between the contact plug CP1 and the conductive layers 35_0 to 35_7 and 36 and further to improve the reliability or operations such as write, read and erase in the semiconductor storage device.

4. Fourth Embodiment

Next, a semiconductor storage device according to a fourth embodiment will be described. In the fourth embodiment, layer of the same material as an area where the contact plug CP2 is formed is previously formed in an area where the contact plug CP1 is formed, and the contact plugs CP1 and CP2 are formed by simultaneous processing. The circuit block configuration of the fourth embodiment is the same as that of the first embodiment. In the fourth embodiment, points different from the first embodiment will mainly be described.

4.1. Structure of Semiconductor Storage Device

The structure of the semiconductor storage device according to the fourth embodiment will be described below. The planar structure of the semiconductor storage device according to the fourth embodiment is the same as that of the first embodiment illustrated in FIG. 4

4.1.1. Cross-Sectional Structure of Semiconductor Storage Device

Figure 26:
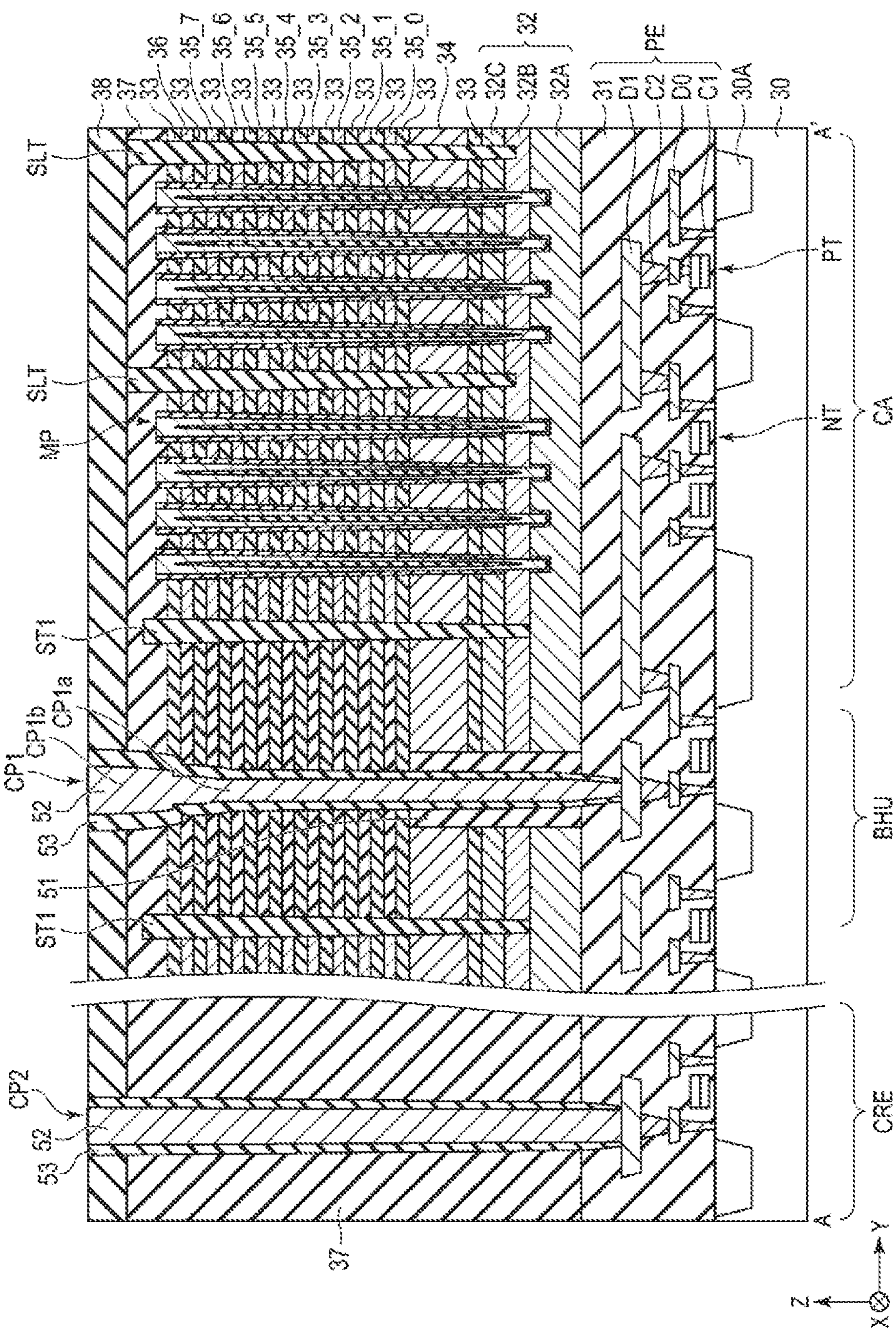
FIG. 26 is a view illustrating a cross-sectional structure of a semiconductor storage device according to a fourth embodiment.

Next, the cross-sectional structure of the semiconductor storage device according to the fourth embodiment will be described with reference to FIG. 26. FIG. 26 is a cross-sectional view taken along the Y direction of a cell array area CA, a bit line hookup area BHU and a contact area CRE in FIG. 4. The vias V1 and V2 and the conductive layer 39 are not illustrated in FIG. 26.

As illustrated in FIG. 26, the cross-sectional structure of the cell array area CA is the same as that of the first embodiment illustrated in FIG. 5.

In the bit line hookup area BHU, the structure of the contact plug CP1 is different from that of the first embodiment, and other structures are the same as those of the first embodiment. The contact plug CP1 illustrated in FIG. 26 extends in the Z direction and reaches the wiring layer D1 from the upper surface of the insulating layer 38. That is, the contact plug CP1 is formed so as to penetrate the insulating layers 38 and 37, the plural insulating layers 33, the plural insulating layers 50, the conductive layers 34 and 32 and the insulating layer 31 in the stacking direction, and is connected to the wiring layer D1.

The contact plug CP1 includes a plug portion CP1*a* on the lower side (or the substrate side) from the conductive layer 36 and a plug portion CP1*b* on the upper side (or the bit line side) than the conductive layer 36. The plug portion CP1*a* and the plug portion CP1*b* do not coincide in the center position in the direction perpendicular to the Z direction (on the XY plane). In other words, in the direction perpendicular to the Z direction, the central axis of the plug portion CP1*b* is deviated from the central axis of the plug portion CP1*a*. The boundary between the plug portion CP1*a* and the plug portion CP1*b* is not limited to the above description and may be changed in the Z direction.

In the contact area CRE, the peripheral circuit layer PE is formed on the semiconductor substrate 30, and the insulating layer 37 is formed on the peripheral circuit layer PE. Furthermore, the insulating layer 38 is formed on the insulating layer 37.

The contact plug CP2 extends in the Z direction and reaches the wiring layer D1 from the upper surface of the insulating layer 38. That is, the contact plug CP2 is formed so as to penetrate the insulating layers 38 and 37, the plural insulating layers 33, the plural insulating layers 50, the conductive layers 34 and 32 and the insulating layer 31 in the stacking direction, and is connected to the wiring layer D1. The contact plug CP2 is not divided into the plug portion CP1*a* and the plug portion CP1*b*, unlike the contact plug CP1.

4.2. Semiconductor Storage Device Manufacturing Method

Next, a method of manufacturing the semiconductor storage device according to the fourth embodiment will be described. FIGS. 27 to 32 are cross-sectional views of a structure in a manufacturing process of the semiconductor storage device according to the fourth embodiment, and represents a section taken along the Y direction of the cell array area CA, the bit line hookup area BHU and the contact area CRE.

Figure 27:
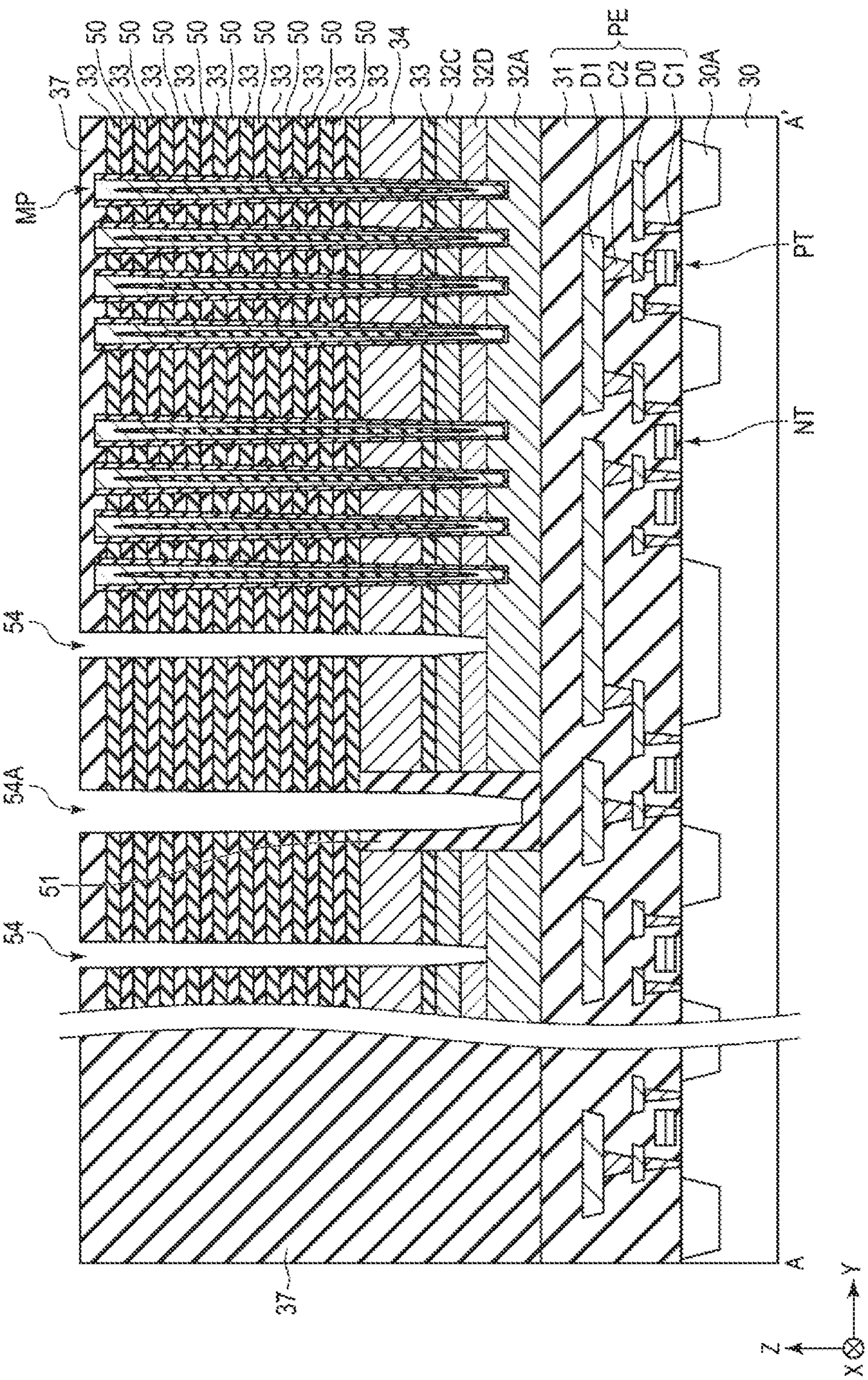
FIG. 27 is a cross-sectional view of a structure in a manufacturing process of the semiconductor storage device according to the fourth embodiment.
Figure 28:
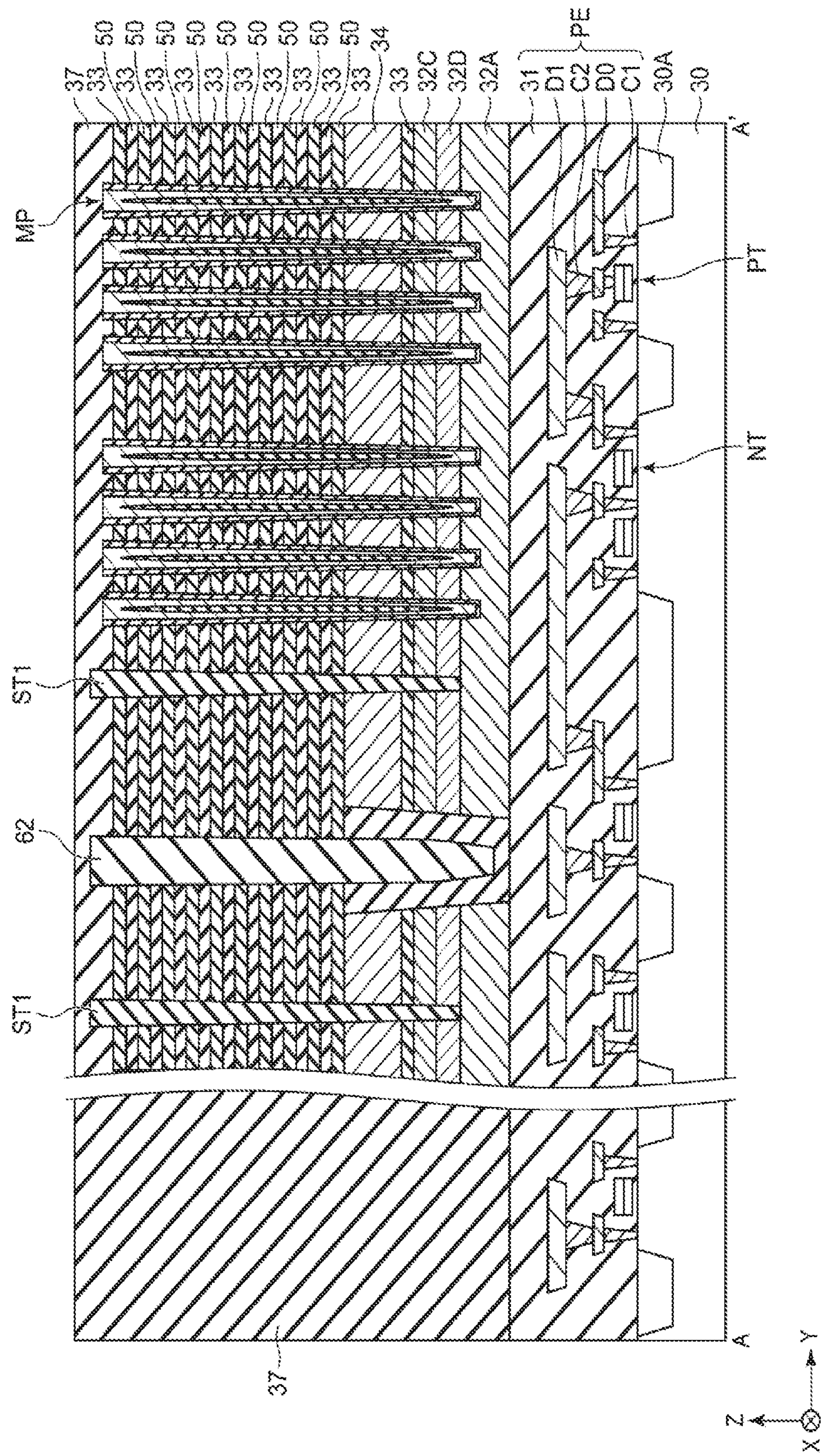
FIG. 28 is a cross-sectional view of a structure in a manufacturing process of the semiconductor storage device according to the fourth embodiment.

First, after forming the memory pillars MP, as illustrated in FIGS. 27 and 28, an insulating layer 62 having an equivalent shape (e.g., a pillar body) to the contact plug CP1 is formed in the formation area of the contact plug CP1 together with the slit ST1. Specifically, as illustrated in FIG. 27, a groove 54 for the slit ST1 extending in the X direction and the Z direction is formed in the insulating layer 37, the plural insulating layers 33 and the plural insulating layers 50 between the cell array area CA and the bit line hookup area BHU by, for example, a RIE method. Simultaneously with formation of the groove 54 for the slit ST1, a hole 54A is formed in an area where the contact plug CP1 is to be formed.

Subsequently, as illustrated in FIG. 28, an insulating material, for example, a silicon oxide layer, is buried in the groove 54 and the hole 54A by, for example, a CAM (or ALD) method. As a result, the slit ST1 is formed between the cell array area CA and the bit line hookup area BHU, and the insulating layer 62 is formed in the hole 54A.

Figure 29:
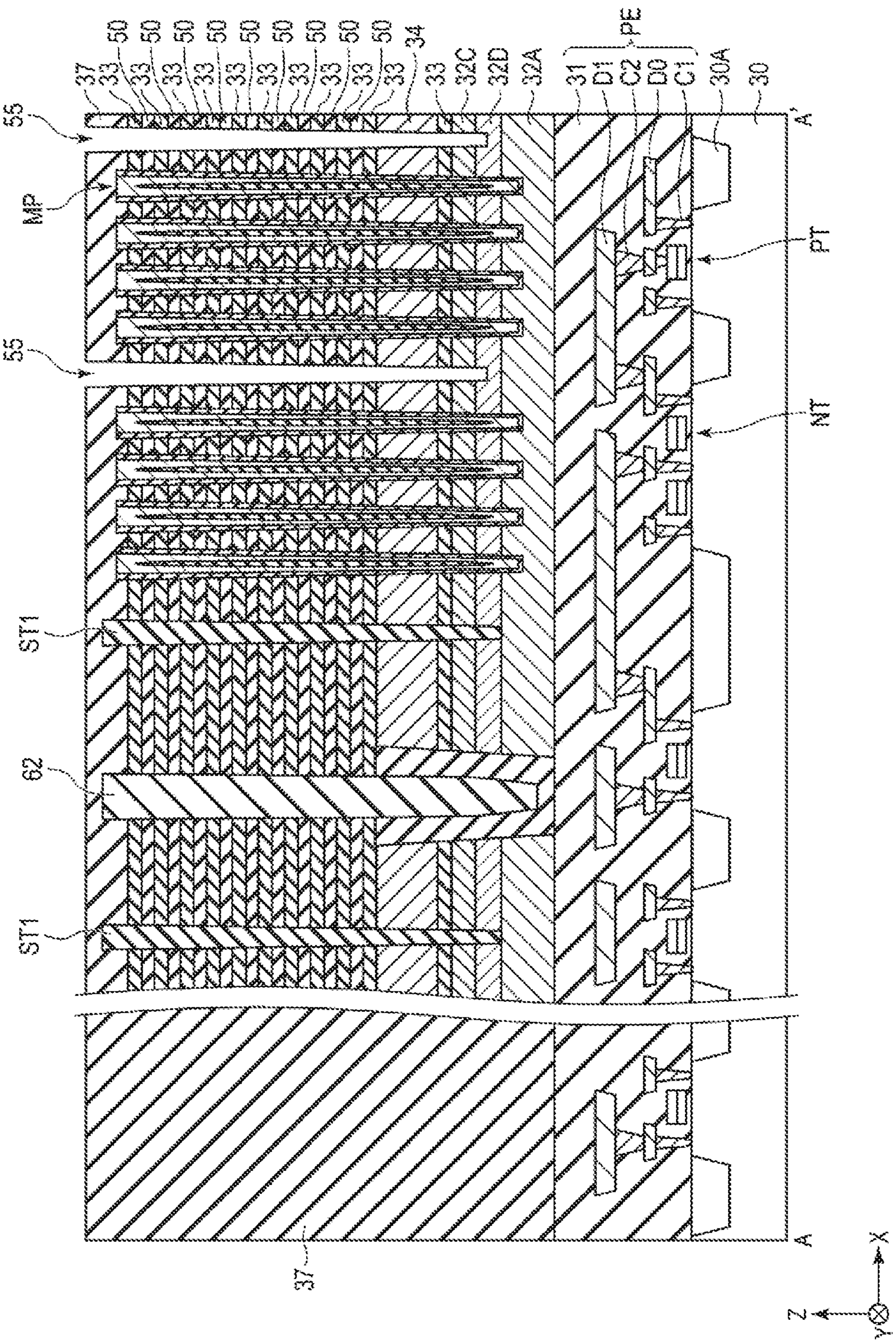
FIG. 29 is a cross-sectional view of a structure in a manufacturing process of the semiconductor storage device according to the fourth embodiment.
Figure 30:
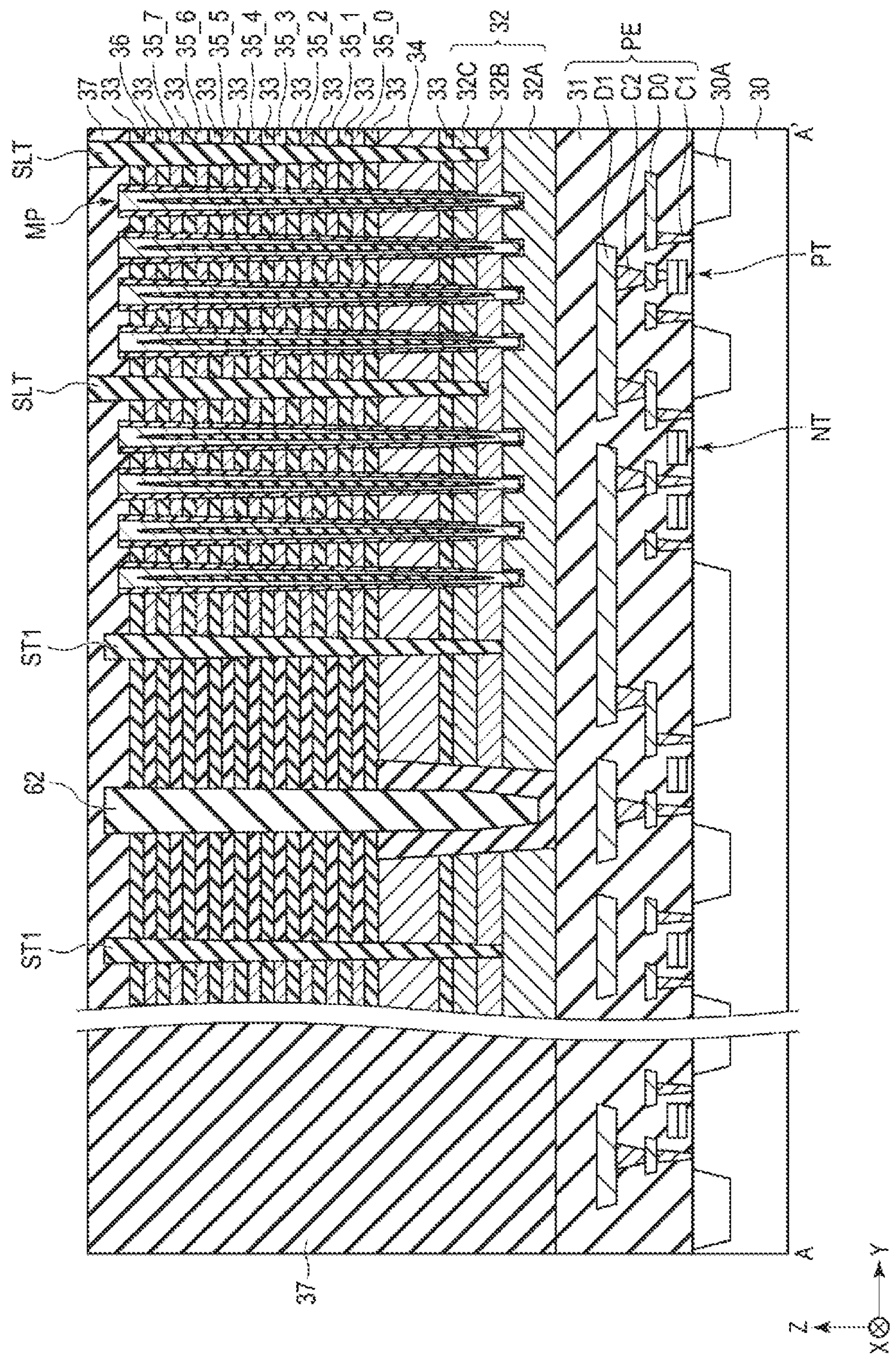
FIG. 30 is a cross-sectional view of a structure in a manufacturing process of the semiconductor storage device according to the fourth embodiment.

Next, as illustrated in FIGS. 29 and 30, the insulating layers (e.g., silicon nitride layers) 50 are replaced with the conductive layers (e.g., tungsten layers) 35_0 to 35_7 and 36, and a slit SLT that separates the conductive layers 35_0 to 35_7 and 36 is further formed. Further, the conductive layer (source line SL) 32 is connected to the memory pillars MP. Specifically, a groove 55 for the slit SLT is formed in the stacked body including the insulating layer 37, the plural insulating layers 33, the plural insulating layers 50, the conductive layer 34, the insulating layer 33 and the conductive layer 32 by, for example, a RIE method. Thereafter, as in the first embodiment, the conductive layer 32B is connected to the memory pillars MP. Further, in the cell array area CA, the insulating layer 50 is removed by wet etching using a phosphoric acid solution and is replaced with the conductive layers 35_0 to 35_7 and 36. Subsequently, an insulating material, for example, a silicon oxide layer, is buried in the groove 55 to form the slit SLT.

In the meantime, in the bit line hookup area BHU, in the process of removing the insulating layer (silicon nitride layer) 50 by wet etching using a phosphoric acid solution, the phosphoric acid solution is blocked by the slit ST1 and the insulating layer 50 in the bit line hookup area BHU is not removed but remains intact. That is, the stacked body of the plural insulating layers 33 and the plural insulating layers 50 is maintained in the bit line hookup area BHU.

Figure 31:
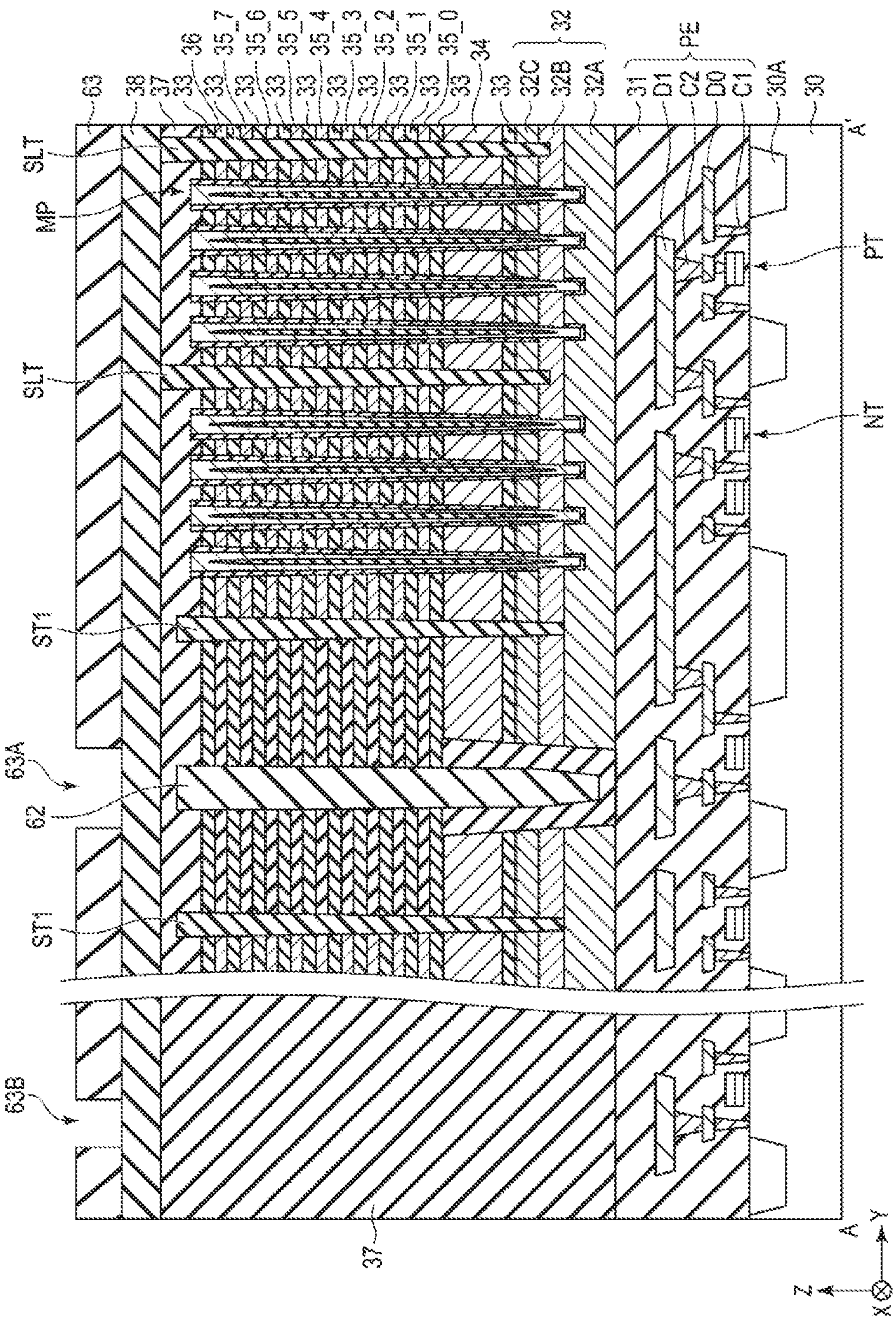
FIG. 31 is a cross-sectional view of a structure in a manufacturing process of the semiconductor storage device according to the fourth embodiment.
Figure 32:
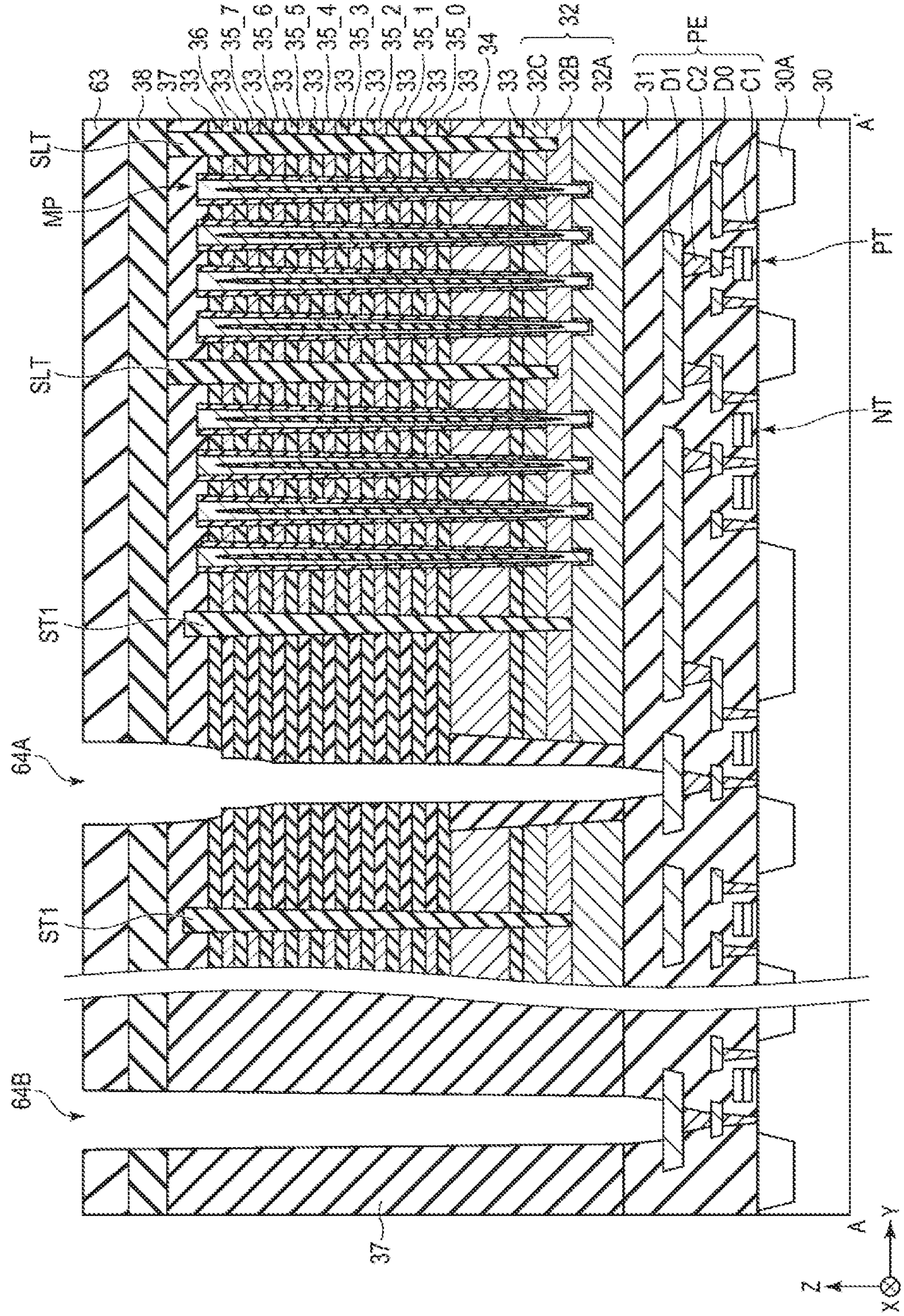
FIG. 32 is a cross-sectional view of a structure in a manufacturing process of the semiconductor storage device according to the fourth embodiment.

Next, as illustrated in FIGS. 31 and 32, holes for the contact plug CP1 and the contact plug CP2 are formed. Specifically, as illustrated in FIG. 31, a resist layer 63 having openings 63A and 633 is formed. The opening 63A is to form a hole 64A for the contact plug CP1 and is disposed above the area where the contact plug CP1 is to be formed. The opening 63B is to form a hole 64B for the contact plug CP2 and is disposed above the area where the contact plug CP2 is to be formed.

Subsequently, as illustrated in FIG. 32, in the bit line hookup area BHU, the hole 64A for the contact plug CP1 extending in the Z direction is formed in the insulating layers 38 and 37, the plural insulating layers 33, the plural insulating layers 50 and the insulating layer 51 by, for example a RIE method. Along with the formation of the hole 64A, in the contact area CRE the hole 64B for the contact plug CP2 extending in the Z direction is formed in the insulating layers 38 and 37.

Next, as illustrated in FIG. 26, the insulating layer 53 and the conductive layer 52 are formed in the hole 64A for the contact plug CP1 and the hole 643 for the contact plug CP2, and the contact plug CP1 and the contact plug CP2 are formed by simultaneous processing. Specifically, the insulating layer 53 is formed on the inner walls of the holes 64A and 64B for the contact plugs CP1 and CP2 by, for example, a CVD (or ALD) method, and the conductive layer 52 is further buried in the insulating layer 53. Thereby, the contact plug CP1 is formed in the bit line hookup area BHU and the contact plug CP2 is formed in the contact area CRE. Thus, the manufacture of the semiconductor storage device according to the fourth embodiment is completed.

4.3. Effects of Fourth Embodiment

In the fourth embodiment, is possible to simultaneously form the contact plug CP1 formed in the area where the insulating layer (e.g., silicon oxide layer) 3 and the insulating layer (e.g., a silicon nitride layer) 50 are stacked and the contact plug CP2 formed in the area of the insulating layer (e.g., silicon oxide layer) 37. As a result, it is possible to simplify the manufacturing process and hence reduce the manufacturing costs.

Hereinafter, the effects of the fourth embodiment will be described in detail. For example, a three-dimensional stacked type nonvolatile semiconductor storage device may include a contact plug which penetrates a stacked body including an insulating layer (e.g., silicon oxide layer) and an insulating layer (e.g., a silicon nitride layer) or a conductive layer (e.g., a metal layer) and a contact plug which penetrates only the insulating layer (e.g., a oxide layer). These contact plugs connect, for example, the upper layer wiring disposed above the stacked body, the lower wiring disposed under the stacked body, or a wiring layer of a peripheral circuit formed under the stacked body. With such a structure, it is difficult to simultaneously form the contact plug penetrating the stacked body and the contact plug penetrating only the insulating layer, which may result in increase of the manufacturing costs.

Therefore, in the fourth embodiment, an insulating layer (silicon oxide layer) of the same insulating material as the area where the contact plug penetrating only the insulting layer (e.g., a silicon oxide layer) is to be formed is formed in advance at a position where the contact plug CP1 penetrating the stacked body is to be formed. As a result, since the layer structures in the processing direction of the holes when forming the holes for the contact plugs CP1 and CP2 may be made the same, the hole for the contact plug CP1 and the hole for the contact plug CP2 may be formed simultaneously in the same process. Further, the burial of insulators in the holes for the contact plug CP1 and the contact plug CP2 may also be performed simultaneously in the same process. As a result, it is possible to simplify the manufacturing process and hence reduce the manufacturing costs. Other effects are the same as those of the first embodiment described above.

5. Fifth Embodiment

Next, a semiconductor storage device according to a fifth embodiment will be described. In the fifth embodiment, a contact plug CP3 formed in the contact area CRI and a contact plug CP2 formed in the contact area CRE illustrated in FIG. 3 are taken as an example. The insulating layer 50 around the contact plug CP3 is replaced with the same insulating material (e.g., a silicon oxide layer) as the insulating layer around the contact plug CP2, and the contact plugs CP2 and CP3 are formed by simultaneous processing. The circuit block configuration of the fifth embodiment is the same as that of the first embodiment. In the fifth embodiment, points different from the first embodiment will mainly be described.

5.1. Structure of Semiconductor Storage Device

Next, the structure of the semiconductor storage device according to the fifth embodiment will be described.

5.1.1. Planar Structure of Semiconductor Storage Device

Figure 33A:
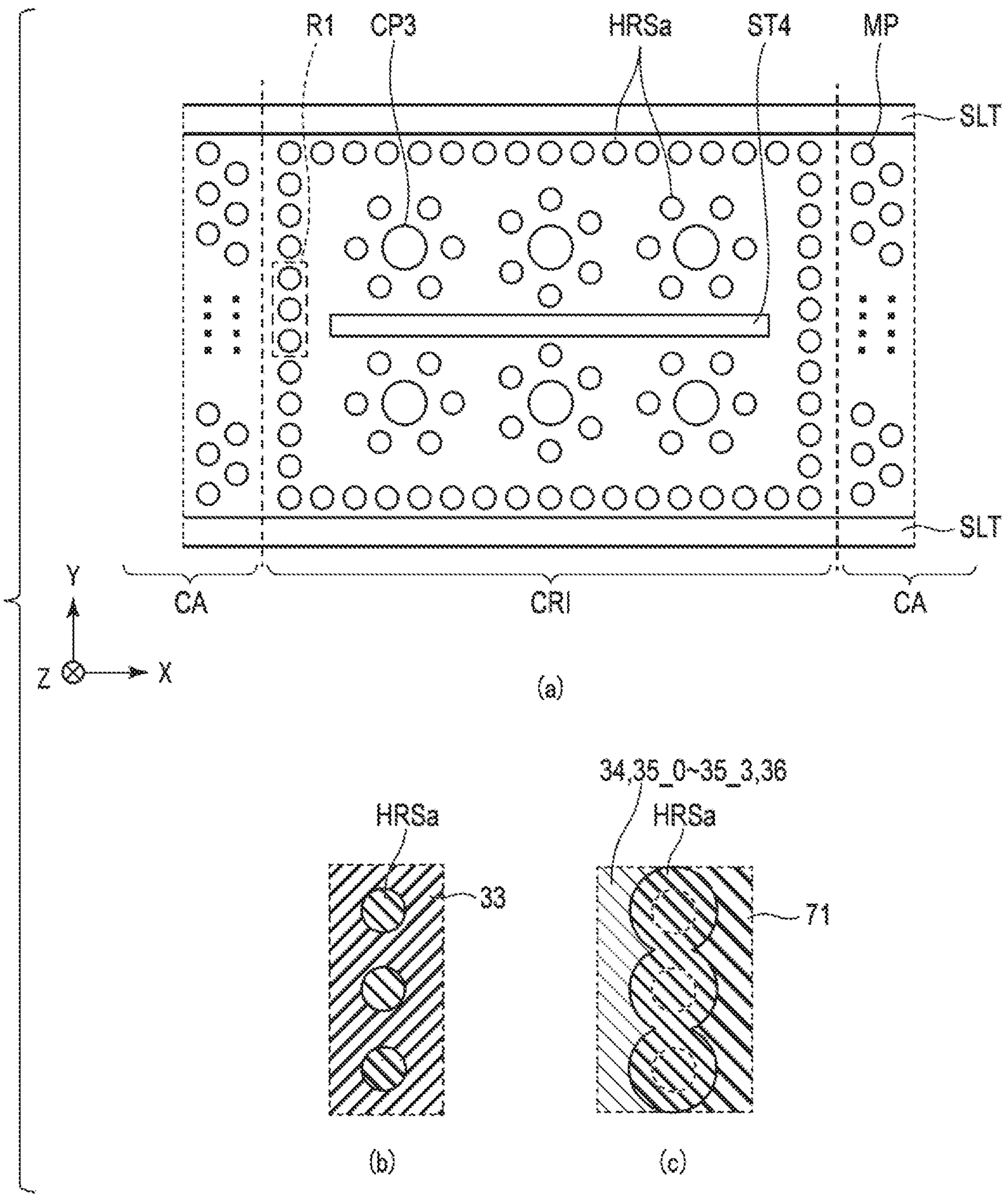
FIG. 33A is a view illustrating a planar structure of a semiconductor storage device according to a fifth embodiment.

Portion (a) of FIG. 33A is a plan view of the cell array area CA and the contact area CRI in the semiconductor storage device according to the fifth embodiment. Portion (b) of FIG. 33A is an enlarged view of an area R1 in portion (a) of FIG. 33A, and illustrates sections of an insulating pillar HRSa and an insulating layer 33 along the XY plane. Portion (c) of FIG. 33A is an enlarged view of the area R1, and illustrates sections of the insulating pillar HRSa and an insulating layer 71 along the XY plane.

As illustrated in portion (a) of FIG. 33A, in the X direction, the contact area CRI is formed between cell array areas CA. Slits SLT are formed at both ends of the contact area CRI and the cell array area CA in the Y direction. The memory pillars MP are arranged in a zigzag pattern in the cell array area CA.

Plural contact plugs CP3, plural insulating pillars HRSa and a slit ST4 are formed in the contact area CRI. The contact plugs CP3 connect the upper layer wiring (not illustrated) above the cell array area CA and the wiring layer D1 of the peripheral circuit layer. The insulating pillars HRSa have a columnar shape extending in the Z direction. The in elating pillars HRSa are formed in the same process as the support pillar HR disposed in the word line hookup area WHU and has the same material layer. The insulating pillars HRSa include, for example, a silicon oxide layer. The slit ST4 includes an insulating material, for example, an insulating layer in which at least one of a silicon oxide layer or an aluminum oxide layer is buried.

The insulating pillars HRSa are arranged like beads at the end of the contact area CRI so as to surround the contact area CRI. More specifically, the insulating pillars HRSa are continuously arranged in the contact area CRI near the boundary between the contact area CRI and the cell array area CA. Further, the insulating pillars HRSa are continuously arranged in the contact area CRI near the boundary between the contact area CRI and the slit SLT.

The insulating pillars HRSa arranged to surround the contact area CRI separates an area surrounded by the insulating pillars HRSa and an area not surrounded by the insulating pillars HRS a (mainly the cell array area CA). A stacked body including the plural insulating layers 33 and the plural conductive layers 34, 35_0 to 35__3 and 36 is formed in the cell array area CA. A stacked body including the plural insulating layers 33 and the plural insulating layers 71 is formed in the area surrounded by the insulating pillars HRSa in the contact area CRI. The insulating layers 71 include, for example, a silicon oxide layer.

The contact plugs CP3 are arranged in the contact area CRI. The insulating pillars HRSa are arranged around the contact plugs CP3. The insulating pillars HRSa arranged around the contact plugs CP3 function as support pillars that prevent the stacked insulating layer 33 from collapsing. The slit ST4 is formed in the central portion in the contact area CRI.

Portion of FIG. 33A illustrates the sections of the insulating pillar HRSa and the insulating layer 33 along the XY plane in the area R1. The periphery of the insulating pillar HRSa is covered with the insulating layer 33. That is, the insulating layer 33 is disposed around the insulating pillar HRSa. Portion (c) of FIG. 33A illustrates the sections of the insulating pillar HRSa and the insulating layer 71 along the XY plane in the area R1. The conductive layers 34, 35_0 to 35_3 and 36 are disposed on the side of the cell array area CA of the insulating pillar HRSa, and the insulating layer 71 is disposed on the side of the contact area CRI of the insulating pillar HRSa.

5.1.2. Cross-Sectional Structure of Semiconductor Storage Device

Figure 33B:
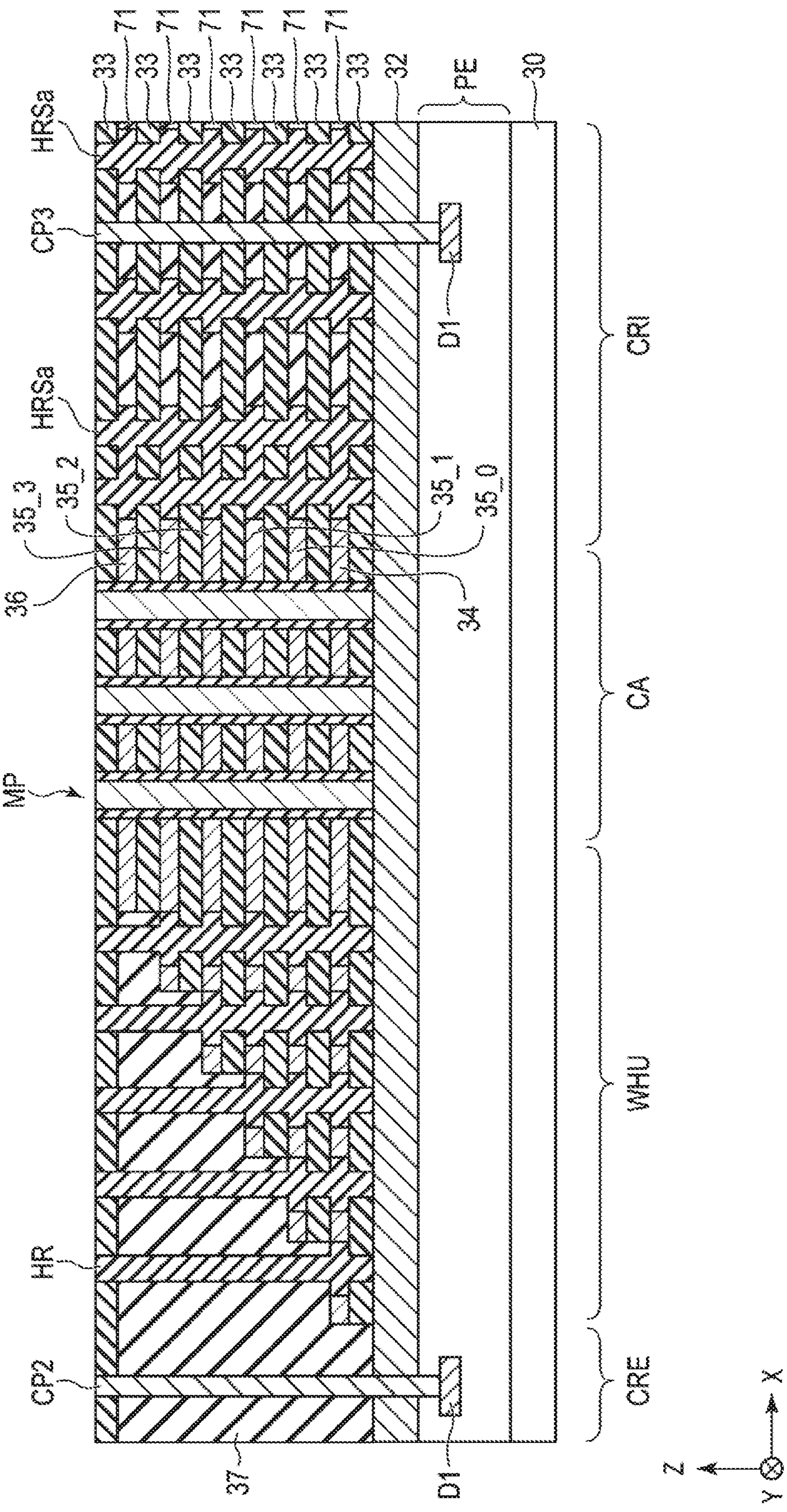
FIG. 33B is a view illustrating a cross-sectional structure of the semiconductor storage device according to the fifth embodiment.

Next, the cross-sectional structure of the semiconductor storage device according to the fifth embodiment will be described with reference to FIG. 33B. FIG. 33B is a cross-sectional view taken along the X direction of the contact area CRE, the word line hookup area WHU, the cell array area CA and the contact area CRI in FIG. 3.

As illustrated in FIG. 33B, the peripheral circuit layer PE is provided on the semiconductor substrate 30. The peripheral circuit layer PE has the wiring layer D1. The wiring layer D1 is electrically connected to a peripheral circuit formed in the peripheral circuit layer PE. Furthermore, the conductive layer 32 is formed on the peripheral circuit layer PE. The conductive layer 32 functions as a source line SL. The conductive layer 32 contains, for example, polycrystalline silicon or tungsten.

A stacked body including plural insulating layers 33 and the plural conductive layers 34, 35_0, 35_1, 35_2, 35_3 and 36 alternately stacked in the Z direction is formed on the conductive layer 32. The conductive layers 34, 35_0 to 35_3 and 36 have a plate shape parallel to the XY plane (or the semiconductor substrate 30 plane) and extend in the direction. The conductive layer 34 functions as a select gate line SGS. The conductive layers 35_0 to 35_3 function as word lines WL0 to WL3. The conductive layer 36 functions as a select gate line SGD. The insulating layer 33 includes, for example, a silicon oxide layer. The conductive layers 34, 35_0 to 35_3 and 36 contain, for example, tungsten (W) or polycrystalline silicon. Although four word lines WL are illustrated here, the number of word lines WL may be any number.

Plural memory pillars MP of the columnar body are formed in the stacked body including the plural insulating layers 33 and the plural conductive layers 34, 35_0 to 35_3 and 36. Each memory pillar MP extends in the Z direction. Each memory pillar MP is disposed to penetrate the insulating layer 33 and the conductive layers 34, 35_0 to 35_3 and 36 in the stacking direction and reaches the conductive layer 32 from the upper surface of the uppermost insulating layer 33. That is, the memory pillar MP passes through the select gate line SGD, the plural word lines WL0 to WL3, the select gate line SGS and the plural insulating layers 33 from the upper surface of the insulating layer 33 and is connected to the source line SL.

In the bit line hookup area BHU, the conductive layers 34, 35_0 to 35_3 and 36 respectively have areas sequentially formed stepwise in the X direction (hereinafter, referred to as stepped areas). Each of the stepped areas of the conductive layers 34, 35_0 to 35_3 and 36 is electrically connected to a wiring layer (bit line BL) via a contact plug (not illustrated).

Plural Support pillars HR are formed in the bit line hookup area BHU. The support pillars HR extend in the Z direction and reach the conductive layer 32 from the uppermost insulating layer 33. The support pillars HR are arranged in the word line hookup area WHU in order to prevent the stacked insulating layer 33 from collapsing. The support pillars HR include, for example, a silicon oxide layer.

Further, as illustrated FIG. 33B, the plural insulating pillars HRSa are formed in the contact ea CRI. The insulating pillars HRSa are arranged as illustrated in FIG. 33A. The insulating pillars HRSa extend the stacked body of the plural insulating layers 33 and the plural insulating layers 71 in the Z direction and reach conductive layer 32 from the uppermost insulating layer 33. Furthermore, the plural contact plugs CP3 of a columnar body are formed in the contact area CRI. Each contact plug CP3 extends in the Z direction and reaches the wiring layer D1 from the upper surface of the uppermost insulating layer 33. Each contact plug CP3 is disposed to penetrate the stacked body of the plural insulating layers 33 and the plural insulating layers 71 and the conductive layer 32 in the stacking direction and is connected to the wiring layer D1.

Plural columnar-shaped contact plugs CP2 are formed in the contact area CRE. Each contact plug CP2 extends in the Z direction and reaches the wiring layer D1 from the upper surface of the insulating layer 33. Each contact plug CP2 is disposed to penetrate the insulating layer 33, the insulating layer 37 and the conductive layer 32 in the stacking direction and is connected to the wiring layer D1.

5.2. Semiconductor Storage Device Manufacturing Method

Next, a method of manufacturing the semiconductor storage device according to the fifth embodiment will be described. FIGS. 34A and 34B to FIGS. 39A and 39B are views illustrating structure in each manufacturing process of the semiconductor storage device according to the fifth embodiment. FIGS. 34A, 35A, 36A, 37A, 38A, and 39A are plan views illustrating a structure in each manufacturing process of the semiconductor storage device, and FIGS. 34B, 35B, 36B, 37B, 38B, and 39B are cross-sectional views taken along the X direction of the structure in each manufacturing process.

Figure 34A:
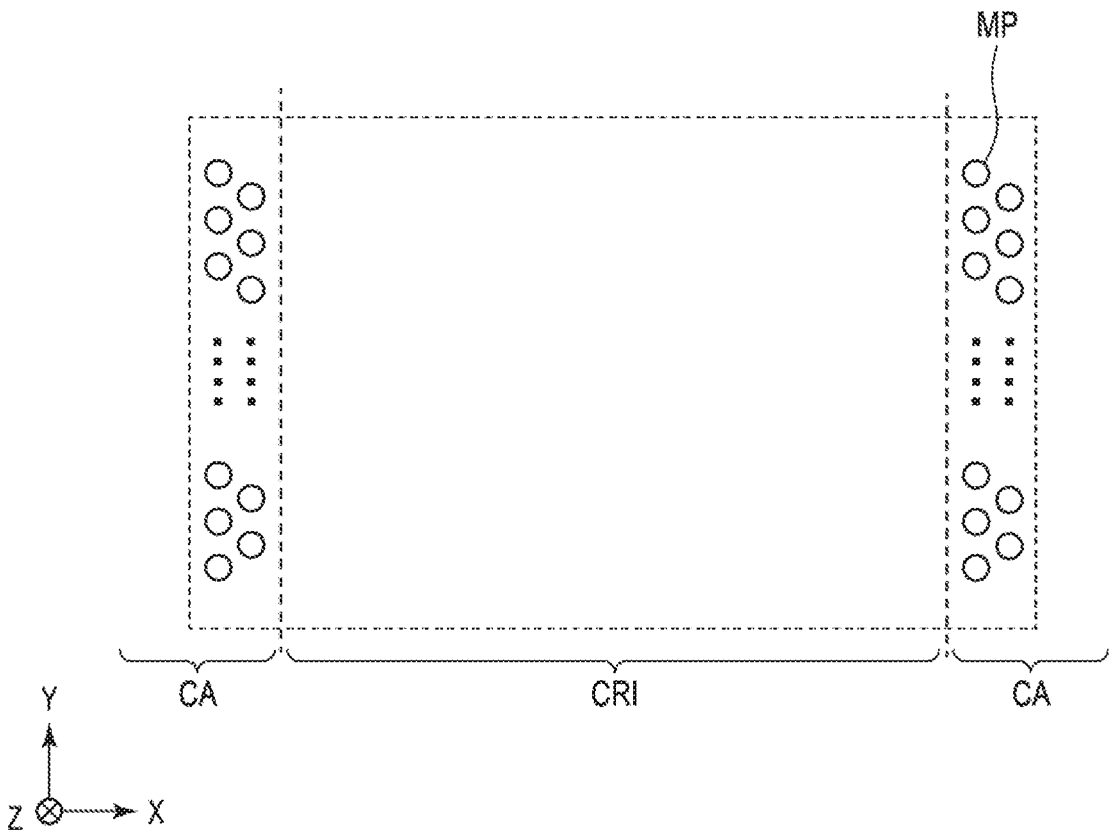
FIG. 34A is a view illustrating a structure in the manufacturing process of the semiconductor storage device according to the fifth embodiment.
Figure 34B:
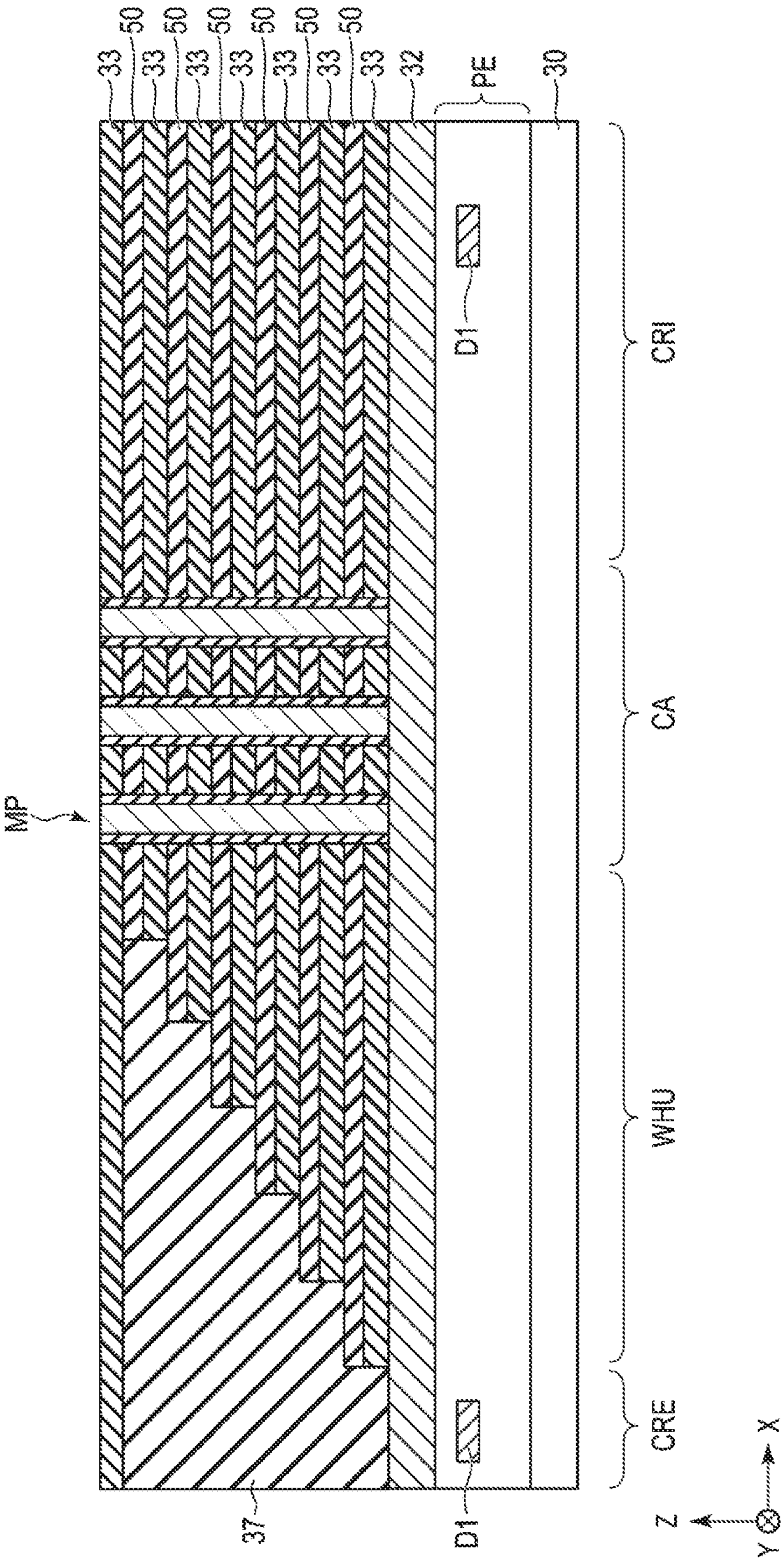
FIG. 34B is a view illustrating a structure in the manufacturing process of the semiconductor storage device according to the fifth embodiment.

First, as illustrated in FIGS. 34A and 34B, the peripheral circuit layer PE and the conductive layer 32 are formed on the semiconductor substrate 30, the plural insulating layers 33 and the plural insulating layers 50 are stacked, and a stepped area and memory pillars MP are further formed. Specifically, after forming the peripheral circuit layer PE including the wiring layer D1 on the semiconductor substrate 30, the conductive layer 32 is formed on the peripheral circuit layer PE by, for example, a CVD (or ALD) method. Subsequently, a stacked body of the plural insulating layers 33 and the plural insulating layers 50 alternately stacked is formed on the conductive layer 32 by, for example, a CVD (or ALD) method. Subsequently, the insulation layers 33 and the insulation layers 50 of the stacked body are etched stepwise by photolithography to form a stepped area where the insulation layers 33 and the insulation layers 50 are successively drawn out in the X direction, as illustrated in FIG. 34B. Further, the memory pillars MP extending in the Z direction are formed in the stacked body of the insulating layers 33 and the insulating layers 50.

Figure 35A:
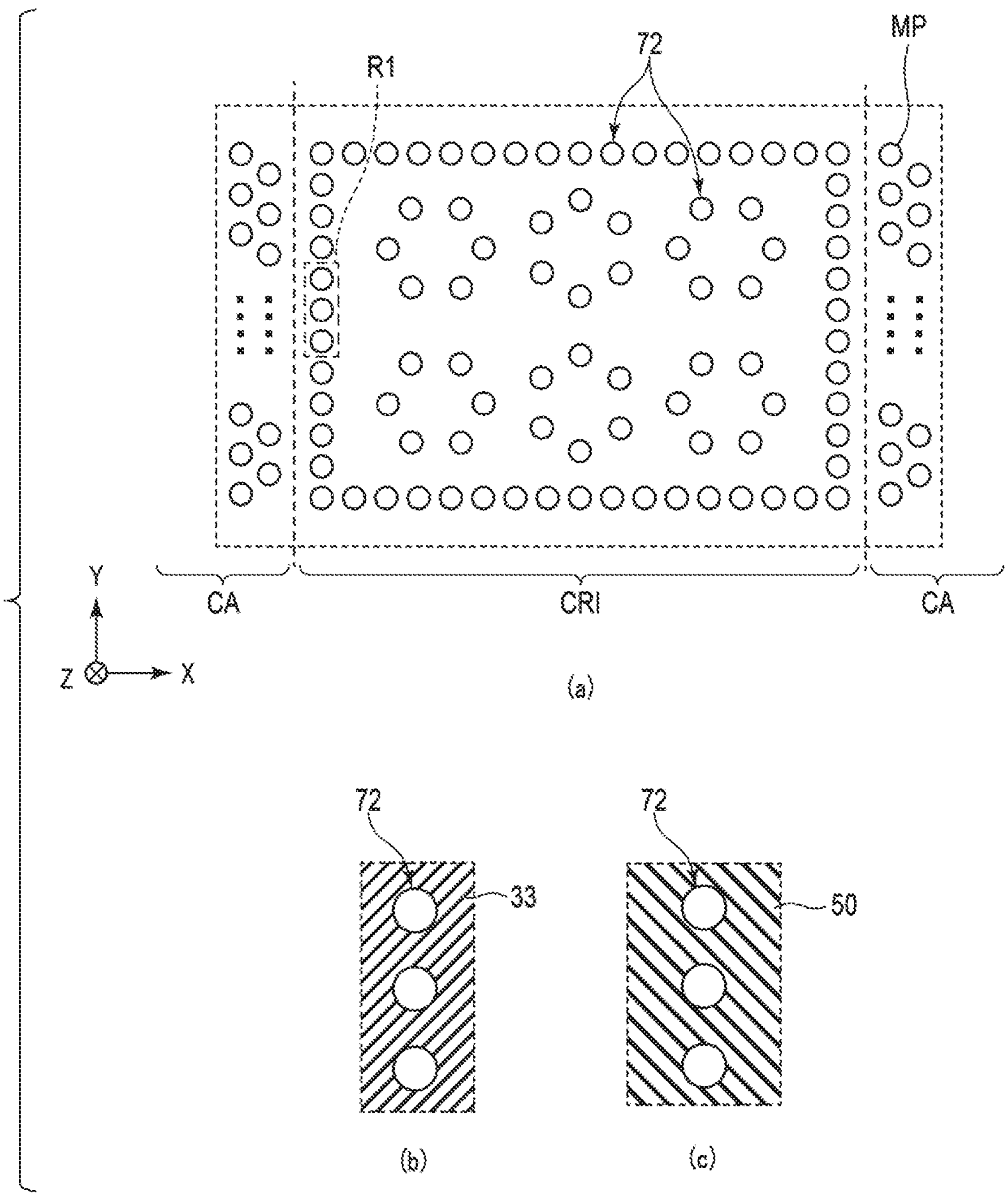
FIG. 35A is a view illustrating a structure in the manufacturing process of the semiconductor storage device according to the fifth embodiment.
Figure 35B:
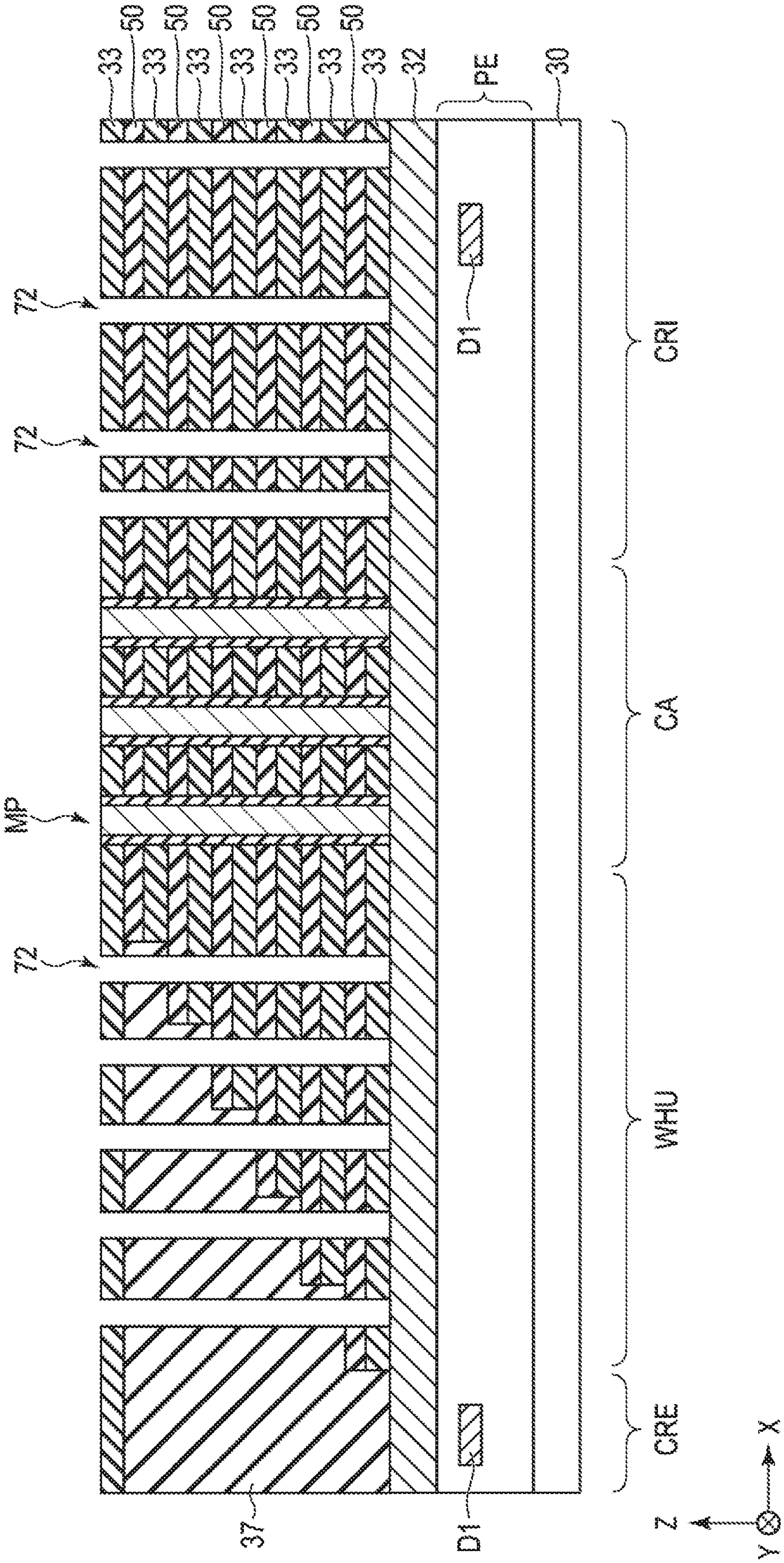
FIG. 35B is a view illustrating a structure in the manufacturing process of the semiconductor storage device according to the fifth embodiment.

Next, as illustrated in FIGS. 35A and 35B, holes 72 for the support pillar HR and the insulating pillar HRSa are formed in the word line hookup area WHU and the contact area CRI. Specifically, as illustrated in FIG. 35B, the holes 72 for the support pillar HR and the insulating pillar HRSa extending in the Z direction are formed in the stacked body of the insulating layers 33 and the insulating layers 50, or the stacked body and the insulating layer 37 by, for example a RIE method.

Figure 36A:
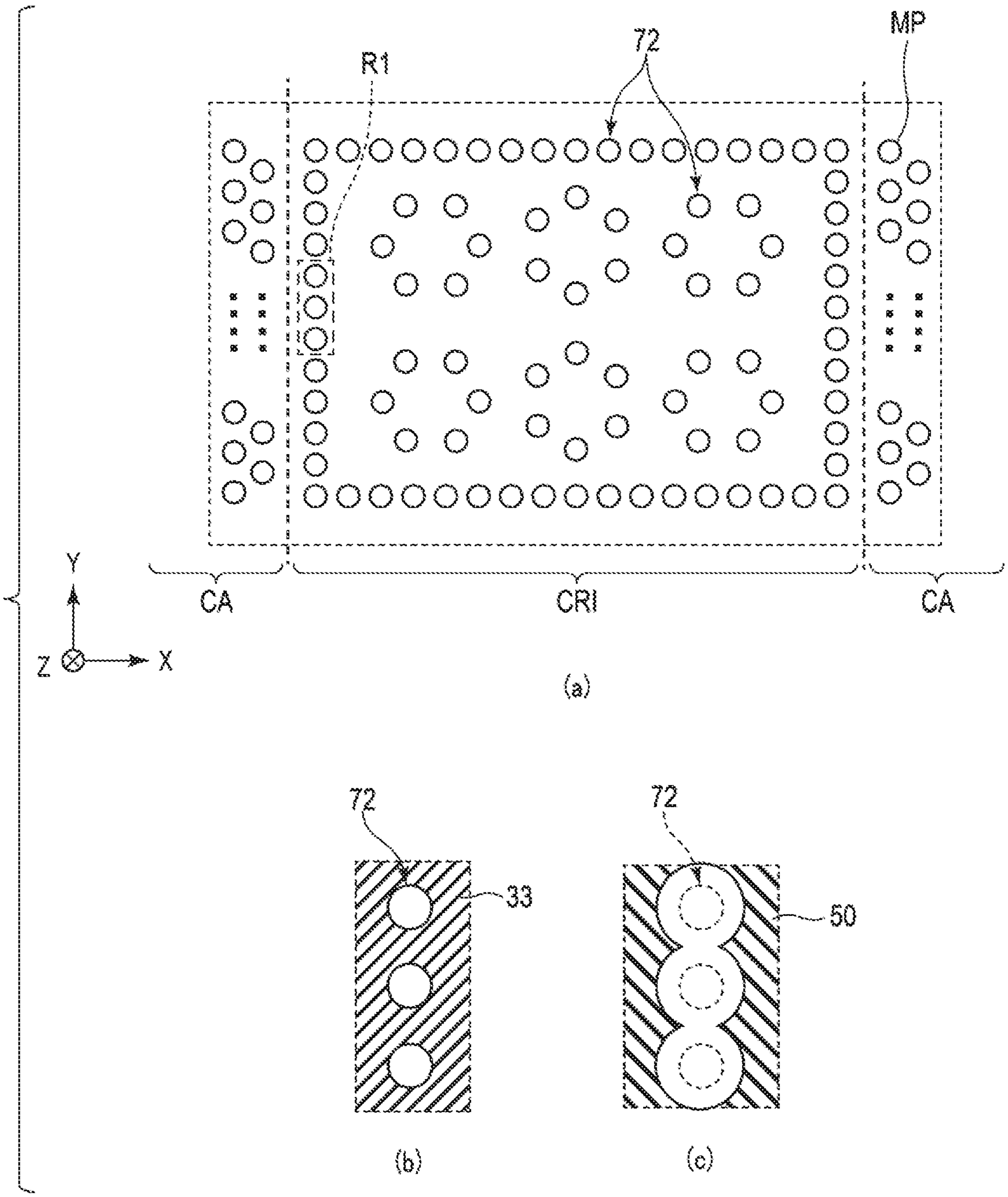
FIG. 36A is a view illustrating a structure in the manufacturing process of the semiconductor storage device according to the fifth embodiment.
Figure 36B:
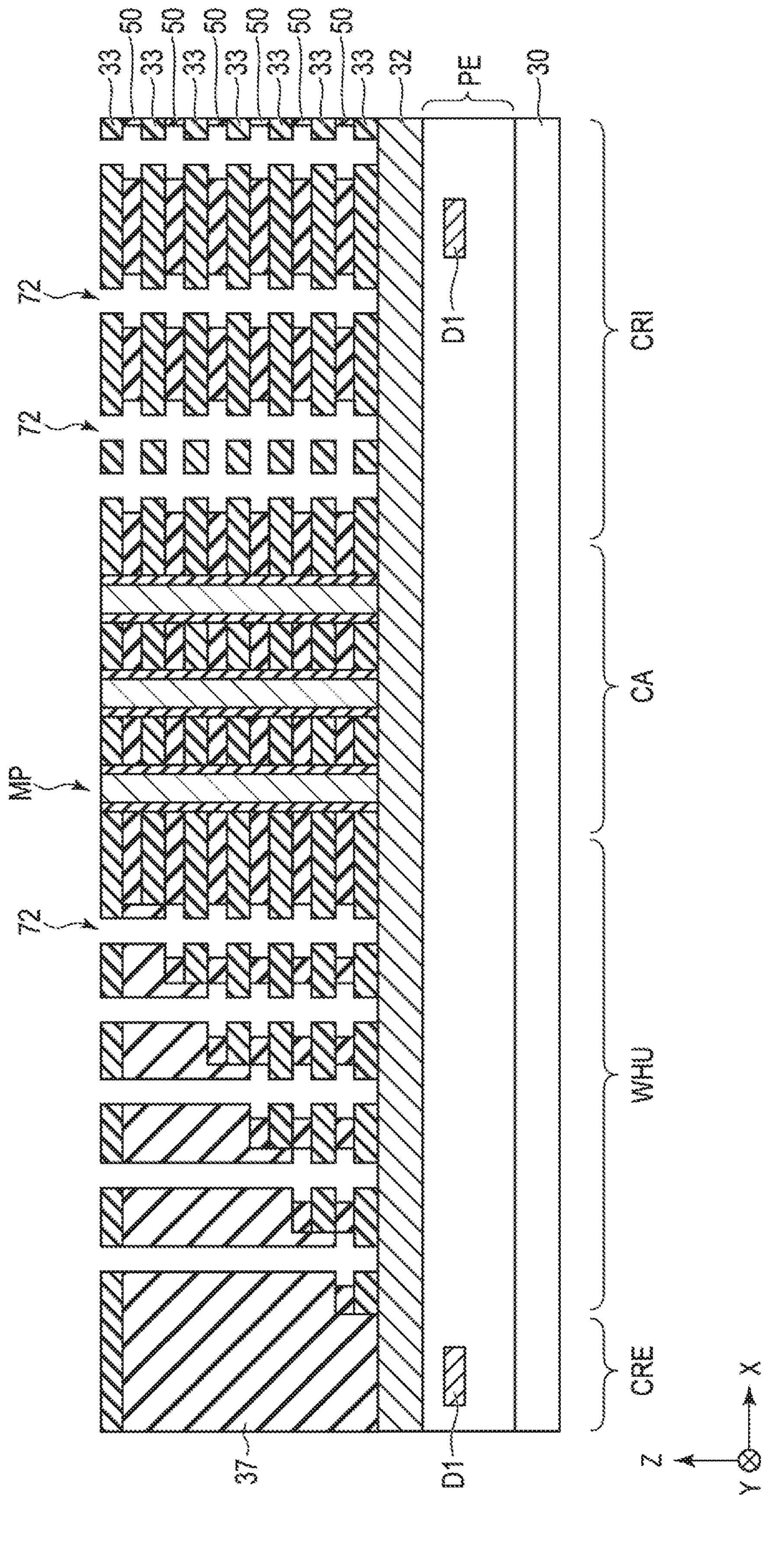
FIG. 36B is a view illustrating a structure in the manufacturing process of the semiconductor storage device according to the fifth embodiment.

Next, as illustrated in FIGS. 36A and 36B, the insulating layer 50 is retreated through the holes 72 by wet etching. Specifically, for example, as illustrated in FIG. 36B, a small amount of the insulating layer 50 is removed via the holes 72 by wet etching us ng a phosphoric acid solution. In this wet etching, as illustrated in portion (c) of FIG. 36A, the insulating layer 50 is etched until the adjacent holes 72 come into contact with each other.

Figure 37A:
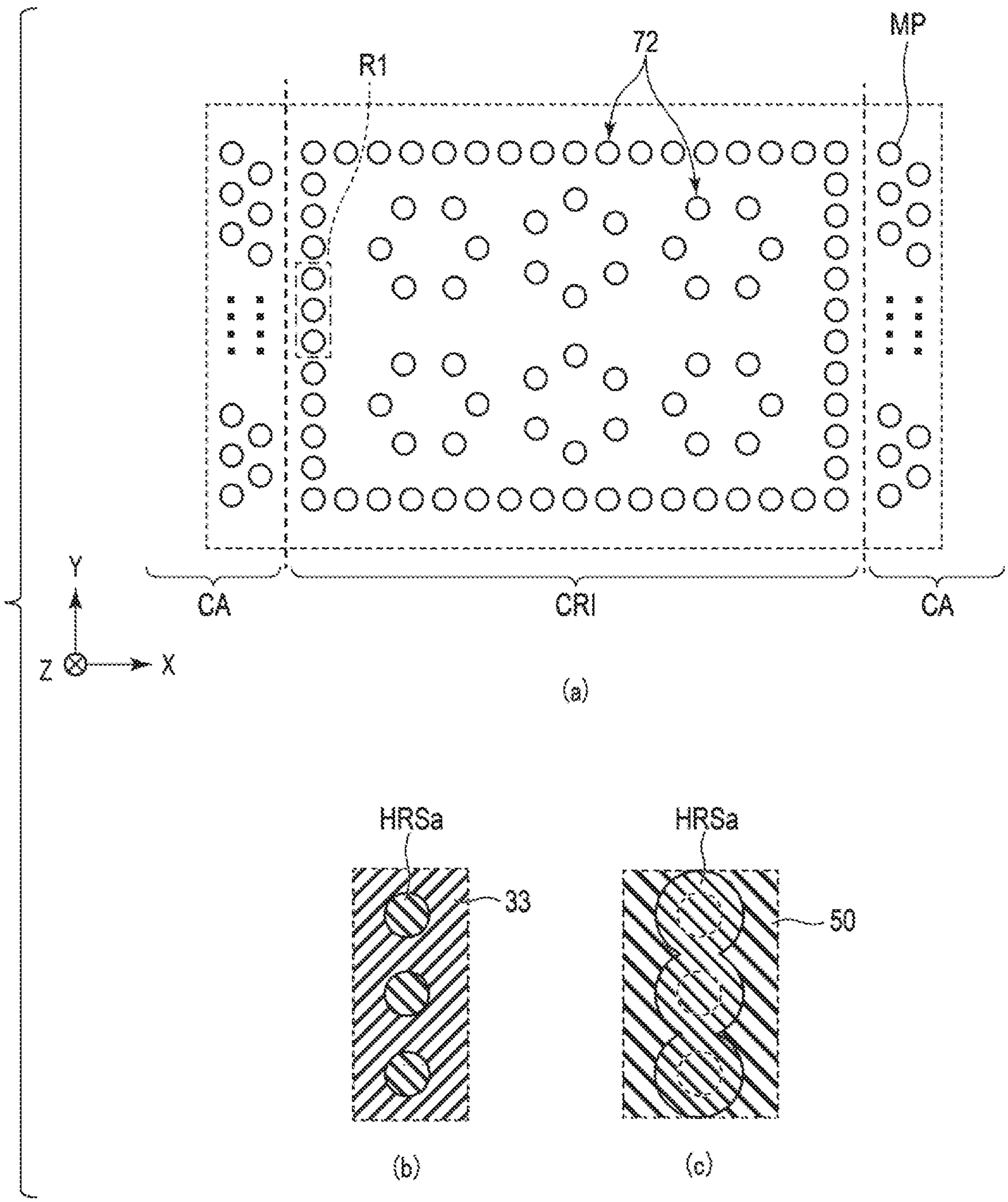
FIG. 37A is a view illustrating a structure in the manufacturing process of the semiconductor storage device according to the fifth embodiment.
Figure 37B:
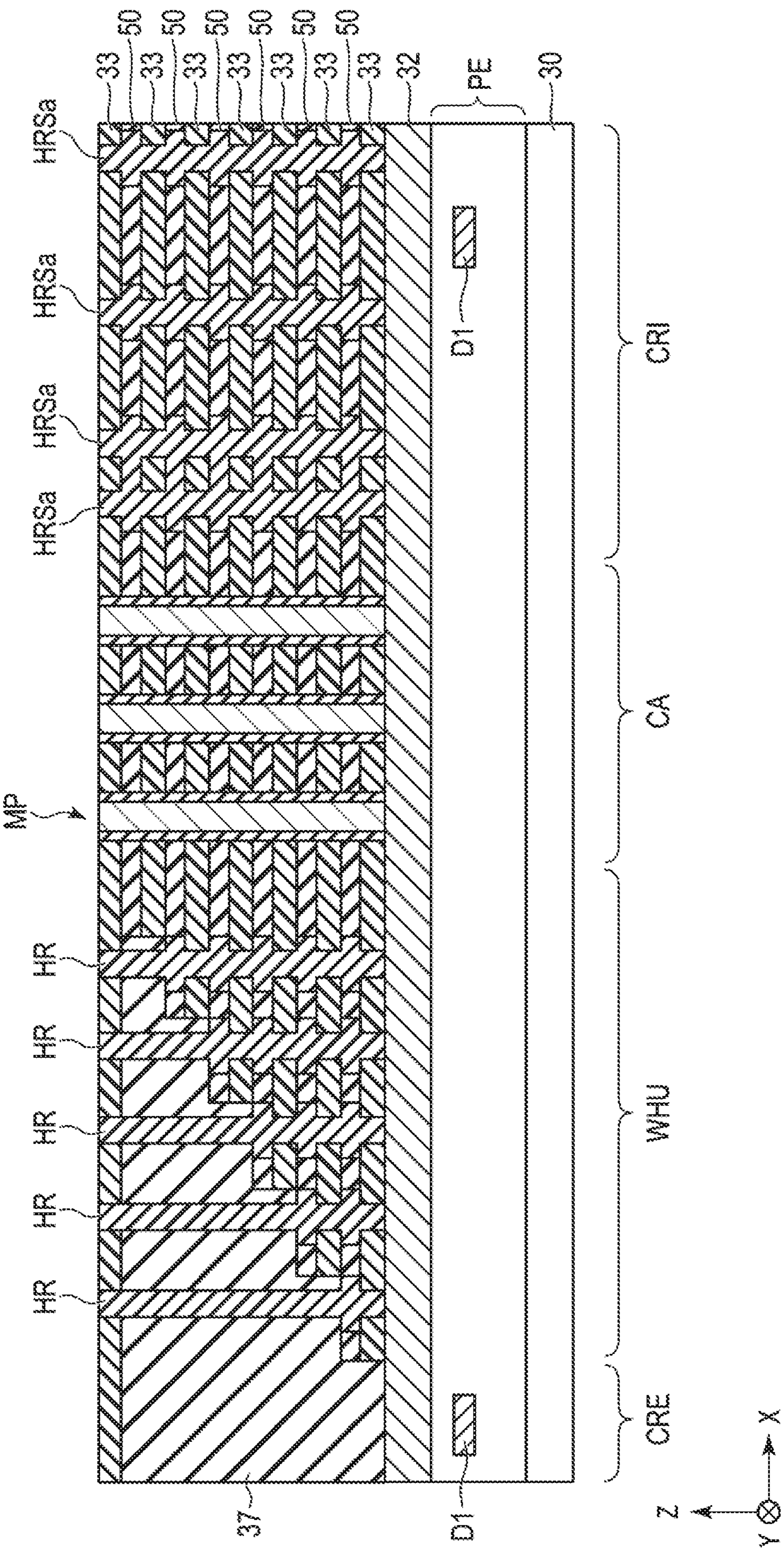
FIG. 37B is a view illustrating a structure in the manufacturing process of the semiconductor storage device according to the fifth embodiment.

Next, as illustrated in FIGS. 37A and 37B, the support pillars HR and the insulating pillars HRSa are formed simultaneously in the word line hookup area WHU and the contact area CRI by simultaneous processing. Specifically, for example, an insulating material (e.g., a silicon oxide layer) is buried in the holes 72 by, for example, a CVD (or ALD) method. As a result, the support pillars HR are formed in the word line hookup area WHU and the insulating pillars HRSa are formed in the contact area SRI.

Figure 38A:
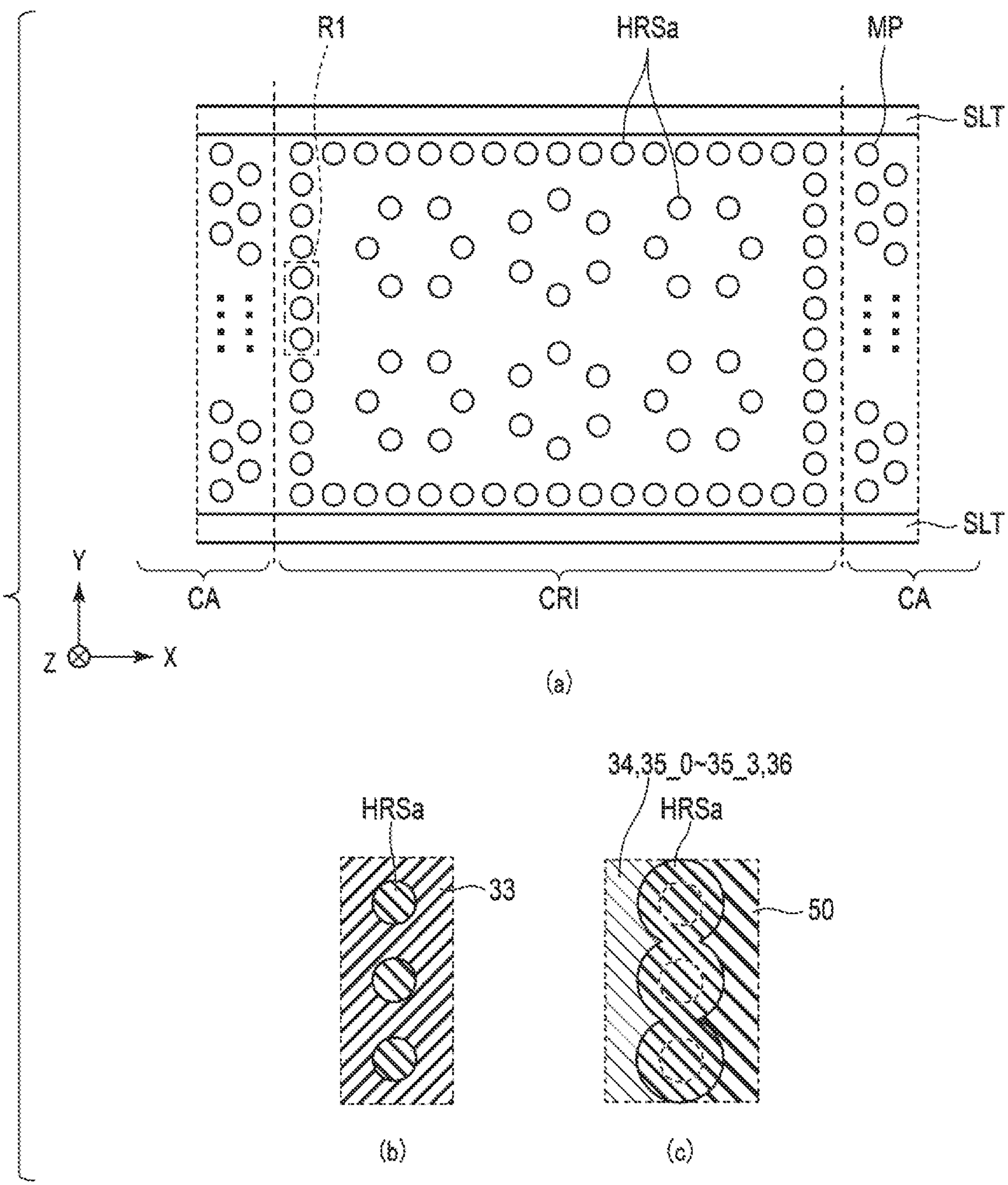
FIG. 38A is a view illustrating a structure in the manufacturing process of the semiconductor storage device according to the fifth embodiment.
Figure 38B:
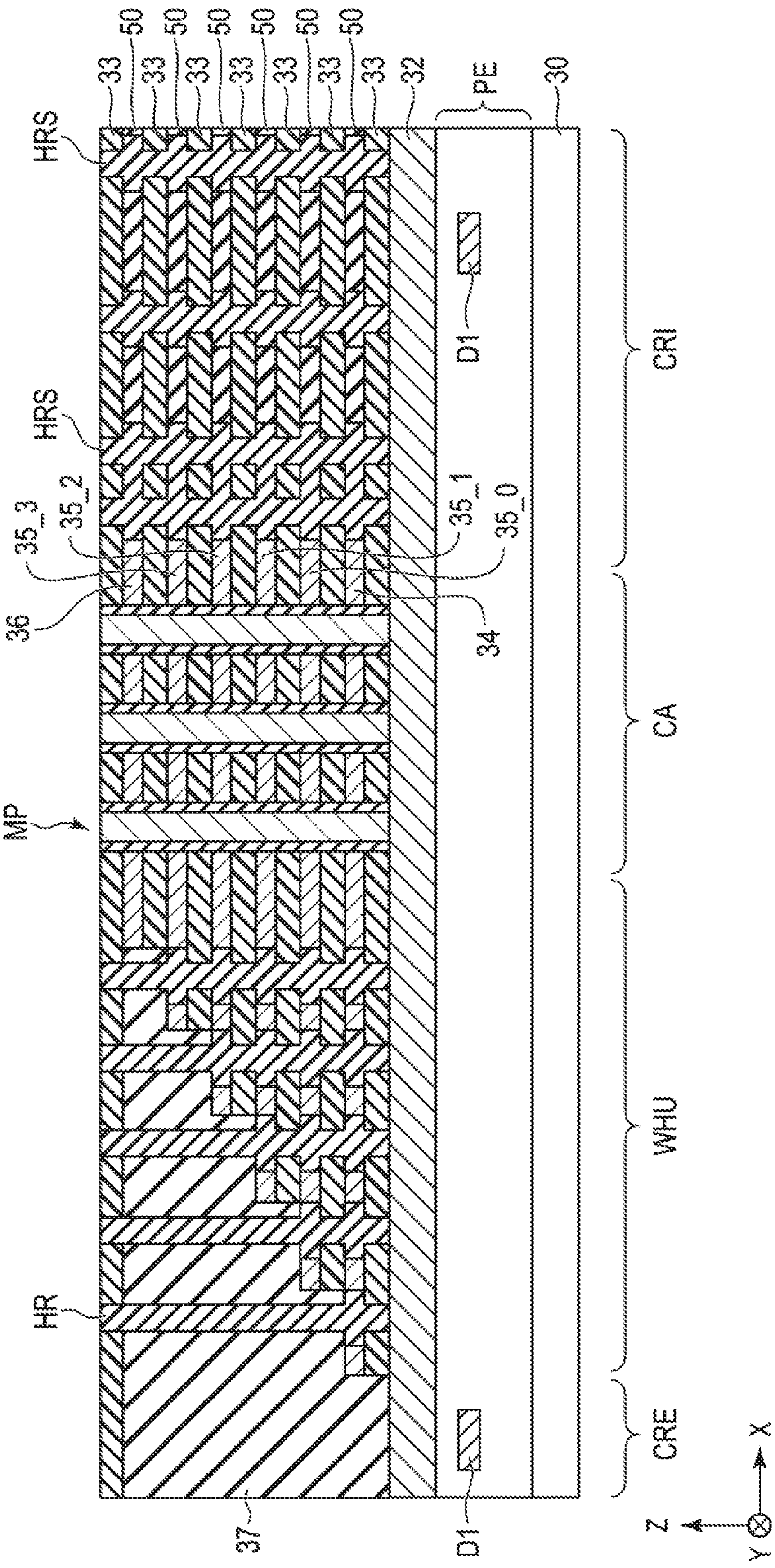
FIG. 38B is a view illustrating a structure in the manufacturing process of the semiconductor storage device according to the fifth embodiment.

Next, as illustrated in FIGS. 38A and 38B, the insulating layer (e.g., a silicon nitride layer) 50 is replaced by the conductive layers 34, 35_0 to 35_3 and 36. Specifically, a groove for the slit SLT is formed in the stacked body of the plural insulating layers 33 and the plural insulating layers 50 by, for example, a RIE method. The groove reaches from the surface of the uppermost insulating layer 33 to the conductive layer 32. Subsequently, in the cell array area CA and the word line hookup area WHU, the insulating layer 50 is removed through the groove by, for example, wet etching using a phosphoric acid solution. As a result, a gap is formed between the insulating layers 33. Further, the gap between the insulating layers 33 is filled with a conductive material such as tungsten by a CVD (or ALD) method to form the conductive layers 35_0 to 35_7 and 36. Subsequently, an insulating material, for example, a silicon oxide layer, is buried in the groove by, for example, a CVD (or ALD) method. Thereby, the slit SLT is formed.

In the meantime, in the area surrounded by the insulating pillars HRSa in the contact area CRI, in the wet etching using the phosphoric acid solution, the phosphoric acid solution is blocked by the insulating pillars HRSa and does not reach the insulating layer 50 in the area surrounded by the insulating pillars HRSa. Therefore, the insulating layer 50 in the area surrounded by the insulating pillars HRSa is not removed but remains intact. That is, as illustrated in portions (b) and (c) of FIG. 38A, in the process of replacing the insulating layer 50 with the conductive layers 34, 35_0 to 35_3 and 36, the insulating layer 50 in the area surrounded by the insulating pillars HRSa in the contact area CRI is not replaced by conductive layers and the insulating layer 50 in the area not surrounded by the insulating pillars HRSa is replaced with the conductive layers 34, 35_0 to 35_3 and 36. The stacked body of the plural insulating layers 33 and the plural insulating layers 50 is maintained in the area surrounded by the insulating pillars HRSa.

Figure 39A:
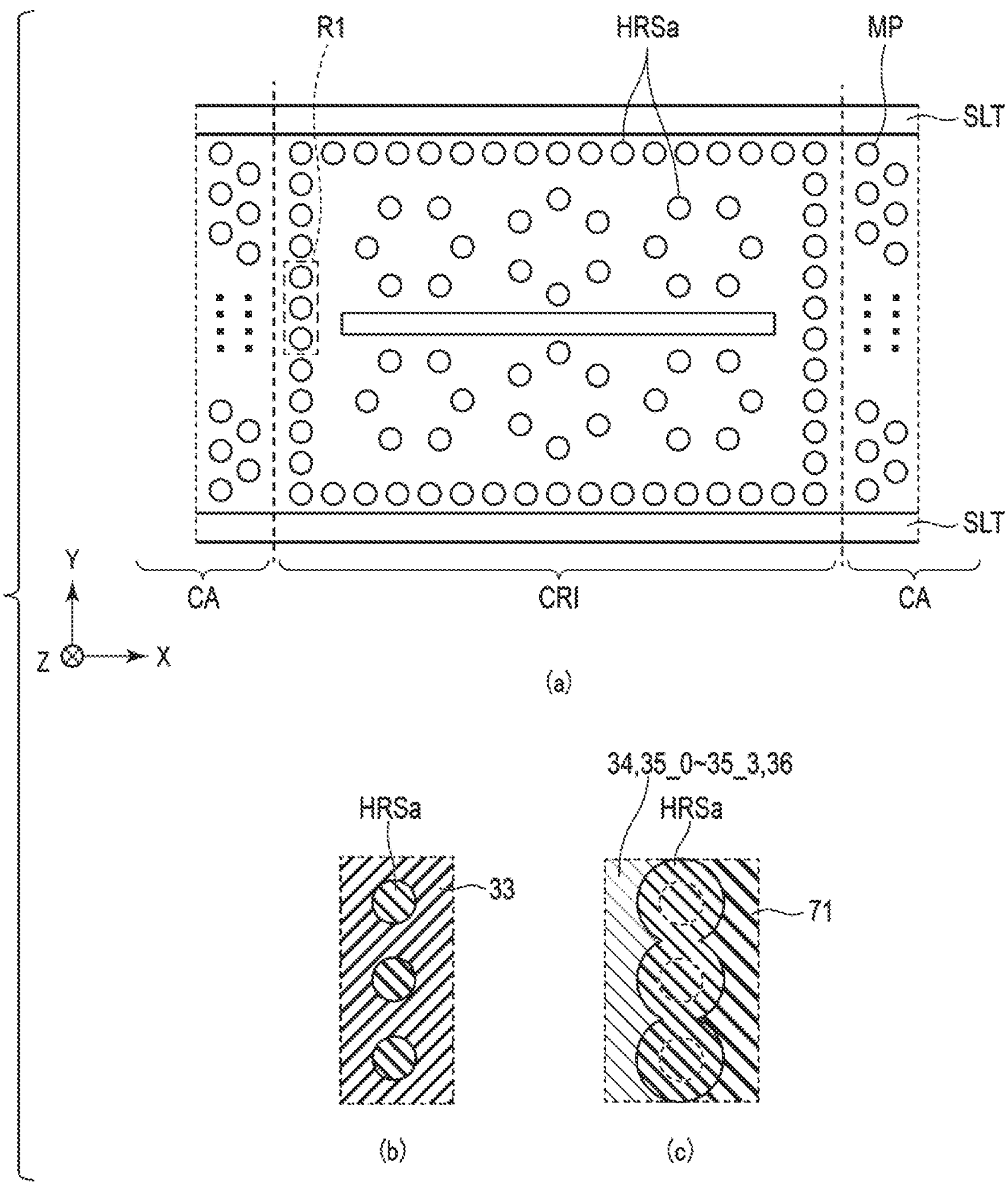
FIG. 39A is a view illustrating a structure in the manufacturing process of the semiconductor storage device according to the fifth embodiment.
Figure 39B:
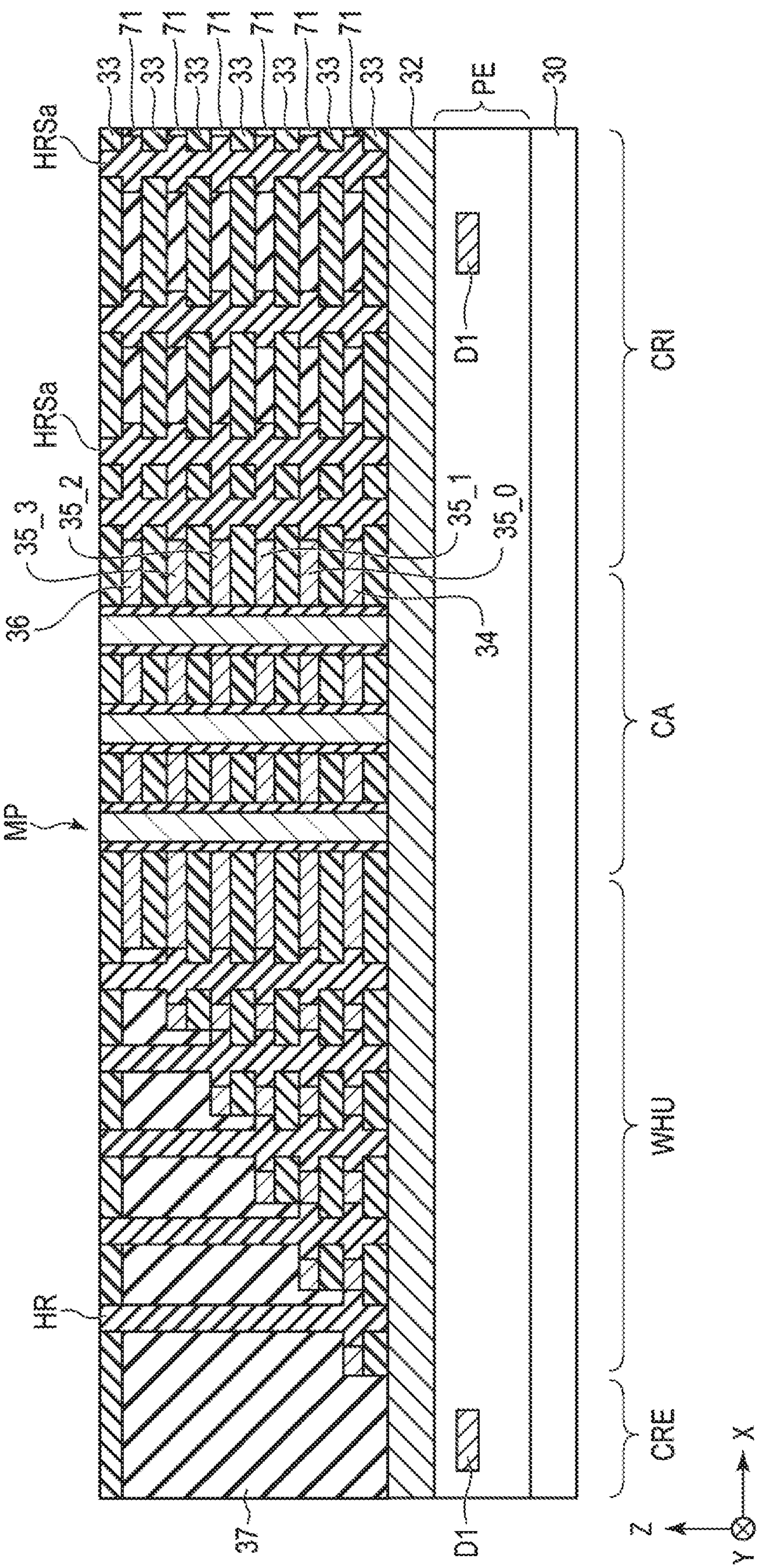
FIG. 39B is a view illustrating a structure in the manufacturing process of the semiconductor storage device according to the fifth embodiment.

Next, as illustrated in FIGS. 39A and 39B, the slit ST4 is formed in the contact area CRI, and the insulating layer 50 in the area surrounded by the insulating pillars HRSa replaced with the insulating layer 71. Specifically, a groove for the slit ST4 is formed in the area surrounded by the insulating pillars HRSa of the contact area CRI by, for example, a RIE method. The groove for the slit ST4 is formed in the stacked body of the plural insulating layers 33 and the plural insulating layers 50 and reaches from the surface of the uppermost insulating layer 33 to the conductive layer 32. Subsequently, the insulating layer 50 is removed through the groove for the slit ST4 by, for example, wet etching using phosphoric acid solution. As a result, a gap is formed between the insulating layers 33. Further, an insulating material, for example, a silicon oxide layer, is buried in the gap between the insulating layers 33 by a CVD (or ALD) method to form the insulating layer 71. Thus, the area surrounded by the insulating pillars HRSa becomes the stacked body of the plural insulating layers 33 and the plural insulating layers 71. Subsequently, an insulating material, for example, at least one of a silicon oxide layer or an aluminum oxide layer, is buried in the groove for the slit ST4 by, for example, a CVD (or ALD) method. Thus, the slit ST4 formed.

Next, as illustrated in FIGS. 33A and 33B, the contact plug CP3 and the contact plug CP2 are formed in the contact area CRI and the contact area CRE by simultaneous processing. Specifically, a hole for the contact plug CP3 is formed in the area surrounded by the insulating pillars HRSa of the contact area CRI and a hole for the contact plug CP2 is formed in the contact area CRE by simultaneous processing by, for example, a RIE method. At this time, the area surrounded by the insulating pillars HRSa is formed as the stacked body of the plural insulating layers 33 and the plural insulating layers 71, and the contact area CRE is formed as the insulating layer 37. Since both of the insulating layers 33, 71 and 37 are, for example, silicon oxide layers, the holes may be easily processed under the same etching conditions and may be formed at the same time. Subsequently, a conductive material is buried in the holes for the contact plugs CP3 and CP2 by, for example, a CVD (or ALD) method. Thus, the contact plug CP3 is formed in the contact area CRI and the contact plug CP2 is formed in the contact area CRE.

5.3. Effects of Fifth Embodiment

In the fifth embodiment, the insulating pillars HRSa are arranged without gaps so as to surround the contact area CRI, in the peripheral area of the contact area CRI or along the periphery of the end portion of the contact area CRI. As a result, the insulating pillars HRSa separate the insulating layer 50 in the cell array area CA and the word line hookup area WHU from the insulating layer 50 in the contact area CRI. By isolating the insulating layer 50 in the contact area CRI, in the process of replacing the insulating layer 50 in the cell array area CA and the word line hookup area WHU with a conductive layer, the insulating layer 50 in the contact area CRI is prevented from being replaced with the conductive layer.

Furthermore, by form ting the slit ST4 in the contact area CRI and replacing the insulating layer 50 in the contact area CRI with the insulating layer (e.g., a silicon oxide layer) the layer structure of the contact area CRI is changed to the stacked structure of the insulating layer 33 and the insulating layer 71. Thereby, the contact area CRI may be an insulating layer (e.g., a silicon oxide layer) of the same layer material as tale contact area CRE.

In this manner, by using the layer material of the contact area CRI for the insulating layer 71, it is possible to improve the withstand voltage between the contact plug CP3 and the conductive layers 34, 35_0 to 35_3 and 36, and furthermore, it is possible to improve the reliability of operations such as write, read and erase in the semiconductor storage device.

Moreover, by using the layer materials of the contact area CRI and the contact area CRE for the same insulating layer (e.g., a silicon oxide layer), it is easy to simultaneously form the contact plug CP3 and the contact plug CP2 in the same process. As a result, it is possible to simplify the manufacturing process and hence reduce the manufacturing costs.

6. Other Modifications

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:

a substrate including a first region and a second region;

a first transistor provided in the first region;

a first stacked body provided above the first transistor and including a plurality of first insulating layers and a plurality of conductive layers alternately stacked in a first direction;

a plurality of memory pillars extending through the first stacked body in the first direction;

a second transistor provided in the second region;

a second stacked body provided above the second transistor and including the plurality of first insulating layers and a plurality of second insulating layers alternately stacked in the first direction;

a first slit provided between the first stacked body and the second stacked body, and extending in the first direction and a second direction intersecting the first direction; and a contact plug extending through the second stacked body in the first direction and connected to the second transistor, wherein the first slit separates the plurality of first insulating layers in a third direction that intersects the first and second directions.

2. The semiconductor storage device according to claim 1, further comprising: a second slit extending through the first stacked body in the first direction and the second direction to separate the first stacked body in the third direction, wherein an upper end of the first slit is lower than an upper end of the second slit.

3. The semiconductor storage device according to claim 1, wherein the first slit has a plurality of pillar bodies continuously arranged in the second direction, and each of the pillar bodies extends in the first direction.

4. The semiconductor storage device according to claim 1, wherein the first slit includes at least one of a silicon oxide layer or an aluminum oxide layer.

5. The semiconductor storage device according to claim 1, wherein the first slit includes a film having a material the same as a material of one of the plurality of memory pillars.

6. The semiconductor storage device according to claim 1, wherein the first insulating layer includes a silicon oxide layer, and the second insulating layer includes a silicon nitride layer.

7. A method of manufacturing a semiconductor storage device, comprising:

forming a stacked body including a plurality of first insulating layers and a plurality of second insulating layers alternately stacked in a first direction;

forming a plurality of memory pillars extending in the first direction in the stacked body;

forming a first slit extending in the first direction and a second direction intersecting with the first direction in the stacked body, the first slit separating the stacked body into a first area having the memory pillars and a second area not having the memory pillars;

forming a groove extending in the first direction and the second direction in the first area of the stacked body;

replacing the second insulating layer in the first area with a conductive layer via the groove;

forming a second slit isolating the conductive layer by burying an insulating material in the groove; and forming a first contact plug extending in the first direction in the second area where the first insulating layer and the second insulating layer of the stacked body are stacked.

8. The method according to claim 7, further comprising: replacing the second insulating layer in the second area of the stacked body with the first insulating layer.

9. The method according to claim 7, wherein the forming of the first slit further includes forming a pillar body extending in the first direction in the second area, and the forming of the first contact plug further includes forming the first contact plug in the pillar body.

10. A method of manufacturing a semiconductor storage device, comprising:

forming a stacked body including a first area and a second area where a plurality of first insulating layers and a plurality of second insulating layers are alternately stacked in a first direction;

forming a plurality of memory pillars extending in the first direction in the first area of the stacked body;

forming a groove extending in the first direction and a second direction intersecting with the first direction in the stacked body;

removing the second insulating layer in the first area through the groove and leaving the second insulating layer in the second area;

forming a conductive layer in a gap where the second insulating layer in the first area is removed; and forming a first contact plug extending in the first direction in the second area where the first insulating layer and the second insulating layer of the stacked body are stacked.

* * * * *